(12) United States Patent
Kajiya et al.

(10) Patent No.: US 8,907,224 B2
(45) Date of Patent: Dec. 9, 2014

(54) TRANSPARENT CONDUCTIVE ELEMENT, INPUT DEVICE, AND DISPLAY DEVICE

(75) Inventors: Shunichi Kajiya, Miyagi (JP); Kazuya Hayashibe, Miyagi (JP); Yutaka Muramoto, Miyagi (JP)

(73) Assignee: Dexerials Corporation, Tokyo (JP)

( * ) Notice: Subject to any disclaimer, the term of this patent is extended or adjusted under 35 U.S.C. 154(b) by 0 days.

(21) Appl. No.: 13/574,209

(22) PCT Filed: Jan. 31, 2011

(86) PCT No.: PCT/JP2011/052456
§ 371 (c)(1),
(2), (4) Date: Jul. 19, 2012

(87) PCT Pub. No.: WO2012/098694
PCT Pub. Date: Jul. 26, 2012

(65) Prior Publication Data
US 2013/0284497 A1    Oct. 31, 2013

(30) Foreign Application Priority Data

Jan. 19, 2011   (JP) .................................. 2011-009323

(51) Int. Cl.
*H05K 1/00* (2006.01)
*H05K 1/02* (2006.01)
*G02B 1/10* (2006.01)
*G02B 1/11* (2006.01)
*H01B 5/14* (2006.01)

(52) U.S. Cl.
CPC ................ *H05K 1/0274* (2013.01); *G02B 1/10* (2013.01); *G02B 1/11* (2013.01); *H01B 5/14* (2013.01)
USPC ...................................................... 174/250

(58) Field of Classification Search
CPC ...... H05K 1/0274; H05K 1/0296; H05K 1/03; H05K 1/0306; H05K 1/0313; H05K 1/036; H05K 1/05; H05K 1/09; H05K 1/092; H05K 1/11; H05K 1/0298
USPC .......................... 174/250, 253, 255, 256, 257
See application file for complete search history.

(56) References Cited

U.S. PATENT DOCUMENTS 4,556,790 A  * 12/1985  Glass et al. ................... 257/431
2003/0111105 A1* 6/2003  Tsukuda et al. ............. 136/251

(Continued)

FOREIGN PATENT DOCUMENTS

CN        101042442 A        9/2007
CN        101356454 A        1/2009

(Continued)

OTHER PUBLICATIONS

Korean Patent Office, Notice of Grounds for Rejection mailed Feb. 13, 2013 in Korean Patent Application No. 10-2012-7023717 w/English-language Translation.

(Continued)

*Primary Examiner* — Tremesha S Willis
(74) *Attorney, Agent, or Firm* — Oliff PLC

(57) ABSTRACT

Transparent conductive element includes an optical layer provided with a wave surface that has an average wavelength smaller than or equal to a wavelength of visible light and a transparent conductive layer formed on the wave surface so as to follow the shape of the wave surface. When the average wavelength of the wave surface is λm and an average amplitude of vibration of the wave surface is Am, the ratio (Am/λm) is 0.2 or more and 1.0 or less; an average angle of sloped surfaces of the wave surface is in the range of 30° or more and 60° or less; and when a thickness of the transparent conductive layer at a highest position of the wave surface is D1 and a thickness of the transparent conductive layer at a lowest position of the wave surface is D3, a ratio D3/D1 is in the range of 0.8 or less.

11 Claims, 30 Drawing Sheets

(56) References Cited

U.S. PATENT DOCUMENTS

| | | | |
|---|---|---|---|
| 2008/0220559 A1* | 9/2008 | Fujii et al. | 438/72 |
| 2010/0116332 A1* | 5/2010 | Counil et al. | 136/256 |
| 2010/0118404 A1 | 5/2010 | Endoh et al. | |

FOREIGN PATENT DOCUMENTS

| | | |
|---|---|---|
| JP | 2003-004916 | 1/2003 |
| JP | 2003-136625 | 5/2003 |
| JP | 2003-240904 | 8/2003 |
| JP | 2007-256340 | 4/2007 |
| JP | 2008-165213 | 7/2008 |
| JP | A-2008-165213 | 7/2008 |
| JP | B2-5071563 | 8/2012 |
| TW | 201003114 A1 | 1/2010 |
| TW | 201018950 A1 | 5/2010 |
| WO | 2009-107871 | 9/2009 |

OTHER PUBLICATIONS

Taiwanese Patent Office, Office Action issued Feb. 21, 2014 in Taiwanese Patent Application No. 100103770 w/English-language Translation.

Japanese Patent Office, Notification of Reason for Refusal mailed Aug. 22, 2014 in Japanese Patent Application No. 2012-177984 w/English-language Translation.

* cited by examiner

FIG. 5
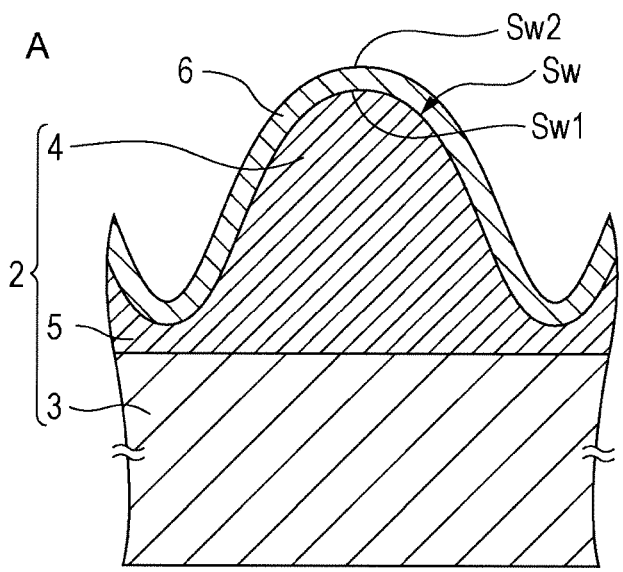
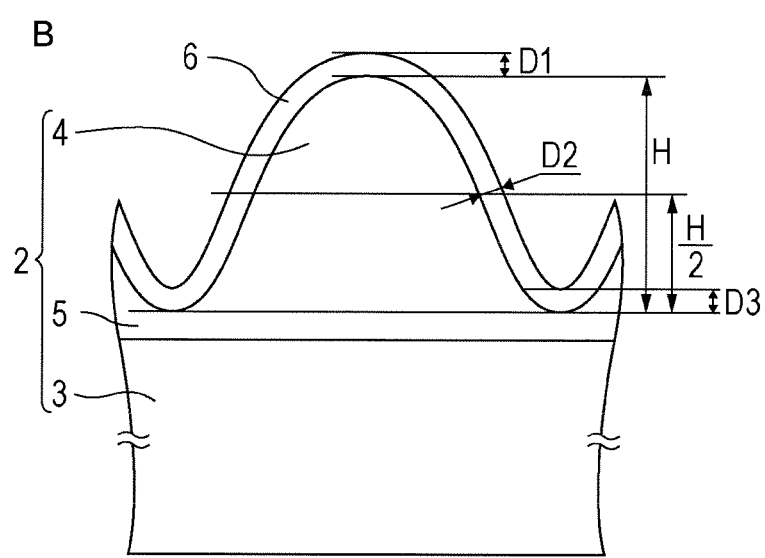

FIG. 8
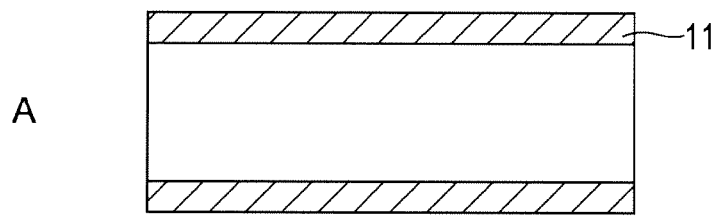
A
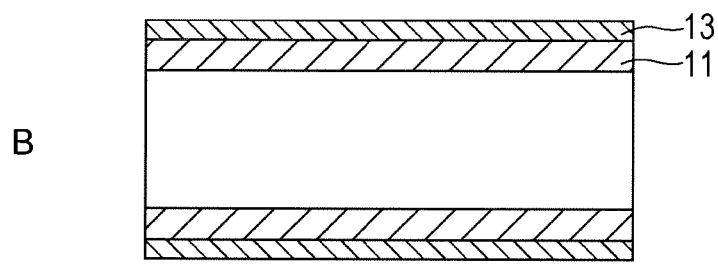
B
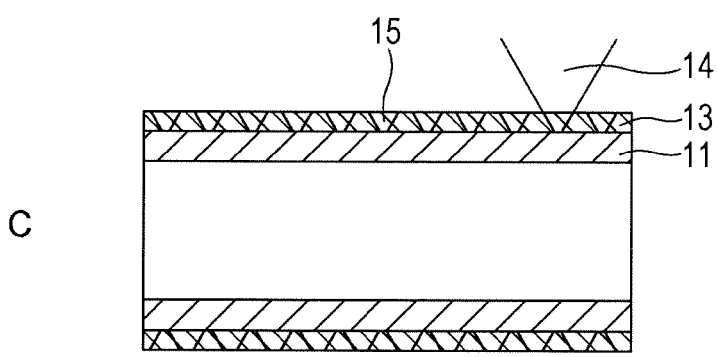
C
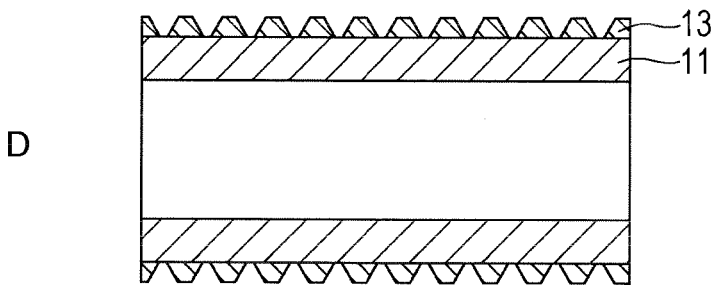
D

FIG. 9
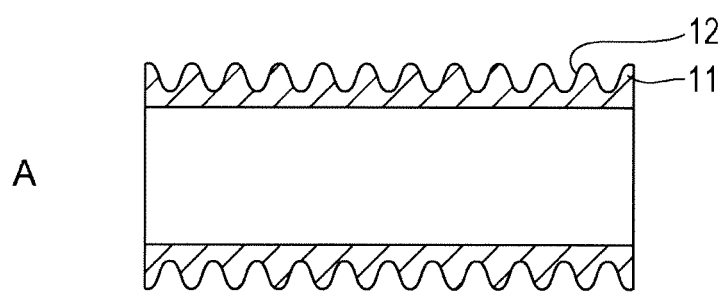
A
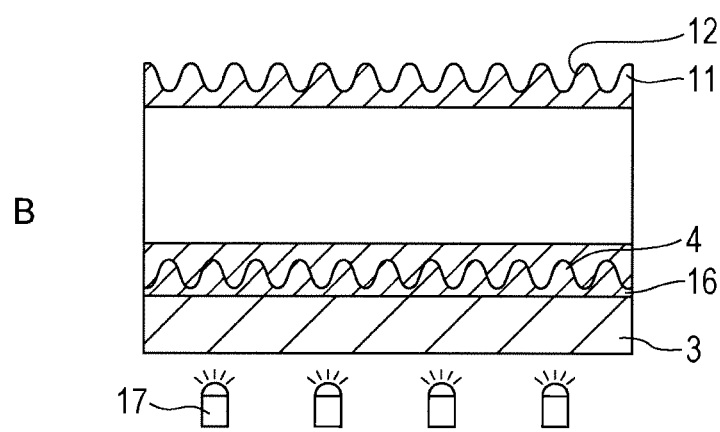
B
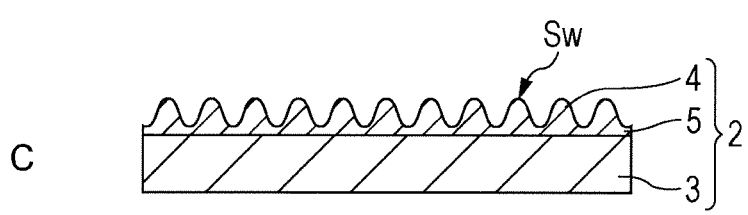
C
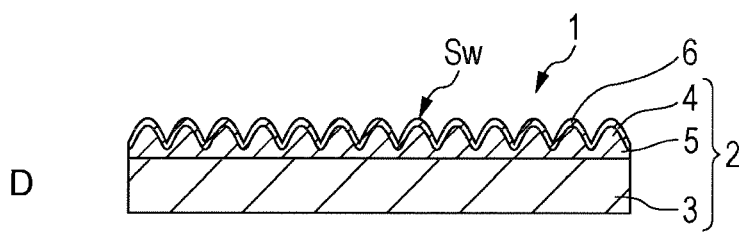
D

FIG. 13
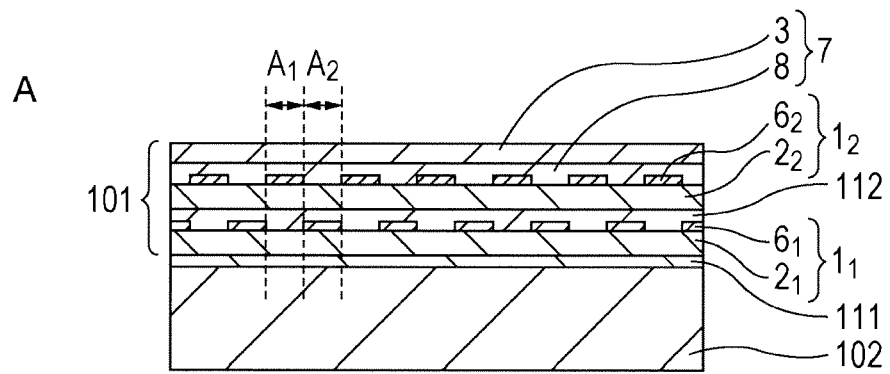
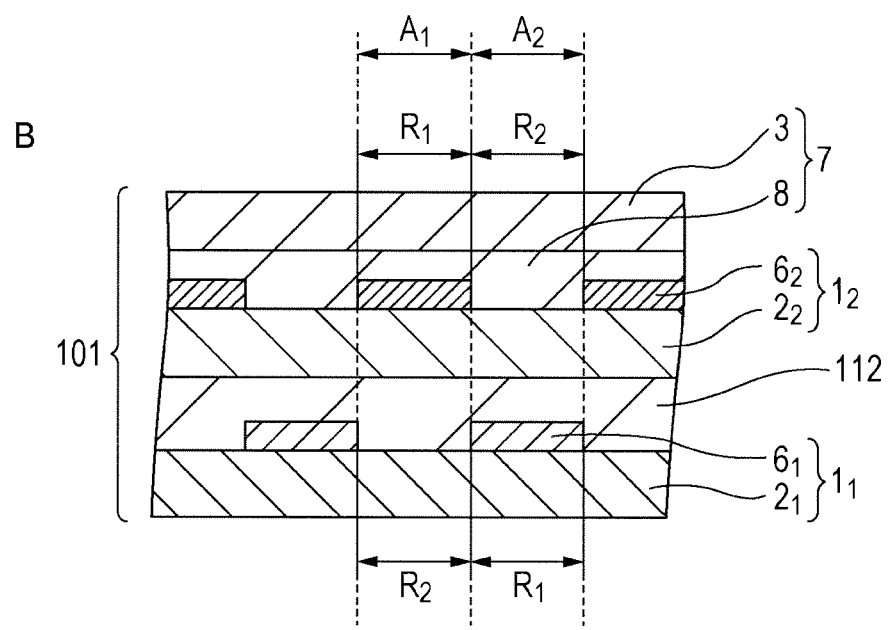

FIG. 14
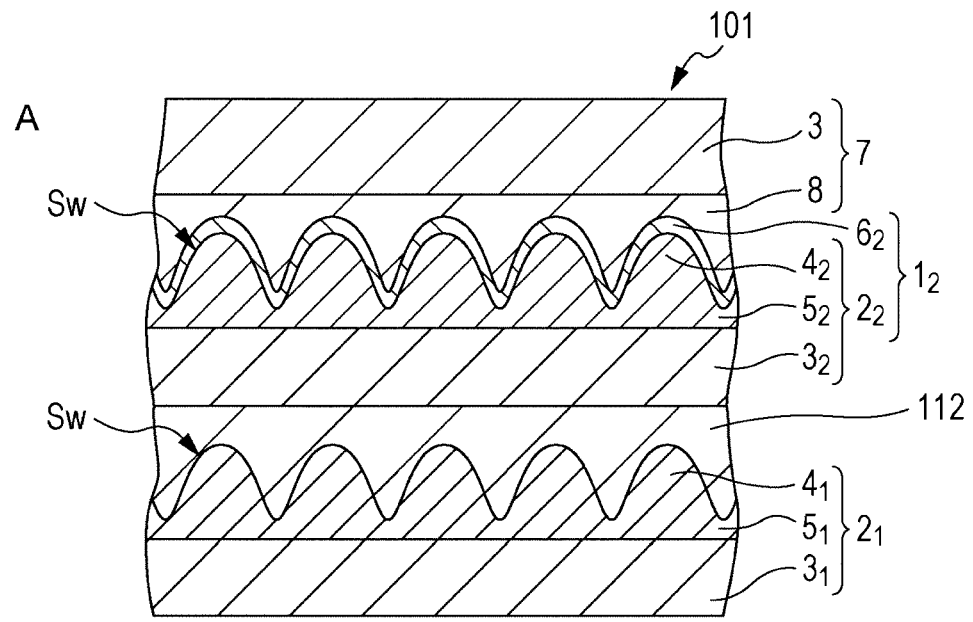
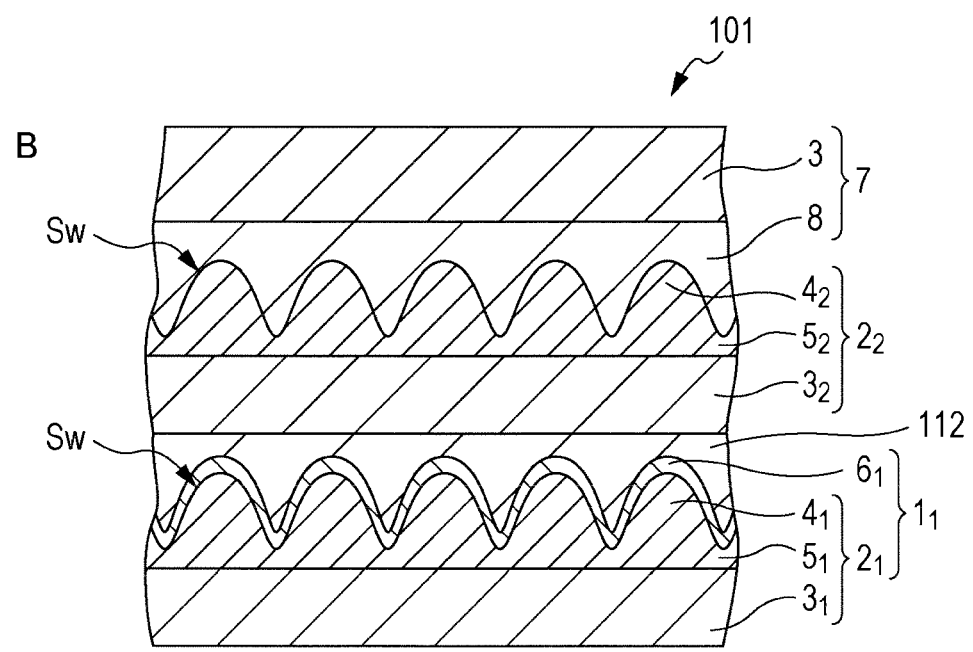

FIG. 15
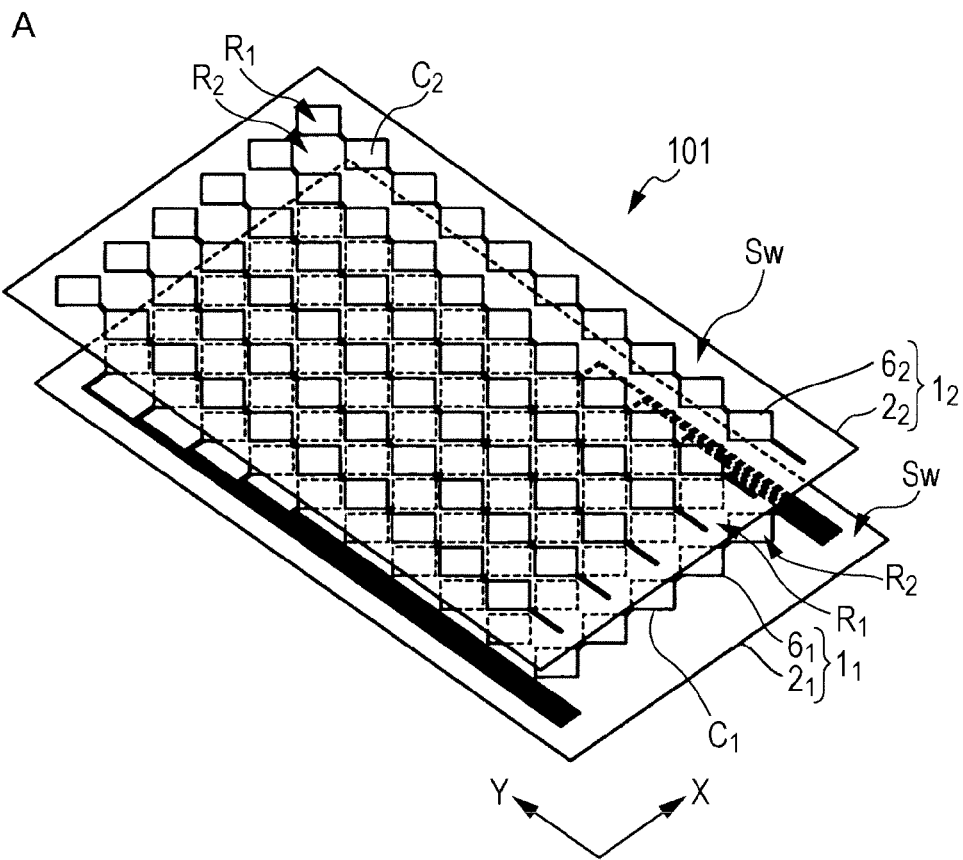
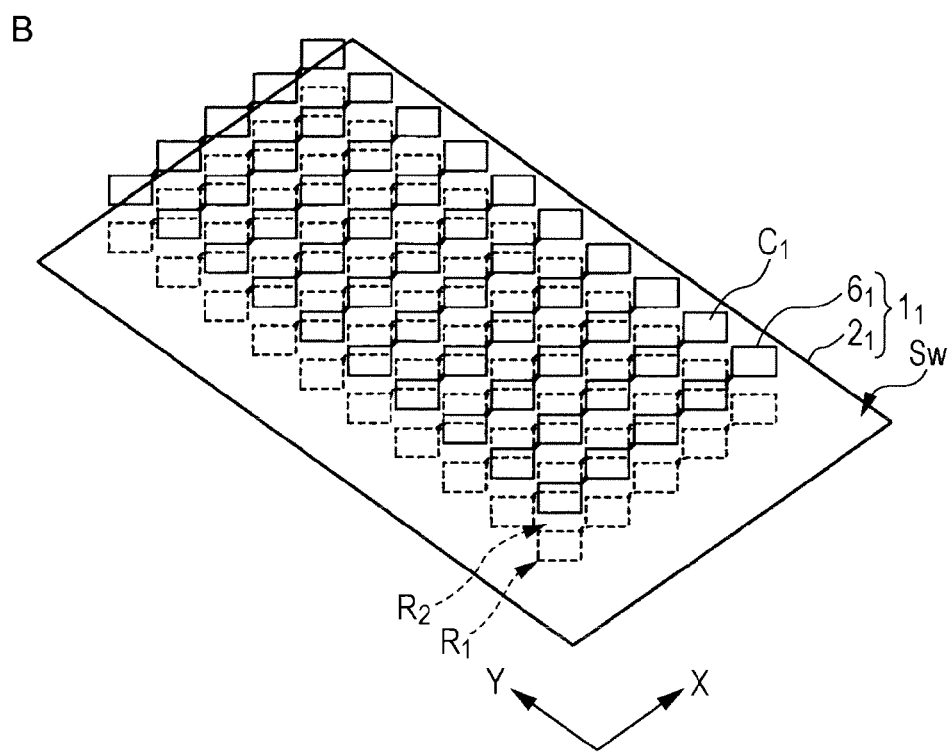

FIG. 16
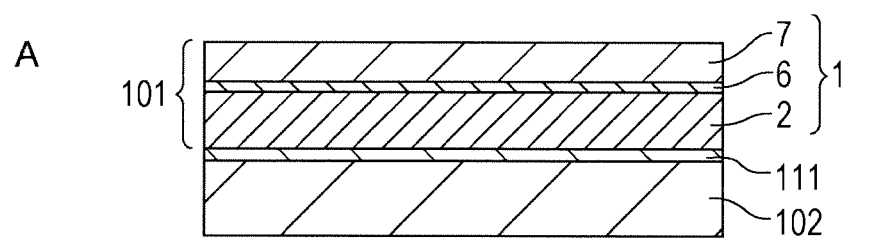
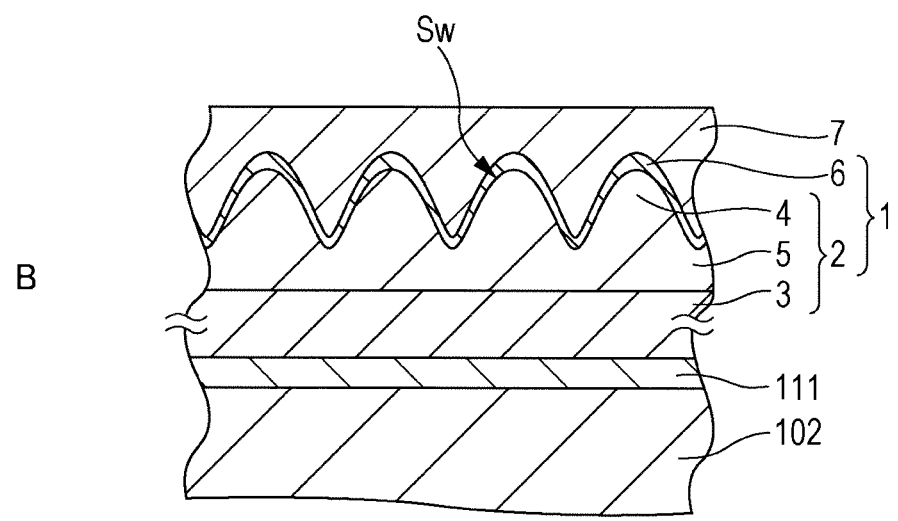

FIG. 18
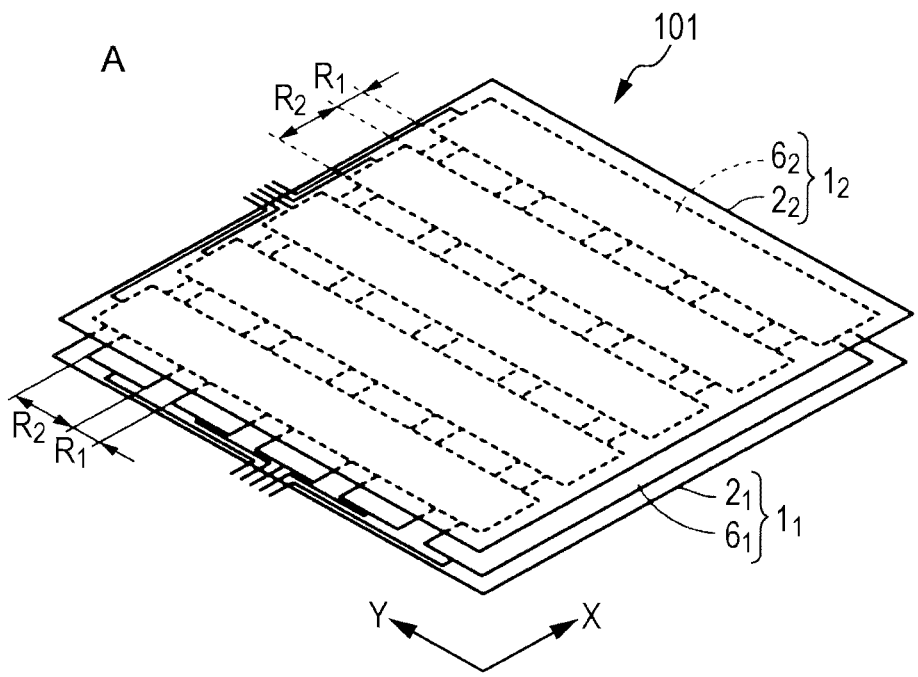
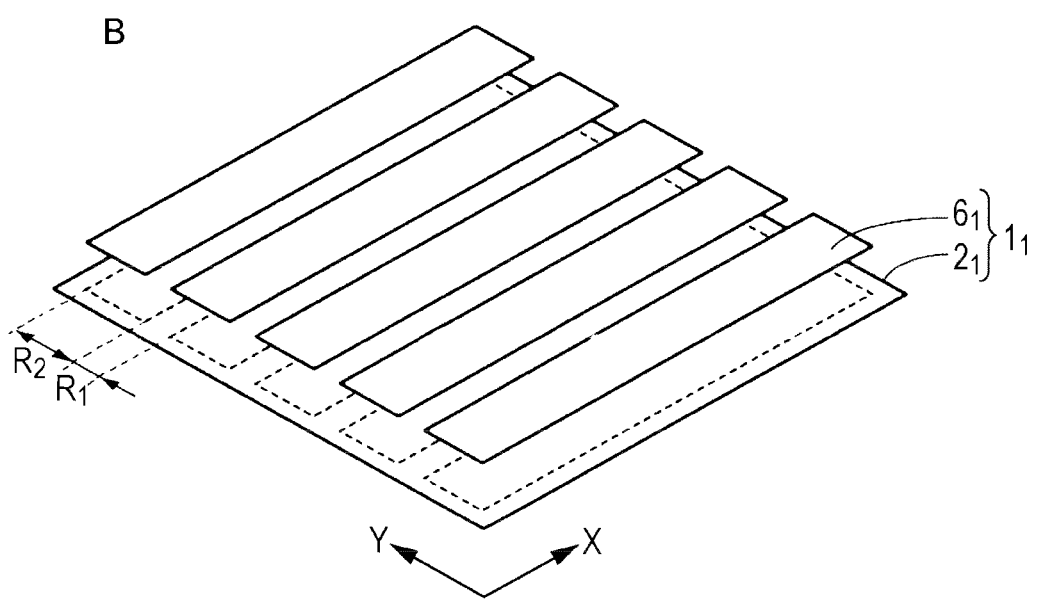

FIG. 23
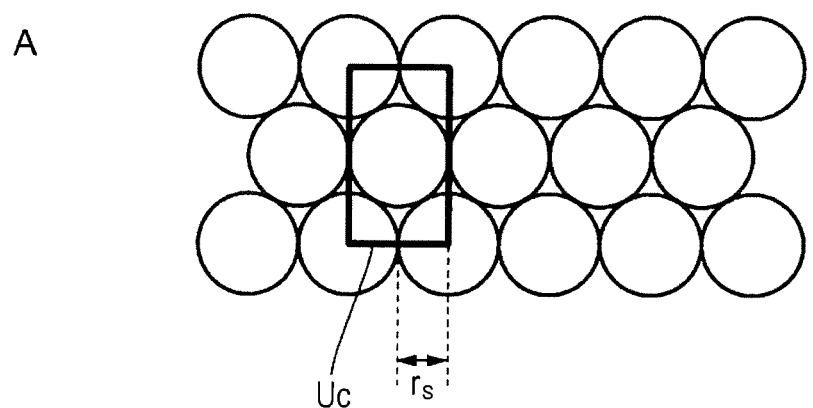
A
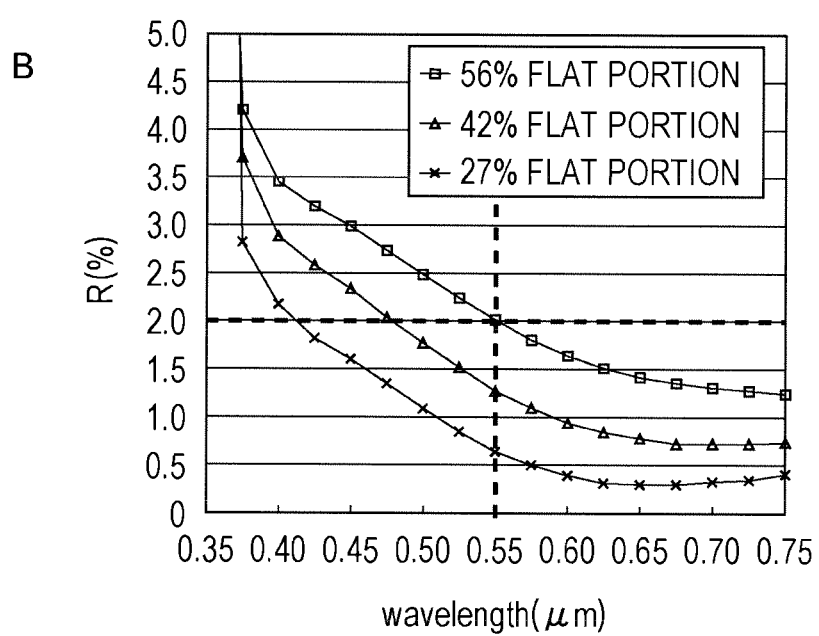
B
wavelength(μm)

FIG. 29
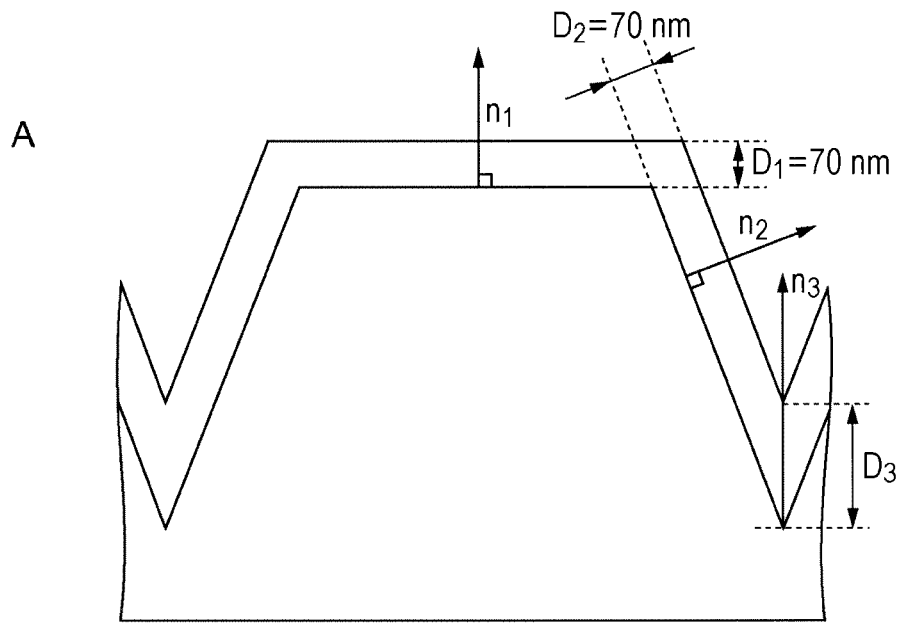
A
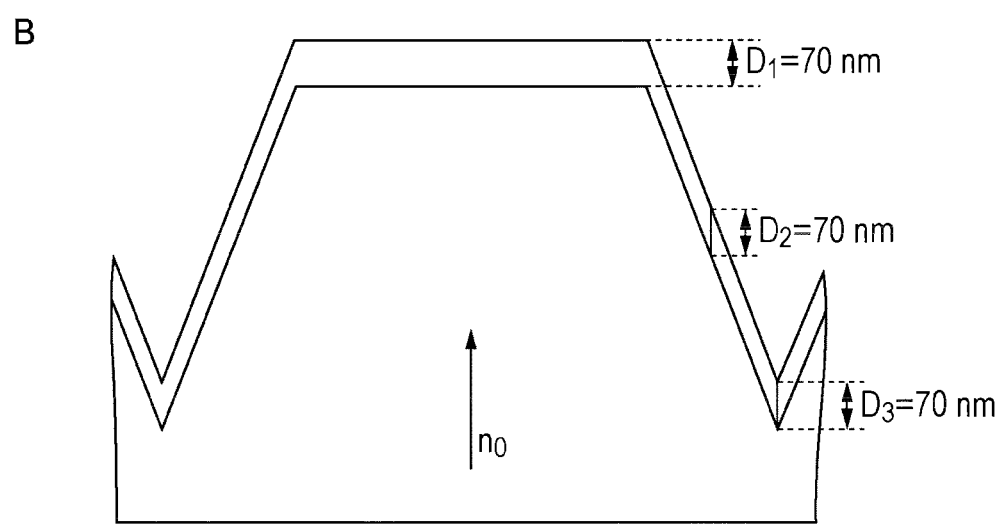
B

TRANSPARENT CONDUCTIVE ELEMENT, INPUT DEVICE, AND DISPLAY DEVICE

CROSS REFERENCES TO RELATED APPLICATIONS

The present application is a national stage of International Application No. PCT/JP2011/052456 filed on Jan. 31, 2011 and claims priority to Japanese Patent Application No. 2011-009323 filed on Jan. 19, 2011, the disclosure of which is incorporated herein by reference.

BACKGROUND

The present invention relates to a transparent conductive element, an input device, and a display device. In particular, it relates to a transparent conductive element having an antireflection function.

In a display device such as electronic paper and an input device such as a touch panel, a transparent conductive element in which a transparent conductive layer is formed on a flat surface of a substrate is used. As the material for the transparent conductive layer used in this transparent conductive element, a high-refractive-index material (e.g., ITO (Indium Tin Oxide)) having a refractive index of about 2.0 is used. Accordingly, the reflectance is high depending on the thickness of the transparent conductive layer and the quality of the display device and the input device is sometimes degraded.

Conventionally, in order to improve the transmission characteristics of a transparent conductive element, a technique of forming an optical multilayer film is used. For example, in Japanese Unexamined Patent Application Publication No. 2003-136625, a transparent conductive element for a touch panel, in which an optical multilayer film is provided between a substrate and a transparent conductive film, is proposed. This optical multilayer film is formed by sequentially stacking a plurality of dielectric films having different refractive indices. However, according to this technique, the optical adjustment function becomes wavelength-dependent. Here, the optical adjustment function refers to the optical adjustment function for the transmission characteristics and/or reflection characteristics. Moreover, in recent years, because transparent conductive elements are used in various display devices and input devices, excellent electrical reliability is desired.

SUMMARY

Technical Problem

Accordingly, an object of the present invention is to provide a transparent conductive element, an input device, and a display device that have less wavelength-dependency, have an optical adjustment function with good visibility, and have excellent electrical reliability.

Technical Solution

The present invention is a transparent conductive element that includes an optical layer provided with a wave surface having an average wavelength less than or equal to the wavelength of visible light, and a transparent conductive layer formed on the wave surface and following the shape of the wave surface, in which when the average wavelength of the wave surface is $\lambda m$ and the average amplitude of vibration of the wave surface is $Am$, the ratio $(Am/\lambda m)$ is 0.2 or more and 1.0 or less, the average angle of slopes among the wave surface is in the range of 30° or more and 60° or less, when the thickness of the transparent conductive layer at the position where the wave surface is highest is $D1$ and the thickness at the position where the wave surface is lowest is $D3$, the ratio $D3/D1$ is in the range of 0.8 or less.

The transparent conductive element according to the present invention is suitable for applications to input devices and display devices.

In the present invention, the shapes such as ellipses, circles (rounds), spheres, and ellipsoids include not only perfect ellipses, circles, spheres, and ellipsoids mathematically defined but also ellipses, circles, spheres, and ellipsoids imparted with some degree of deformation.

In the present invention, the wave surface of the optical layer is preferably formed by arranging a plurality of structures on a substrate surface. The structures preferably have a convex shape or a concave shape and are preferably arranged into a particular lattice. As the lattice, a rectangular lattice or a quasi-rectangular lattice, or a hexagonal lattice or a quasi-hexagonal lattice is preferably used.

In the present invention, an arrangement pitch $P1$ of the structures in the same track is preferably longer than an arrangement pitch $P2$ of the structures between two adjacent tracks. In this manner, the packing ratio of structures having an elliptical cone or truncated elliptical cone shape can be improved, and thus the optical adjustment function can be improved.

In the present invention, when the individual structures form a hexagonal lattice pattern or a quasi-hexagonal lattice pattern on the substrate surface, the ratio $P1/P2$ where the arrangement pitch of the structures in the same track is $P1$ and the arrangement pitch of the structures between the two adjacent tracks is $P2$ preferably satisfies the relationship of $1.00 \leq P1/P2 \leq 1.1$ or $1.00 < P1/P2 \leq 1.1$. In such a numerical range, the packing ratio of the structures having an elliptical cone or truncated elliptical cone shape can be improved, and thus the optical adjustment function can be improved.

In the present invention, when the individual structures form a hexagonal lattice pattern or a quasi-hexagonal lattice pattern, each structure preferably has an elliptical cone or truncated elliptical cone shape in which the slope at a central portion is formed to be steeper than the slope of the tip portion or the bottom and the long axis direction lies in the direction in which the tracks extend. According to such a shape, the optical adjustment function for the reflection and transmission characteristics can be improved.

In the present invention, when the individual structures form a hexagonal lattice pattern or a quasi-hexagonal lattice pattern, the height or depth of the structures in the direction in which the tracks extend is preferably smaller than the height or depth of the structures in the row direction of the tracks. When this relationship is not satisfied, the arrangement pitch in the direction in which the tracks extend needs to be increased, and thus the packing ratio of the structures in the direction in which the tracks extend is decreased. The decrease in packing ratio leads to degradation of reflection characteristics.

In the present invention, when the structures form a rectangular pattern or a quasi-rectangular pattern on the substrate surface, the arrangement pitch $P1$ of the structures in the same track is preferably longer than the arrangement pitch $P2$ of the structures between two adjacent tracks. In this manner, the packing ratio of the structures having an elliptical cone or truncated elliptical cone shape can be improved and thus the optical adjustment function can be improved.

In the case where the structures form a rectangular pattern or a quasi-rectangular pattern on the substrate surface, when the arrangement pitch of the structures in the same track is P1 and the arrangement pitch of the structures between two adjacent tracks is P2, the ratio P1/P2 preferably satisfies the relationship $1.4 < P1/P2 \leq 1.5$. Within in such a numerical range, the packing ratio of the structures having an elliptical cone or truncated elliptical cone shape can be improved and thus the optical adjustment function can be improved.

When the structures form a rectangular pattern or a quasi-rectangular pattern on the substrate surface, each structure preferably has an elliptical cone or truncated elliptical cone shape in which the long axis direction lies in the direction in which the tracks extend and the slope of the central portion is formed to be steeper than the slope of the tip portion and the bottom. According to such a shape, the optical adjustment function for the reflection and transmission characteristics can be improved.

When the structures form a rectangular pattern or a quasi-rectangular pattern on the substrate surface, the height or depth of the structures in a 45° direction or an approximately 45° direction with respect to the track is preferably smaller than the height or depth of the structures in the row direction of the tracks. When this relationship is not satisfied, the arrangement pitch in a 45° direction or an approximately 45° direction with respect to the track needs to be increased and thus the packing ratio of the structures in the 45° direction or an approximately 45° direction with respect to the track is decreased. The decrease in packing ratio leads to degradation of reflection characteristics.

In the present invention, many structures formed on the substrate surface at a fine pitch preferably form a plurality of rows of tracks and form a hexagonal lattice pattern, a quasi-hexagonal lattice pattern, a rectangular pattern, or a quasi-rectangular pattern among three adjacent tracks. In this manner, the packing density of the structures on the surface can be increased and thus an optical element having an enhanced optical adjustment function for reflection and transmission characteristics of visible light can be obtained.

Additional features and advantages are described herein, and will be apparent from the following Detailed Description and the figures.

In the present invention, an optical element is preferably fabricated by using a method that combines a master fabrication process for optical disks and an etching process. A master for fabricating an optical element can be fabricated in a short time at high efficiency, the size of the substrate can be increased, and thus the productivity of the optical elements can be improved.

In the present invention, since a transparent conductive layer having a particular pattern and following the shape of a wave surface is formed on the wave surface having an average wavelength smaller than or equal to the wavelength of visible light, optical adjustment function having less wavelength-dependency and good visibility can be obtained.

Moreover, since the average angle of the sloped surfaces of the wave surface is in the range of 30° or more and 60° or less, good electrical reliability can be obtained.

Advantageous Effects

As has been described above, according to the present invention, a transparent conductive element that has less wavelength-dependency, good optical adjustment function with good visibility, and good electrical reliability can be realized.

BRIEF DESCRIPTION OF THE FIGURES

FIG. 5a is an enlarged cross-sectional view for explaining an example of a surface profile of a transparent conductive layer.

FIG. 5B is an enlarged cross-sectional view for explaining the thickness of the transparent conductive layer formed on convex-shaped structures.

FIGS. 8A to 8D are step diagrams for explaining one example of a method for fabricating a transparent conductive element according to the first embodiment of the present invention.

FIGS. 9A to 9D are step diagrams for explaining one example of a method for fabricating a transparent conductive element according to the first embodiment of the present invention.

FIG. 13A is a cross-sectional view for explaining one example of a configuration of an information input device according to a fifth embodiment of the present invention.

FIG. 13B is an enlarged cross-sectional view showing in close-up a region A1 and a region A2 shown in FIG. 13A.

FIG. 14A is an enlarged cross-sectional view showing in further close-up the region $A_1$ shown in FIG. 13A.

FIG. 14B is an enlarged cross-sectional view showing in further close-up the region $A_2$ shown in FIG. 13A.

FIG. 15A is an exploded perspective view for explaining one example of a configuration of an information input device according to the fifth embodiment of the present invention.

FIG. 15B is an exploded perspective view for explaining one example of a configuration of a first transparent conductive element provided in an information input device according to the fifth embodiment of the present invention.

FIG. 16A is a cross-sectional view for explaining one example of a configuration of an information input device according to a sixth embodiment of the present invention.

FIG. 16B is an enlarged cross-sectional view showing in close-up a part of the information input device shown in FIG. 16A.

FIG. 18A is an exploded perspective view for explaining an example of a configuration of an information input device according to the seventh embodiment of the present invention.

FIG. 18B is an exploded perspective view for explaining one example of a configuration of a transparent conductive element included in the information input device according to the seventh embodiment of the present invention.

FIG. 23A is a plan view showing a plurality of structures arranged on a substrate surface in Samples 1-1 to 1-3.

FIG. 23B is a graph showing reflection spectra of transparent conductive elements of Samples 1-1 to 1-3.

FIG. 29A is a cross-sectional view showing thicknesses D1, D2, and D3 of a transparent conductive layer of Sample 7-2.

FIG. 29B is a cross-sectional view showing the thicknesses D1, D2, and D3 of a transparent conductive of Sample 7-3.

DETAILED DESCRIPTION

Figure 1:
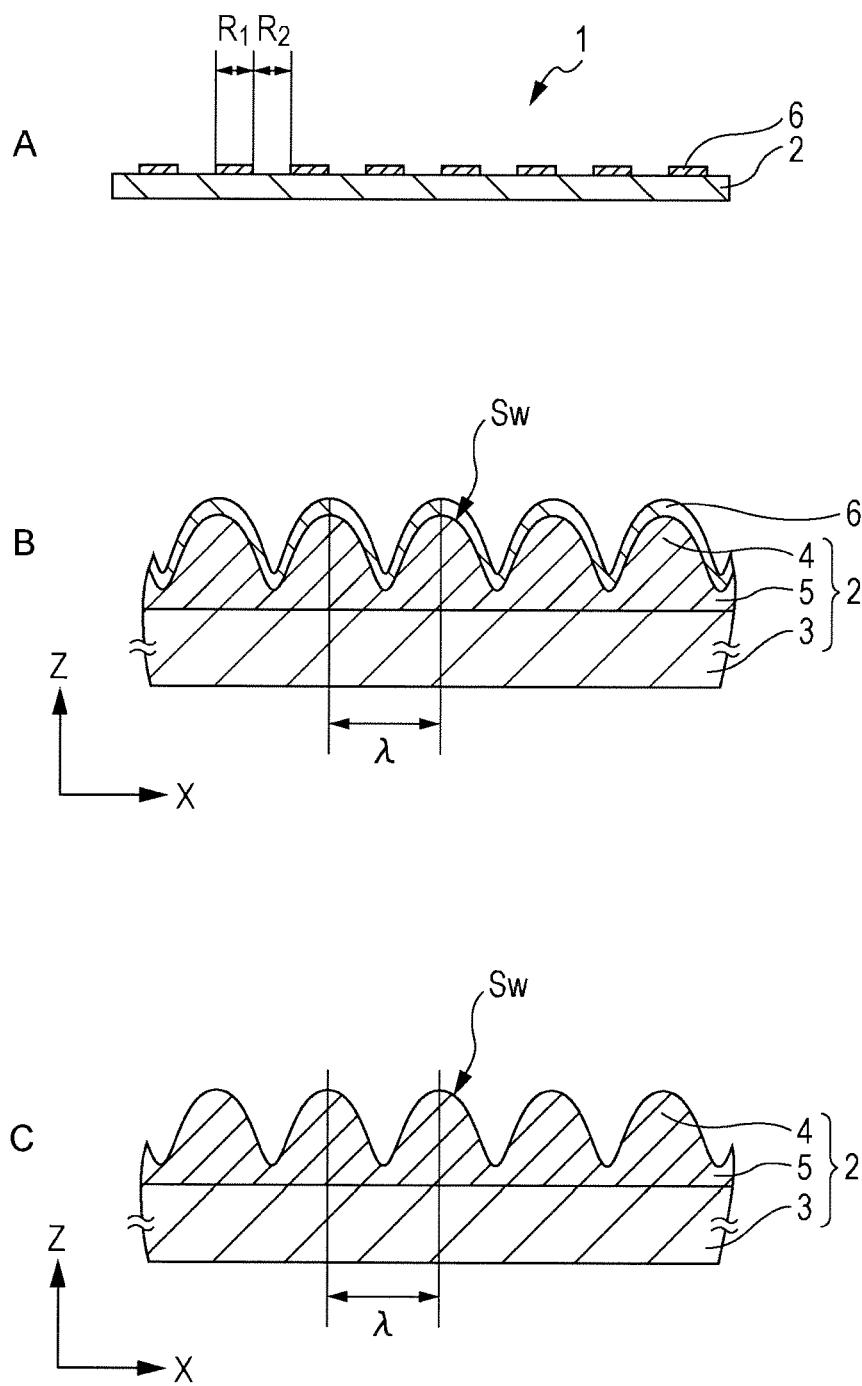
FIG. 1A is a cross-sectional view showing an example of a configuration of a transparent conductive element according to a first embodiment of the present invention.
FIG. 1B is an enlarged cross-sectional view showing in close-up a first region R1 shown in FIG. 1A.
FIG. 1C is an enlarged cross-sectional view showing in close-up a second region R2 shown in FIG. 1A.

Embodiments of the present invention are described in the following order by referring to the drawings. Note that in all drawings of the embodiments below, the same or corresponding parts are given the same reference characters.

1. First Embodiment (example of a transparent conductive element in which structures are arranged in a hexagonal lattice)

2. Second Embodiment (example of a transparent conductive element in which structures are arranged in a rectangular lattice)

3. Third Embodiment (example of a transparent conductive element in which structures are arranged at random)

4. Fourth Embodiment (example of a transparent conductive element in which a transparent conductive layer is continuously formed on the entire wave surface)

5. Fifth Embodiment (first application example of a transparent conductive element to an information input device)

6. Sixth Embodiment (second application example of a transparent conductive element to an information input device)

7. Seventh Embodiment (third application example of a transparent conductive element to an information input device)

8. Eighth Embodiment (fourth application example of a transparent conductive element to an information input device)

9. Ninth Embodiment (first application example of a transparent conductive element to an information display device)
10. Tenth Embodiment (second application example of a transparent conductive element to an information display device)
11. Eleventh Embodiment (third application example of a transparent conductive element to an information display device.

1. First Embodiment

The present inventors have conducted extensive studies to address the problems of the related art described above. As a result, the inventors have found that (1) an optical adjustment function having less wavelength dependency can be realized by forming a transparent conductive layer on an optical layer having a wave surface with an average wavelength less than or equal to the wavelength of the visible light in such a manner that the transparent conductive layer follows the shape of the wave surface, and (2) good electrical reliability can be obtained by adjusting the average angle of the sloped surfaces among the wave surface to be in the range of 30° or more and 60° or less.

[Configuration of Transparent Conductive Element]

Figure 2:
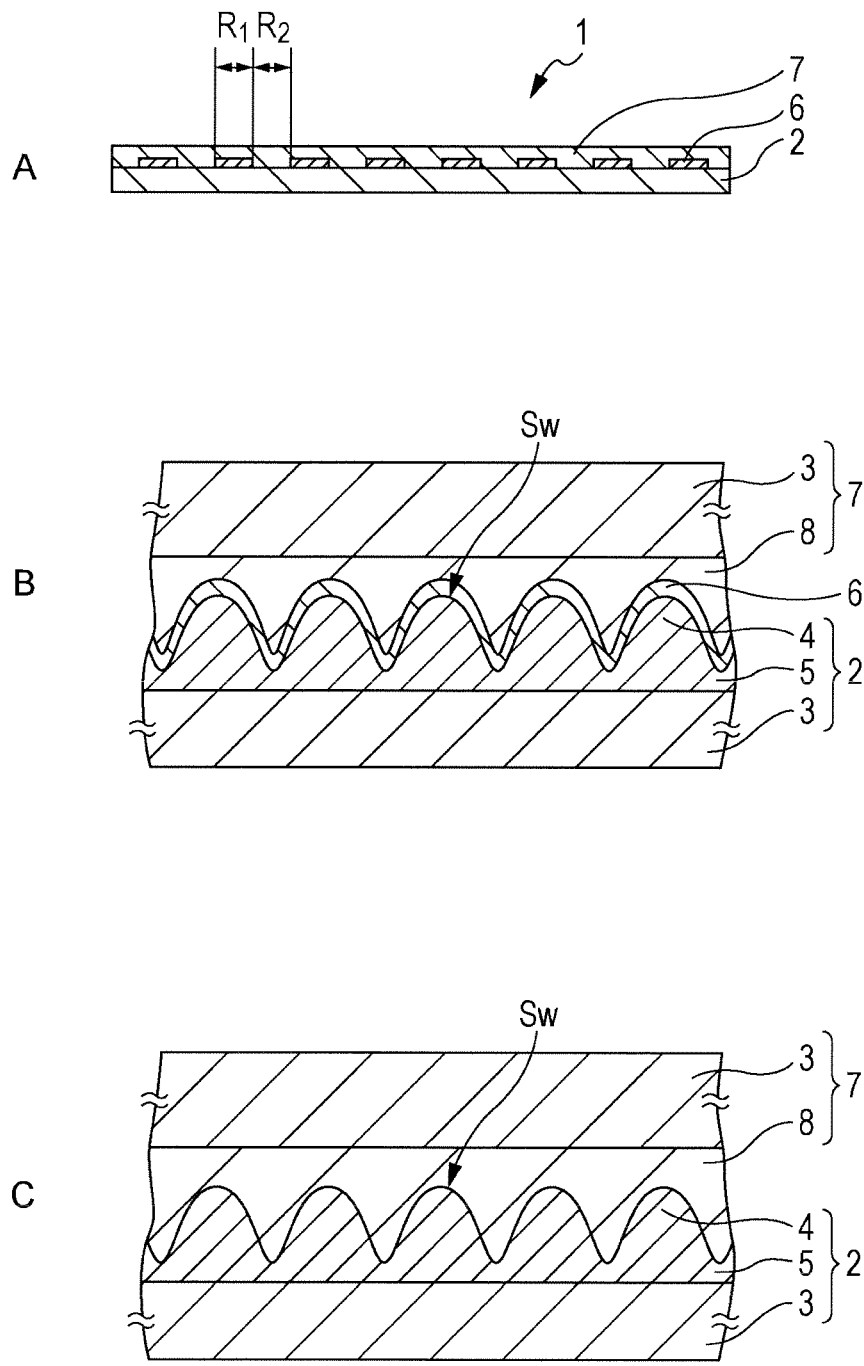
FIG. 2A is a cross-sectional view showing another example of a configuration of a transparent conductive element according to the first embodiment of the present invention.
FIG. 2B is an enlarged cross-sectional view showing in close-up a first region R1 shown in FIG. 2A.
FIG. 2C is an enlarged cross-sectional view showing in close-up a second region R2 shown in FIG. 2A.

FIG. 1A is a cross-sectional view showing one example of a configuration of a transparent conductive element according to a first embodiment of the present invention. FIG. 1B is an enlarged cross-sectional view showing in close-up a first region $R_1$ shown in FIG. 1A. FIG. 1C is an enlarged cross-sectional view showing in close-up a second region $R_2$ shown in FIG. 1A. A transparent conductive element 1 includes an optical layer (first optical layer) 2 having a wave surface Sw in one main surface and a transparent conductive layer 6 formed on the wave surface Sw to follow the shape of this wave surface Sw. In the wave surface Sw of the optical layer 2, first regions $R_1$ in which the transparent conductive layer 6 is formed and second regions $R_2$ in which no transparent conductive layer 6 is formed are alternately provided and the transparent conductive layer 6 has a particular pattern. Furthermore, if needed, as shown in FIGS. 2A to 2C, an optical layer (second optical layer) 7 formed on the transparent conductive layer 6 may be further provided so that both main surfaces of the transparent conductive layer 6 are respectively covered with the optical layer 2 and the optical layer 7. The transparent conductive element 1 preferably has flexibility.

(Optical Layer)

The optical layer 2 includes, for example, a substrate 3 and a plurality of structures 4 formed on a surface of the substrate 3. The wave surface Sw is formed by forming a plurality of structures 4 on a surface of the substrate 3. The structures 4 and the substrate 3 are, for example, formed separately or integrally. When the structures 4 and the substrate 3 are separately formed, a base layer 5 may be further provided between the structures 4 and the substrate 3 if necessary. The base layer 5 is a layer formed integrally with the structures 4 on the bottom surface side of the structures 4 and is made by curing an energy-ray-curable resin composition similar to the structures 4.

The optical layer 7 includes, for example, a substrate 3 and a bonding layer 8 disposed between the substrate 3 and the transparent conductive layer 6 and the substrate 3 is bonded onto the transparent conductive layer 6 with the bonding layer 8 therebetween. The optical layer 7 is not limited to this example, and can be formed as a ceramic coat (overcoat) such as $SiO_2$.

The ratio $(Am/\lambda m)$ of the average amplitude Am of the vibration of the wave surface Sw to the average wavelength $\lambda m$ of the wave surface Sw is preferably in the range of 0.2 or more and 1.0 or less and more preferably 0.3 or more and 0.8 or less. When the ratio $(Am/\lambda m)$ is less than 0.2, the optical adjustment function by the wave surface Sw tends to be degraded. In contrast, at a ratio $(Am/\lambda m)$ exceeding 1.0, electrical reliability tends to be degraded.

The average wavelength $\lambda m$ of the wave surface Sw is preferably less than or equal to the wavelength band of light at which the optical adjustment function is aimed. The wavelength band of light at which the optical adjustment function is aimed is, for example, a wavelength band of ultraviolet light, a wavelength band of visible light, or a wavelength band of infrared light. Here, the wavelength band of ultraviolet light refers to a wavelength band of 10 nm to 360 nm, the wavelength band of visible light refers to a wavelength band of 360 nm to 830 nm, and the wavelength band of infrared light refers to a wavelength band of 830 nm to 1 mm. In particular, the average wavelength $\lambda m$ of the wave surface Sw is preferably in the range of 140 nm or more and 300 nm or less and more preferably 150 nm or more and 270 nm or less. When the average amplitude Am of vibration of the wave surface Sw is less than 140 nm, the electrical characteristics tend to be degraded. In contrast, when the average amplitude Am of vibration of the wave surface Sw exceeds 300 nm, the visibility tends to be degraded.

The average amplitude Am of vibration of the wave surface Sw is preferably in the range of 28 nm or more and 300 nm or less, more preferably 50 nm or more and 240 nm or less, and yet more preferably 80 nm or more and 240 nm or less. When the average amplitude Am of vibration of the wave surface Sw is less than 28 nm, the optical adjustment function tends to be degraded. In contrast, when the average amplitude Am of vibration of the wave surface Sw exceeds 300 nm, the electrical characteristics tend to be degraded.

Here, the average wavelength $\lambda m$ of the wave surface Sw, the average amplitude Am of vibration, and the ratio $(Am/\lambda m)$ are determined as follows. First, the transparent conductive element 1 is cut in one direction so that the position at which the amplitude of vibration of the wave surface Sw is maximum is included, and the section is photographed with TEM (transmission electron microscope). Next, the wavelength $\lambda$ of the wave surface Sw and the amplitude A of vibration are determined from the TEM photograph that has been taken. This measurement is repeatedly conducted at 10 positions of the transparent conductive element 1 chosen at random, and the measurement values are simply averaged (arithmetic mean) to determine the average wavelength $\lambda m$ of the wave surface Sw and the average amplitude Am of vibration. Next, the ratio $(Am/\lambda m)$ is determined by using the average wavelength $\lambda m$ and the average amplitude Am of vibration.

The average angle of the sloped surfaces among the wave surface Sw is preferably in the range of 60° or less and more preferably 30° or more and 60° or less. When the average angle is less than 30°, the electrical reliability by the wave surface Sw tends to be degraded. In contrast, when the average angle exceeds 60°, the electrical reliability tends to be degraded. Moreover, when the average angle exceeds 60°, the etching resistance of the transparent conductive layer 6 tends to be degraded.

As shown in FIGS. 2A to 2C, when the optical layer 7 is further formed on the transparent conductive layer 6, the difference $\Delta R$ $(=R2-R1)$ in reflectance between the reflectance $R_1$ of the first region $R_1$ in which the transparent conductive layer 6 is formed and the reflectance $R_2$ of the second region $R_2$ in which the transparent conductive layer 6 is not formed is preferably in the range of 5% or less, more preferably 3% or less, and yet more preferably 1% or less. The transparent conductive layer 6 having a particular pattern can be suppressed from becoming visible by adjusting the difference ΔR in reflectance to 5% or less.

When the transparent conductive layer 6 is exposed as shown in FIGS. 1A to 1C, the transmission hue of the optical-layer-2-side main surface among the two main surfaces of the transparent conductive element 1 in the L*a*b* color space is preferably |a*|≤10 and |b*|≤10, more preferably, |a*|≤5 and |b*|≤5, and yet more preferably |a*|≤3 and |b*|≤3. The visibility can be improved when the transmission hue is |a*|≤10 and |b*|≤10.

As shown in FIGS. 2A to 2C, when the optical layer 7 is further formed on the transparent conductive layer 6, the transmission hue of the optical-layer-2-side main surface among the two main surfaces of the transparent conductive element 1 in the L*a*b* color space is preferably |a*|≤5 and |b*|≤5, more preferably |a*|≤3 and |b*|≤3, and yet more preferably |a*|≤2 and |b*|≤2. The visibility can be improved when the transmission hue is |a*|≤5 and |b*|≤5.

As shown in FIGS. 1A to 1C, when the transparent conductive layer 6 is exposed, the reflection hue of the transparent-conductive-layer-6-side main surface among the two main surfaces of the transparent conductive element 1 in the L*a*b* color space is preferably |a*|≤10 and |b*|≤10. The visibility can be improved when the reflection hue is |a*|≤10 and |b*|≤10.

As shown in FIGS. 2A to 2C, when the optical layer 7 is further formed on the transparent conductive layer 6, the reflection hue of the transparent-conductive-layer-6-side main surface among the two main surfaces of the transparent conductive element 1 in the L*a*b* color space is preferably |a*|≤10 and |b*|≤10, more preferably |a*|≤5 and |b*|≤5, and yet more preferably |a*|≤3 and |b*|≤3. The visibility can be improved when the reflection hue is |a*|≤10 and |b*|≤10.

(Substrate)

The substrates 3 and 8 are, for example, transparent substrates having transparency. As the material for the substrates 3 and 8, for example, a plastic material having transparency and a material mainly composed of glass or the like can be named; however, the material is not particularly limited to such materials.

As the glass, for example, soda-lime glass, lead glass, hard glass, quartz glass, liquid crystallized glass, or the like (refer to "Kagaku Binran—Kiso-hen (Chemistry Handbook, Basics)", p. I-537, edited by The Chemical Society of Japan). As the plastic material, (meth)acryl-based resins such as polymethyl methacrylate and a copolymer of methyl methacrylate and another alkyl (meth)acrylate or vinyl monomer such as styrene; polycarbonate-based resins such as polycarbonate and diethylene glycol bisallylcarbonate (CR-39); thermosetting (meth)acryl-based resins such as homopolymers and copolymers of di(meth)acrylate of (brominated) bisphenol A and polymers and copolymers of urethane-modified monomers of (brominated) bisphenol A mono(meth)acrylate; and polyesters, in particular, polyethylene terephthalate, polyethylene naphthalate, and unsaturated polyesters, acrylonitrile-styrene copolymers, polyvinyl chloride, polyurethane, epoxy resins, polyarylate, polyether sulfone, polyether ketone, cycloolefin polymers (trade name: ARTON and ZEONOR), and cycloolefin copolymers are preferred from the viewpoints of optical characteristics such as transparency, refractive index, and diffusion and various characteristics such as impact resistance, heat resistance, and durability. Furthermore, use of aramid-based resins is also possible considering the heat resistance.

When a plastic material is used as the substrates 3 and 8, a basecoat layer may be provided as surface treatment to improve the surface energy, coatability, slidability, and flatness of the plastic surface. As the basecoat layer, for example, organoalkoxy metal compounds, polyesters, acryl-modified polyesters, polyurethane, and the like are named. Moreover, in order to obtain an effect similar to provision of the basecoat layer, corona discharge and/or UV irradiation treatment may be conducted on the surfaces of the substrates 3 and 8.

When the substrates 3 and 8 are plastic films, the substrates 3 and 8 can be obtained by, for example, a method of stretching the resin described above or diluting the resin in a solvent, forming a film therefrom, and drying the film. Moreover, the thickness of the substrates 3 and 8 is preferably adequately selected depending on the usage of a conductive element 211 and is, for example, about 25 μm to 500 μm.

As for the shape of the substrates 3 and 8, for example, a sheet shape, a plate shape, and a block shape can be named; however, the shape is not particularly limited to these. Here, a sheet is defined to include a film.

(Structures)

Figure 3:
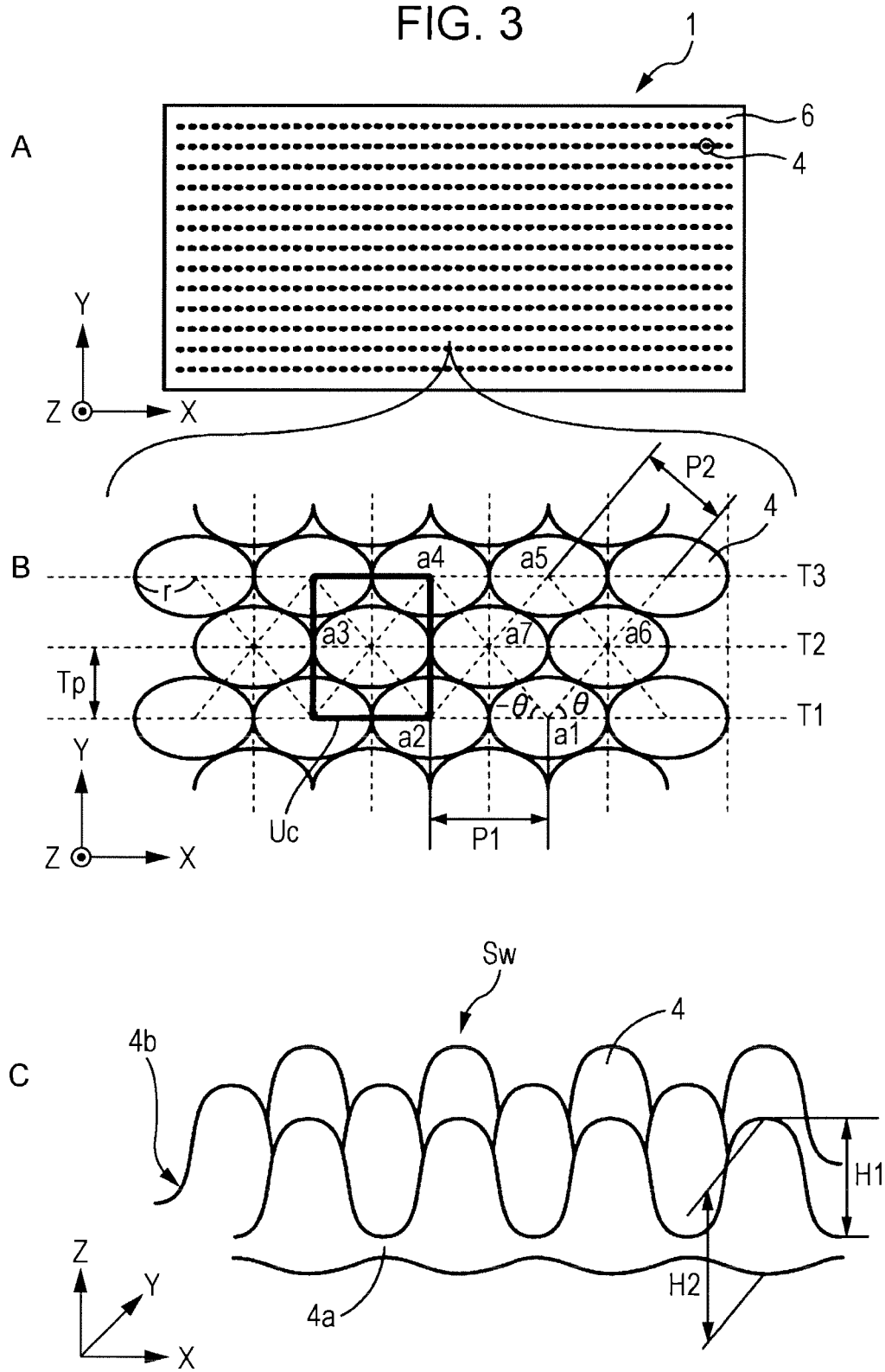
FIG. 3A is a plan view showing one example of an optical layer surface on which a plurality of structures are formed.
FIG. 3B is a plan view showing in close-up a part of the optical layer surface shown in FIG. 3A.
FIG. 3C is a perspective view showing in close-up a part of the optical layer surface shown in FIG. 3A.

FIG. 3A is a plan view showing one example of an optical layer surface on which a plurality of structures are formed. FIG. 3B is a plan view showing in close-up a part of the optical layer surface shown in FIG. 3A. FIG. 3C is a perspective view showing in close-up a part of the optical layer surface shown in FIG. 3A. Hereinafter, the two directions orthogonal to each other in the plane of the main surface of the transparent conductive element 1 are referred to as the X axis direction and Y axis direction, respectively, and the direction perpendicular to the main surface is referred to as the Z axis direction. The structures 4 have, for example, a convex shape or a concave shape relative to the surface of the substrate 3 and are two-dimensionally arranged relative to the surface of the substrate 3. The structures 4 are preferably periodically two-dimensionally arranged at short average arrangement pitches less than or equal to the wavelength band of the light for which the reduction of reflection is aimed.

The plurality of structures 4 have an arrangement form in which a plurality of rows of tracks T1, T2, T3, ... (hereinafter generally referred to as "track T") are formed on the surface of the substrate 3. In the present invention, a track refers to a portion in which structures 4 are lined up in a row. As the shape of the track T, a linear shape, an arc shape, or the like can be used, and the tracks T having these shapes may be made to wobble (meander). When the tracks T are wobbled as such, generation of nonuniformity of the appearance can be suppressed.

In case where the tracks T are made to wobble, the wobbles of the individual tracks T on the substrate 3 are preferably synchronized. In other words, the wobbles are preferably synchronized wobbles. When wobbles are synchronized as such, the unit lattice shape of the hexagonal lattice or the quasi-hexagonal lattice can be retained and the packing ratio can be maintained high. As the waveform of the wobbled tracks T, for example, a sine wave, a triangular wave, etc., can be named. The waveform of the wobbled tracks T is not limited to a periodic waveform and may be a non-periodic waveform. The wobble amplitude of the wobbled tracks T is selected to, for example, about ±10 nm.

The structures 4 are, for example, arranged at positions shifted by a half pitch between two adjacent tracks T. In particular, between the two adjacent tracks T, a structure 4 of one track (e.g., T2) is arranged at an intermediate position (position shifted by a half pitch) of the structures 4 in the other track (e.g., T1). As a result, as shown in FIG. 3B, the structures 4 are arranged to form a hexagonal lattice pattern or a quasi-hexagonal lattice pattern in which the centers of the structures 4 are positioned at respective points a1 to a7 among adjacent three rows of tracks (T1 to T3).

Here, the hexagonal lattice refers to a lattice having a shape of a regular hexagon. The quasi-hexagonal lattice refers to a lattice having a shape of a deformed regular hexagon different from the lattice having a shape of a regular hexagon. For example, when the structures 4 are arranged linearly, a quasi-hexagonal lattice refers to a hexagonal lattice obtained by deformation through stretching a lattice having a shape of a regular hexagon in a linear arrangement direction (track direction). When the structures 4 are arranged in a meandering manner, a quasi-hexagonal lattice refers to a hexagonal lattice in which a lattice having a shape of a regular hexagon is deformed by the meandering arrangement of the structures 4 or a hexagonal lattice in which a regular hexagonal lattice is deformed by being stretched in a linear arrangement direction (track direction) and by the meandering arrangement of the structures 4.

In the case where the structures 4 are arranged to form a quasi-hexagonal lattice pattern, as shown in FIG. 3B, the arrangement pitch P1 (e.g., distance between a1 and a2) of the structures 4 in the same track (e.g., T1) is preferably longer than the arrangement pitch of the structures 4 between two adjacent tracks (e.g., T1 and T2), i.e., the arrangement pitch P2 (e.g., distance between a1 to a7 and between a2 to a7) of the structures 4 in the ±θ directions with respect to the direction in which the tracks extend. When the structures 4 are arranged as such, the packing density of the structures 4 can be further improved.

As the specific shape of the structures 4, for example, a cone shape, a columnar shape, a needle shape, a semispherical shape, a semielliptical shape, and a polygonal shape can be named, but the shape is not limited to these shapes and other shapes may be employed. As the cone shape, for example, a cone shape with a pointed top, a cone shape having a flat top, and a cone shape having a convex- or concave-curved surface at the top can be named, and from the viewpoint of electrical reliability, a cone shape having a convex curved surface at the top is preferable; however, the shape is not limited to these shapes. As the cone shape having a convex curved surface at the top, a quadric surface shape such as a parabolic shape is named. The conical surface of the cone shape may be curved in a convex or concave manner. When a roll master is fabricated using a roll master exposure machine (refer to FIG. 7) described below, preferably, an elliptical cone shape having a convex curved surface at the top or a truncated elliptical cone shape having a flat top is employed as the shape of the structures 4 and the long-axis directions of the ellipses forming bottoms thereof are matched with the direction in which the tracks T extend.

From the viewpoint of improving the optical adjustment function, a cone shape in which the slope at the top is gentle and gradually becomes steep from the central portion toward the bottom is preferred. Moreover, from the viewpoint of improving the optical adjustment function for the reflection characteristics and transmission characteristics, a cone shape in which the slope at the central portion is steeper than those of the bottom and the top or a cone shape having a flat top is preferred. When the structures 4 have an elliptical cone shape or a truncated elliptical cone shape, the long-axis directions of the bottoms are preferably parallel to the direction in which the tracks extend.

The structure 4 preferably has a curved surface portion 4b, which has a height that gradually decreases in the direction from the top to the lower part, in the peripheral portion of the bottom. This is because the transparent conductive element 1 can be easily separated from the master or the like in the production process for the transparent conductive element 1. Note that the curved surface portion 4b may be provided in part of the peripheral portion of the structure 4; however, from the viewpoint of improving the separation property described above, it is preferably provided in all parts of the peripheral portion of the structure 4.

A protruding portion 4a is preferably provided in one or all parts of the periphery of the structure 4. This is because the reflectance can be suppressed low even when the packing ratio of the structures 4 is low. The protruding portion 4a is preferably provided between adjacent structures 4 from the viewpoint of ease of forming. Alternatively, one or all parts of the periphery of the structure 4 may be roughened to form fine irregularities. In particular, for example, the surface between adjacent structures 4 may be roughened to form fine irregularities. Moreover, small holes may be formed in the surface, e.g., top, of the structure 4.

In FIGS. 3B and 3C, the individual structures 4 have the same size, shape, and height; however, the shape of the structures 4 is not limited to this and structures 4 having two or more types of size, shape, and height may be formed on the substrate surface.

The height H1 of the structures 4 in the direction in which the tracks extend is preferably smaller than the height H2 of the structures 4 in the row direction. In other words, the heights H1 and H2 of the structures 4 preferably satisfy the relationship H1<H2. This is because when the structures 4 are arranged to satisfy the relationship H1≥H2, the arrangement pitch P1 in the direction in which the tracks extend needs to be longer and the packing ratio of the structures 4 in the direction in which the tracks extend will decrease. Such a decrease in packing ratio leads to degradation in the optical adjustment function.

Note that the aspect ratios of the structures 4 need not be the same and the individual structures 4 may be designed to have a particular height distribution. When structures 4 having a height distribution are provided, the wavelength dependency of the optical adjustment function can be reduced. Accordingly, a transparent conductive element 1 having good optical adjustment function can be realized.

Here, the height distribution refers to formation of structures 4 having two or more heights on the surface of the substrate 3. For example, structures 4 having a reference height and structures 4 having a height different from these structures 4 may be provided on the surface of the substrate 3. In this case, the structures 4 having a height different from the reference are provided periodically or non-periodically (at random) on the surface of the substrate 3, for example. As the direction of the periodicity, for example, the direction in which the tracks extend, the row direction, etc., can be named.

The average arrangement pitch Pm, the average height Hm, and the aspect ratio (average height or average depth Hm/average arrangement pitch Pm) of the structures 4 are respectively the same as the average wavelength λm, the average amplitude Am of vibration, and the ratio (average amplitude Am of vibration/average wavelength λm) of the wave surface Sw.

When the arrangement pitch of the structures 4 in the same track is P1 and the arrangement pitch of the structures 4 between the adjacent two tracks is P2, the ratio P1/P2 preferably satisfy the relationship 1.00≤P1/P2≤1.1 or 1.00<P1/P2≤1.1. In such a numerical range, the packing ratio of the structures 4 having an elliptical cone or truncated elliptical cone shape can be improved, and thus the optical adjustment function can be improved.

The ratio $R_s$ (($S2/S1$)×100) of the area S2 of the flat portion to the area S1 of the wave surface Sw is preferably in the range of 0% or more and 50% or less, more preferably 0% or more and 45% or less, and yet more preferably 0% or more and 30% or less. The optical adjustment function can be improved when the area ratio $R_s$ is 50% or less.

Here, the ratio $R_s$ (($S2/S1$)×100) of the area S2 of the flat portion to the area S1 of the wave surface Sw is the value determined as follows.

First, the surface of the transparent conductive element 1 is photographed in top-view with a scanning electron microscope (SEM). Next, a unit lattice Uc is arbitrarily selected from the SEM photograph taken and the arrangement pitch P1 and the track pitch Tp of the unit lattice Uc are measured (refer to FIG. 3B). Furthermore, the area S(structure) of the bottom of the structure 4 located at the center of the unit lattice Uc is measured by image processing. Next, the measured arrangement pitch P1, track pitch Tp, and area S(structure) of the bottom are used to determine the ratio R from the following equation.

Ratio $R=[(S(\text{lattice})-S(\text{structure})/S(\text{lattice})]\times 100$

Unit lattice area: S(lattice)=P1×2Tp

Area of the bottom of the structure existing in the unit lattice: S(structure)=2S The calculation process of the ratio R described above is conducted on unit lattices Uc at 10 positions arbitrarily selected from the SEM photograph taken. Then, the measurement values are simply averaged (arithmetic mean) to determine the average ratio of the ratio R and this is assumed to be the ratio $R_s$.

As for the packing ratio when the structures 4 overlap or sub structures, such as protruding portions 4, are present between the structures 4, the ratio $R_s$ can be determined by a method of determining the area ratio by using as a threshold the portion corresponding to the height of 5% of the height of the structure 4.

Figure 4:
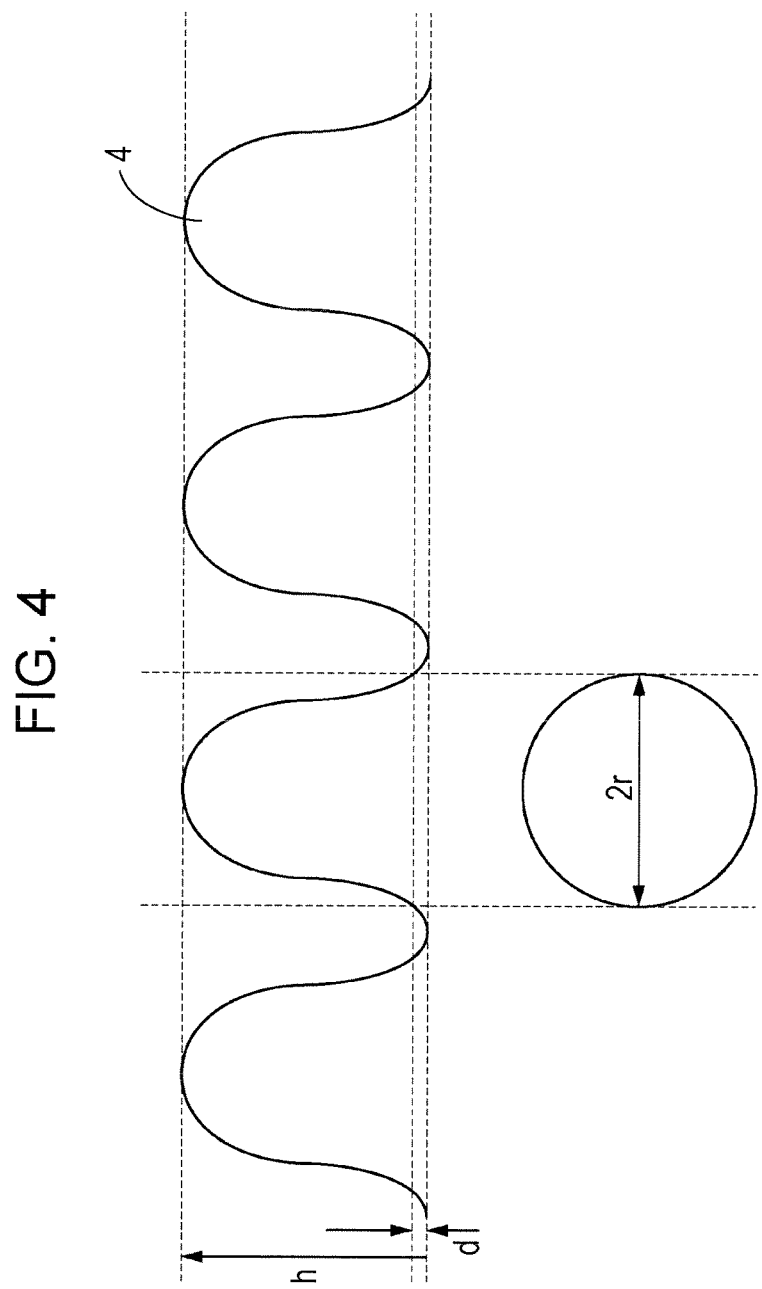
FIG. 4 is a schematic view explaining a method for setting a structure bottom when borders of structures are unclear.

FIG. 4 is a diagram for explaining the calculation method for the ratio $R_s$ when the borders of the structures 4 are unclear. When the borders of the structures 4 are unclear, the portion corresponding to 5% (=(d/h)×100) of the height h of the structures 4 is assumed to be the threshold, and the radius of the structure 4 at that height d is converted to determine the ratio $R_s$ by cross-sectional SEM observation as shown in FIG. 4. When the bottom of the structure 4 is elliptical, the same process is conducted for the long axis and the short axis.

The structures 4 are preferably connected in such a manner that the lower portions thereof overlap each other. In particular, part or all of the lower portions of the structures 4 in an adjacency relationship preferably overlap each other preferably in the track direction, the θ direction, or both. When the lower portions of the structures 4 overlap each other, the packing ratio of the structures 4 can be improved. The structures preferably overlap each other in a portion ¼ or less of the maximum value of the wavelength band of the light under an operation environment for an optical path length that considers the refractive index.

The ratio ((2r/P1)×100) of the radius 2r to the arrangement pitch P1 is preferably in the range of 85% or more, more preferably 90% or more, and yet more preferably 95% or more. This is because, within such a range, the packing ratio of the structures 4 can be improved and the optical adjustment function can be improved. When the ratio ((2r/P1)×100) is increased and the overlap of the structures 4 becomes excessive, the optical adjustment function tends to decrease. Accordingly, the upper limit of the ratio ((2r/P1)×100) is preferably set so that the structures are joined with each other in a portion ¼ or less of the maximum value of the wavelength band of light under an operating environment for the optical path length that considers the refractive index. Here, the arrangement pitch P1 is, as shown in FIG. 3B, the arrangement pitch in the track direction of the structures 4 and the radius 2r is, as shown in FIG. 3B, the radius in the track direction of the structure bottom. Note that when the structure bottom is circular, the radius 2r is the diameter and when the structure bottom is elliptical, the radius 2r is the major axis.

When the structures 4 form a quasi-hexagonal lattice pattern, the ellipticity e of the structure bottom is preferably 100%<e<150% or less. This is because, in this range, the packing ratio of the structures 4 can be improved and good optical adjustment function can be obtained.

(Transparent Conductive Layer)

FIG. 5A is an enlarged cross-sectional view for explaining an example of a surface profile of the transparent conductive layer. The transparent conductive layer 6 has a first wave surface Sw1 and a second wave surface Sw2 that are synchronized with each other. The average amplitude of vibration is preferably different between the first wave surface Sw1 and the second wave surface Sw2. The average amplitude A1 of vibration of the first wave surface Sw1 is preferably smaller than the average amplitude A2 of vibration of the second wave surface Sw2. The sectional shape taken by cutting the first wave surface Sw1 or the second wave surface Sw2 in one direction in such a manner that the position at which the amplitude of vibration is maximum is, for example, a triangular wave shape, a sine wave shape, a wave shape in which a quadric curve shape or part of a quadric shape is repeated, and shapes close to these. As the quadric curve, a circle, an ellipse, a parabola, etc., can be named.

The transparent conductive layer 6 is, for example, an organic transparent conductive layer or an inorganic transparent conductive layer. An organic transparent conductive layer is preferably mainly composed of a conductive polymer or a carbon nanotube. As the conductive polymer, for example, conductive polymer materials such as polythiophene-based, polyaniline-based, and polypyrrole-based conductive polymer materials can be used, and a polythiophene-based conductive polymer material is preferably used. As the polythiophene-based conductive polymer material, a PEDOT/PSS-based material in which PEDOT (polyethylene dioxythiophene) is doped with PSS (polystyrene sulfonic acid) is preferably used.

An inorganic transparent conductive layer is preferably mainly composed of a transparent oxide semiconductor. As the transparent oxide semiconductor, for example, a binary compound such as $SnO_2$, $InO_2$, ZnO, and CdO, a tertiary compound containing at least one element selected from the constituent elements of the binary compound, i.e., Sn, In, Zn, and Cd, and a multi-component (complex) oxide can be used. Specific examples of the transparent oxide semiconductor include, for example, indium tin oxide (ITO), zinc oxide (ZnO), aluminum-doped zinc oxide (AZO ($Al_2O_3$, ZnO)), SZO, fluorine-doped tin oxide (FTO), tin oxide ($SnO_2$), gallium-doped zinc oxide (GZO), and indium zinc oxide (IZO ($In_2O_3$, ZnO)). In particular, from the viewpoints of high reliability and low resistivity, indium tin oxide (ITO) is preferable. The materials constituting the inorganic transparent conductive layer are preferably in a mixed state of amorphous and polycrystal from the viewpoint of improving the conductivity.

The material constituting the transparent conductive layer 6 is preferably one mainly composed of at least one selected from the group consisting of a conductive polymer, a metal nanoparticle, and a carbon nanotube from the viewpoint of productivity. When these materials are used as main components, the transparent conductive layer 6 can be easily formed by wet coating without using an expensive vacuum system or the like.

FIG. 5B is an enlarged cross-sectional view for explaining the thickness of the transparent conductive layer. As shown in FIG. 5B, when the thickness of the transparent conductive layer 6 at the top of the structure 4 is D1, the thickness of the transparent conductive layer 6 at the sloped surface of the structure 4 is D2, and the thickness of the transparent conductive layer 6 between the structures is D3, the thicknesses D1, D2, and D3 preferably satisfy the relationship D1>D3 and more preferably D1>D3>D2. The ratio (D3/D1) of the thickness D3 of the transparent conductive layer 6 between the structures to the thickness D1 of the transparent conductive layer 6 at the top of the structure 4 is preferably in the range of 0.8 or less and more preferably 0.7 or less. When the ratio (D3/D1) is 0.8 or less, the optical adjustment function can be improved compared to when the ratio (D3/D1) is 1. Accordingly, the difference ΔR in reflectance between the first region $R_1$ in which the transparent conductive layer 6 is formed and the second region $R_2$ in which the transparent conductive layer 6 is not formed can be reduced. In other words, the transparent conductive layer 6 having a particular pattern can be suppressed from becoming visible.

The thickness D1 of the transparent conductive layer 6 at the top of the structure 4, the thickness D2 of the transparent conductive layer 6 at the sloped surface of the structure 4, and the thickness D3 of the transparent conductive layer 6 between the structures are respectively equal to the thickness D1 of the transparent conductive layer 6 at a position where the wave surface Sw is the highest, the thickness D2 of the transparent conductive layer 6 at the sloped surface of the wave surface Sw, and the thickness D3 of the transparent conductive layer 6 at a position where the wave surface Sw is the lowest.

The thickness D1 of the transparent conductive layer 6 at the top of the structure 4 is preferably in the range of 100 nm or less, more preferably 10 nm or more and 100 nm or less, and yet more preferably 10 nm or more and 80 nm or less. Beyond 100 nm, the visibility tends to be degraded. In contrast, the electrical characteristics tend to be degraded at less than 10 nm.

The thicknesses D1, D2, and D3 of the transparent conductive layer 6 are determined as follows.

First, the transparent conductive element 1 is cut in the direction in which the tracks extend so that the top of the structure 4 is included, and the cross-section is photographed with TEM. Next, from the TEM photograph taken, the thickness D1 of the transparent conductive layer 6 at the top of the structure 4 is measured. Next, the thickness D2 at a position half the height of the structure 4 (H/2) among positions at the sloped surface of the structure 4 is measured. Next, the thickness D3 at a position where the depth of the concave portion becomes the largest among the positions in the concave portion between the structures is measured.

Note that whether the thicknesses D1, D2, and D3 of the transparent conductive layer 6 have the above-described relation or not can be confirmed through the thicknesses D1, D2, and D3 of the transparent conductive layer determined as such.

The surface resistance of the transparent conductive layer 6 is preferably in the range of 50Ω/□ or more and 4000Ω/□ or less and more preferably in the range of 50Ω/□ or more and 500Ω/□ or less. This is because, at a surface resistance within such a range, the transparent conductive element 1 can be used as an upper electrode or a lower electrode of a capacitive touch panel. Here, the surface resistance of the transparent conductive layer 6 is determined by a four probe method (JIS K 7194). The resistivity of the transparent conductive layer 6 is preferably $1 \times 10^{-3}$ Ω·cm or less. This is because the above-described surface resistance range can be realized at $1 \times 10^{-3}$ Ω·cm or less.

(Bonding Layer)

For the bonding layer 8, an adhesive such as an acryl-based, rubber-based, or silicon-based adhesive can be used, for example, and an acryl-based adhesive is preferable from the standpoint of transparency.

[Configuration of Roll Master]

Figure 6:
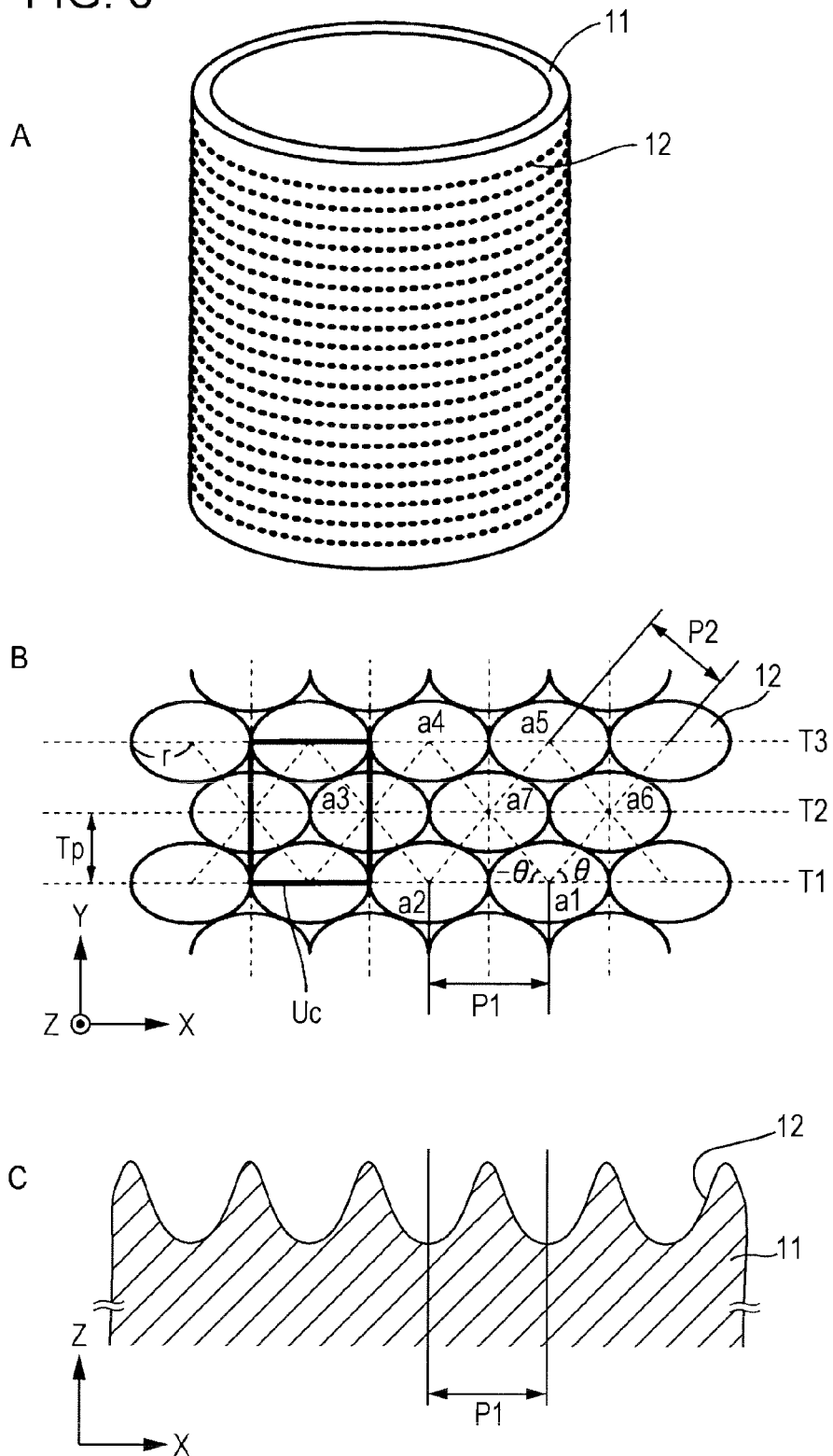
FIG. 6A is a perspective view showing one example of a configuration of a roll master.
FIG. 6B is a plan view showing in close-up a part of the roll master shown in FIG. 6A.
FIG. 6C is a cross-sectional view taken at the track T in FIG. 6B.

FIG. 6A is a perspective view showing one example of a configuration of a roll master. FIG. 6B is a plan view showing in close-up a part of the roll master shown in FIG. 6A. FIG. 6C is a cross-sectional view taken at the track T1, T3, . . . in FIG. 6B. A roll master 11 is a master for fabricating the transparent conductive element 1 having the above-described configuration, in particular, a master for forming a plurality of structures 4 on the substrate surface described above. The roll master 11 has, for example, a columnar or cylindrical shape and the columnar or cylindrical surface is used as a forming surface for forming a plurality of structures 4 on the substrate surface. A plurality of structures 12 are two-dimensionally arranged on the forming surface. The structures 12 have, for example, a concave shape relative to the forming surface. As the material for the roll master 11, glass can be used, for example, but the material is not particularly limited to this material.

The plurality of structures 12 arranged on the forming surface of the roll master 11 and the plurality of structures 4 arranged on the surface of the substrate 3 described above are in an inverted concave-convex relationship. In other words, the shape, arrangement, arrangement pitch, etc., of the structures 12 of the roll master 11 are the same as those of the structures 4 of the substrate 3.

[Configuration of Exposure Machine]

Figure 7:
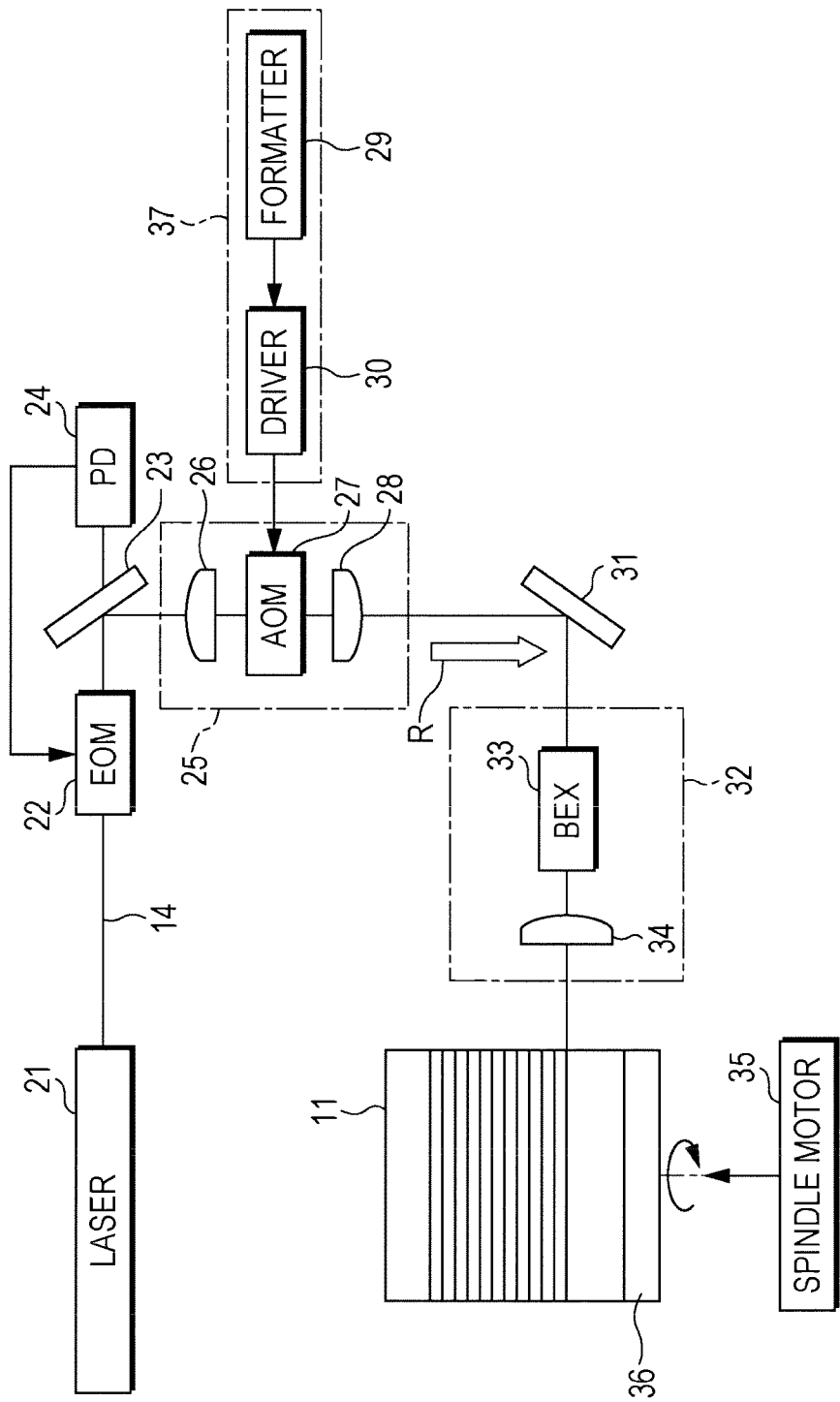
FIG. 7 is a schematic view showing one example of the configuration of a roll master exposure machine.

FIG. 7 is a schematic view showing one example of the configuration of the roll master exposure machine for fabricating a roll master. This roll master exposure machine is configured on the basis of an optical disk recording system.

A laser beam source 21 is a light source for exposing a resist deposited on a surface of the roll master 11 as a recording medium and oscillates a laser beam 14 for recording having a wavelength of λ=266 nm, for example. The laser beam 14 emitted from the laser beam source 21 travels straight as a parallel beam and enters an electro-optical element (electro optical modulator (EOM)) 22. The laser beam 14 that has passed through the electro-optical element 22 is reflected by a mirror 23 and guided to a modulation optical system 25.

The mirror 23 is constituted by a polarizing beam splitter and has a function of reflecting one polarized component and transmitting the other polarized component. The polarized component that has transmitted through the mirror 23 is received by a photodiode 24 and the phase modulation of the laser beam 14 is conducted by controlling the electro-optical element 22 on the basis of this received signal.

In the modulation optical system 25, the laser beam 14 is focused on an acoustic optical element (acousto-optic modulator (AOM)) 27 composed of glass ($SiO_2$) or the like by a focusing lens 26. The laser beam 14 is subjected to intensity modulation and diffused by the acoustic optical element 27, and then converted into a collimated beam with a lens 28. The laser beam 14 emitted from the modulation optical system 25 is reflected by a mirror 31 and guided to a travelling optical table 32 in a horizontal and parallel manner.

The travelling optical table 32 is equipped with a beam expander 33 and an object lens 34. The laser beam 14 guided to the travelling optical table 32 is shaped into a desired beam shape by the beam expander 33, and then applied to a resist layer on the roll master 11 through the object lens 34. The roll master 11 is placed on a turn table 36 coupled to a spindle motor 35. Then the roll master 11 is rotated and the laser beam 14 is intermittently applied while moving the laser beam 14 in the height direction of the roll master 11 to conduct an exposure step for the resist layer. A latent image formed thereby has a substantially elliptical shape having a long axis in the circumferential direction. The laser beam 14 is moved by moving the travelling optical table 32 in the arrow R direction.

The exposure machine is equipped with a controlling mechanism 37 for forming, in a resist layer, a latent image corresponding to the two-dimensional pattern of the hexagonal lattice or quasi-hexagonal lattice shown in FIG. 3B. The controlling mechanism 37 is equipped with a formatter 29 and a driver 30. The formatter 29 is equipped with a polarity reversing unit and the polarity reversing unit controls the timing of applying the laser beam 14 onto the resist layer. The driver 30 controls the acoustic optical element 27 on the basis of the output from the polarity reversing unit.

According to this roll master exposure machine, a signal is generated by synchronizing the polarity reversing formatter signal with the rotation controller for every track so that the two-dimensional pattern is spatially linked, and intensity modulation is conducted by the acoustic optical element 27. A hexagonal lattice or quasi-hexagonal lattice pattern can be recorded by patterning at a constant angular velocity (CAV), an adequate number of rotation, an adequate modulation frequency, and an adequate feed pitch.

[Method for Producing Transparent Conductive Element]

Next, a method for producing the transparent conductive element 1 according to the first embodiment of the present invention is described with reference to FIGS. 8A to 9D.

(Resist Forming Step)

First, as shown in FIG. 8A, a columnar or cylindrical roll master 11 is prepared. The roll master 11 is, for example, a glass master. Next, as shown in FIG. 8B, a resist layer 13 is formed on a surface of the roll master 11. As the material for the resist layer 13, for example, any of organic resist and inorganic resist may be used. As the organic resist, for example, a novolac-type resist or a chemically amplified resist can be used. Furthermore, as the inorganic resist, a metal compound that contains one type or two or more types can be used.

(Exposure Step)

Next, as shown in FIG. 8C, the laser beam (exposure beam) 14 is applied to the resist layer 13 formed on the surface of the roll master 11. In particular, the roll master 11 placed on the turn table 36 of the roll master exposure machine shown in FIG. 7 is rotated and, simultaneously, the laser beam (exposure beam) 14 is applied to the resist layer 13. At this time, while the laser beam 14 is moved in the height direction of the roll master 11 (direction parallel to the central axis of the columnar or cylindrical roll master 11), the laser beam 14 is intermittently applied to expose the entire surface of the resist layer 13. As a result, latent images 15 corresponding to the trajectory of the laser beam 14 are formed over the entire surface of the resist layer 13 at a pitch approximately the same as the visible light wavelength, for example.

The latent images 15 are, for example, arranged to form a plurality of rows of tracks on the roll master surface and form a hexagonal lattice pattern or a quasi-hexagonal lattice pattern. The latent images 15 have, for example, an elliptical shape having a long axis direction in the direction in which the tracks extend.

(Development Step)

Next, for example, while rotating the roll master 11, an developing solution is dropped onto the resist layer 13 to develop the resist layer 13. As a result, a plurality of openings are formed in the resist layer 13, as shown in FIG. 8D. When the resist layer 13 is formed of a positive-type resist, the exposed portion exposed with the laser beam 14 has an increased dissolving rate to a developing solution compared to a non-exposed portion; accordingly, as shown in FIG. 8D, a pattern corresponding to latent images (exposed portions) 16 is formed in the resist layer 13. The pattern of the openings is, for example, a particular lattice pattern such as a hexagonal lattice pattern or a quasi-hexagonal lattice pattern.

(Etching Step)

Next, the surface of the roll master 11 is etched using as a mask the pattern (resist pattern) of the resist layer 13 formed on the roll master 11. As a result, as shown in FIG. 9A, concave portions having an elliptical cone shape or a truncated elliptical cone shape having a long axis direction in the direction in which the tracks extend, i.e., the structures 12, can be obtained. As the etching, for example, dry etching or wet etching can be used. At this time, the pattern of the cone structures 12, for example, can be formed by alternately conducting an etching process and an ashing process.

Accordingly, an intended roll master 11 is obtained.

(Transfer Step)

Next, as shown in FIG. 9B, after the roll master 11 is brought into contact with a transfer material 16 applied on the substrate 3, an energy ray such as ultraviolet light is applied to the transfer material 16 from an energy ray source 17 to cure the transfer material 16, and the substrate 3 integrated with the cured transfer material 16 is separated. As a result, as shown in FIG. 9C, an optical layer 2 having a plurality of structures 4 on a substrate surface is fabricated.

The energy ray source 17 is not particularly limited and may be any source capable of emitting an energy ray such as an electron beam, an ultraviolet ray, an infrared ray, a laser beam, a visible light ray, an ionizing radiation (X ray, α ray, β ray, γ ray, etc.), a microwave, or a high frequency wave.

As the transfer material 16, an energy-ray-curable resin composition is preferably used. As the energy-ray-curable resin composition, an ultraviolet-ray-curable resin composition is preferably used. The energy-ray-curable resin composition may contain a filler, a functional additive, etc., according to the need.

The ultraviolet-ray-curable resin composition contains, for example, an acrylate and an initiator. The ultraviolet-ray-curable resin composition contains, for example, a monofunctional monomer, a difunctional monomer, a polyfunctional polymer, or the like, and, in particular, is one material or a mixture of a plurality of materials described below.

As the monofunctional monomer, for example, carboxylic acids (acrylic acids), hydroxys (2-hydroxyethyl acrylate, 2-hydroxypropyl acrylate, and 4-hydroxybutyl acrylate), alkyls, alicyclics (isobutyl acrylate, t-butyl acrylate, isooctyl acrylate, lauryl acrylate, stearyl acrylate, isobornyl acrylate, and cyclohexyl acrylate), other functional monomers (2-methoxyethyl acrylate, methoxyethylene glycol acrylate, 2-ethoxyethyl acrylate, tetrahydrofurfuryl acrylate, benzyl acrylate, ethylcarbitol acrylate, phenoxyethyl acrylate, N,N-dimethylaminoethyl acrylate, N,N-dimethylaminopropylacrylamide, N,N-dimethylacrylamide, acryloylmorpholine, N-isopropylacrylamide, N,N-diethylacrylamide, N-vinylpyrrolidone, 2-(perfluorooctyl)ethyl acrylate, 3-perfluorohexyl-2-hydroxypropyl acrylate, 3-perfluorooctyl-2-hydroxypropyl acrylate, 2-(perfluorodecyl)ethyl acrylate, 2-(perfluoro-3-methylbutyl)ethyl acrylate), 2,4,6-tribromophenol acrylate, 2,4,6-tribromophenol methacrylate, 2-(2, 4,6-tribromophenoxy)ethyl acrylate), 2-ethylhexyl acrylate, etc., can be named.

As the difunctional monomer, for example, tri(propylene glycol) diacrylate, trimethylolpropane diallyl ether, urethane acrylate, etc., can be named.

As the polyfunctional polymer, for example, trimethylolpropane triacrylate, dipentaerythritol penta- and hexaacrylate, ditrimethylolpropane tetraacrylate, etc., can be named.

As the initiator, for example, 2,2-dimethoxy-1,2-diphenylethan-1-one, 1-hydroxy-cyclohexyl phenyl ketone, 2-hydroxy-2-methyl-1-phenylpropan-1-one, etc., can be named.

As the filler, for example, any of inorganic fine particles and organic fine particles can be used. As the inorganic fine particles, for example, metal oxide fine particles of $SiO_2$, $TiO_2$, $ZrO_2$, $SnO_2$, $Al_2O_3$, etc., can be named.

As the functional additive, for example, a leveling agent, a surface control agent, a defoaming agent, etc., can be named. As the material for the substrate 3, for example, methyl methacrylate (co)polymers, polycarbonates, styrene (co)polymers, methyl methacrylate-styrene copolymers, cellulose diacetate, cellulose triacetate, cellulose acetate butyrate, polyesters, polyamides, polyimides, polyether sulfones, polysulfones, polypropylene, polymethylpentene, polyvinyl chloride, polyvinyl acetal, polyether ketone, polyurethane, glass, etc., can be named.

The method for forming the substrate 3 is not particularly limited and an injection-molded product, an extrusion-molded product, or a cast-molded product may be used. The substrate surface may be subjected to a surface treatment such as corona treatment depending on the need.

(Step of Forming a Transparent Conductive Layer)

Next, as shown in FIG. 9D, a transparent conductive layer 6 is formed on the wave surface Sw of the optical layer 2 in which a plurality of structures 4 are formed. In forming the transparent conductive layer 6, the layer may be formed by heating the optical layer 2. As the method for forming the transparent conductive layer 6, for example, in addition to a chemical vapor deposition (CVD, technique of precipitating a thin film from a gas phase by utilizing a chemical reaction) method such as thermal CVD, plasma-induced CVD, photo-induced CVD, or the like, a physical vapor deposition (PVD, technique of forming a thin film by causing a physically gasified material to condense on a substrate in vacuum) method such as a vacuum deposition, a plasma-assisted vapor deposition, sputtering, ion plating, or the like can be employed. Next, according to need, the transparent conductive layer 6 is subjected to an anneal treatment. As a result, the transparent conductive layer 6 enters a mixed state of amorphous and polycrystal, for example.

(Step of Patterning the Transparent Conductive Layer)

Next, for example, a transparent conductive layer 6 having a particular pattern is formed by patterning the transparent conductive layer 6 by, for example, photo etching.

As described above, the desired transparent conductive element 1 is obtained.

2. Second Embodiment

Configuration of Transparent Conductive Element

Figure 10:
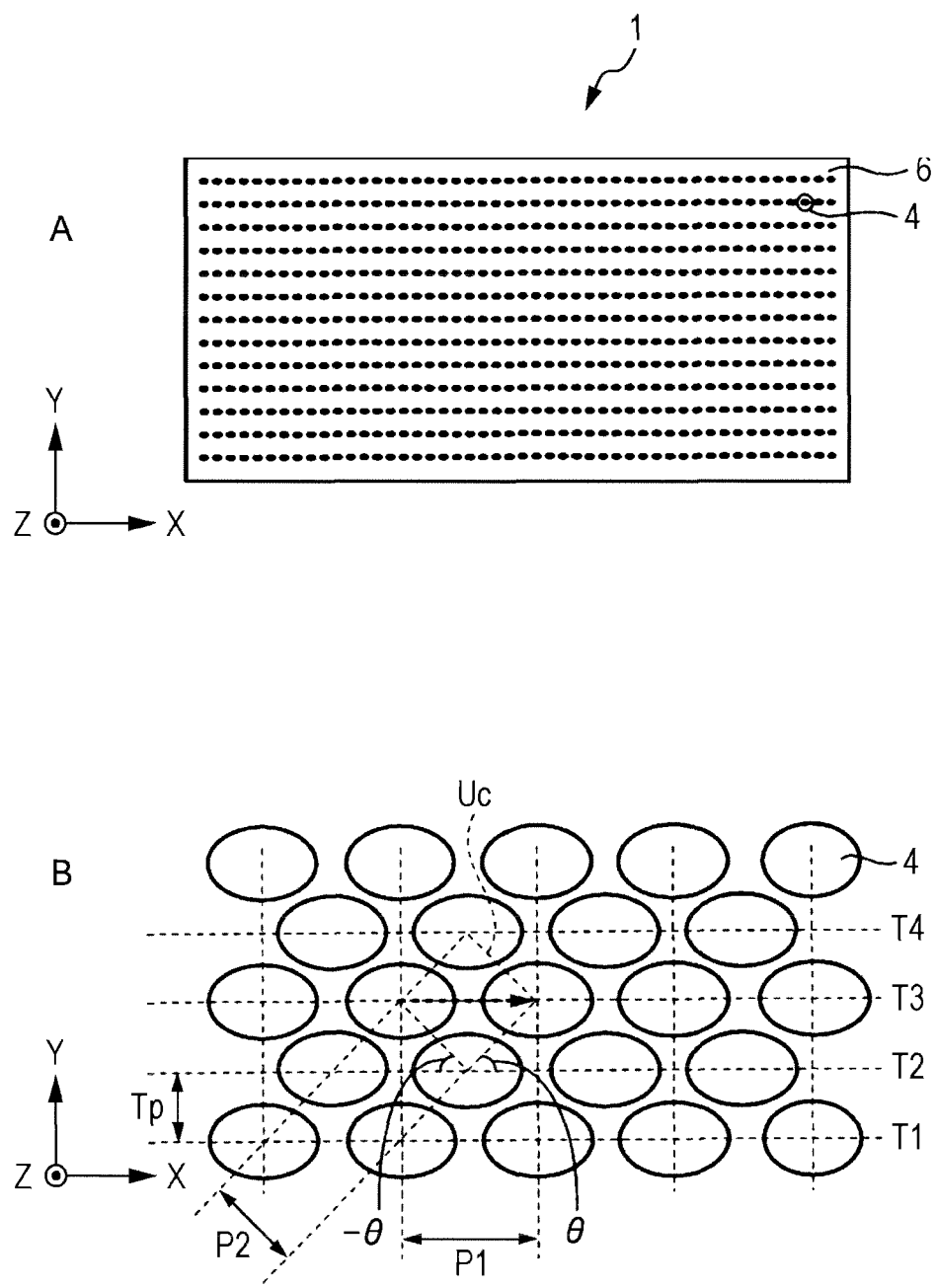
FIG. 10A is a plan view showing one example of an optical layer surface of a transparent conductive element according to a second embodiment of the present invention.
FIG. 10B is a plan view showing in close-up a part of the optical layer surface shown in FIG. 10A.

FIG. 10A is a plan view showing one example of an optical layer surface of a transparent conductive element according to a second embodiment of the present invention. FIG. 10B is a plan view showing in close-up a part of the optical layer surface shown in FIG. 10A. A transparent conductive element 1 according to the second embodiment is different from that of the first embodiment in that a plurality of structures 4 form a rectangular lattice pattern or a quasi-rectangular lattice pattern between adjacent three rows of tracks T.

Here, a rectangular lattice refers to a square lattice. A quasi-rectangular lattice refers to a deformed square lattice different from the square lattice. For example, when the structures 4 are linearly arranged, a quasi-rectangular lattice refers to a rectangular lattice deformed by stretching a square lattice in the direction of linear arrangement (track direction). When the structures 4 are arranged in a meandering manner, a quasi-rectangular lattice refers to a rectangular lattice formed by deforming a square lattice by the meandering arrangement of the structures 4. Alternatively, it refers to a rectangular lattice formed by deforming a square lattice in a linear arrangement direction (track direction) and by the meandering arrangement of the structures 4.

The arrangement pitch P1 of the structures 4 in the same track is preferably longer than the arrangement pitch P2 of the structures 4 between the two adjacent tracks. Furthermore, when the arrangement pitch of the structures 4 in the same track is P1 and the arrangement pitch of the structures 4 between the two adjacent tracks is P2, P1/P2 preferably satisfies the relationship $1.4 < P1/P2 \leq 1.5$. Within such a numerical range, the packing ratio of the structures 4 having an elliptical cone shape or a truncated elliptical cone shape can be improved, and thus the optical adjustment function can be improved. Furthermore, the height or depth of the structures 4 in a 45° direction or an approximately 45° direction with respect to the track is preferably smaller than the height or depth of the structures 4 in the direction in which the track extends.

The height H2 in the arrangement direction (θ direction) of the structures 4 oblique with respect to the direction in which the track extends is preferably smaller than the height H1 of the structures 4 in the direction in which the track extends. In other words, the heights H1 and H2 of the structures 4 preferably satisfy the relationship H1>H2.

When the structures 4 form a rectangular or quasi-rectangular pattern, the ellipticity e of the structure bottom is preferably $150\% \leq e \leq 180\%$. This is because, in this range, the packing ratio of the structures 4 can be improved and good optical adjustment function can be obtained.

The ratio $R_s$ ($(S2/S1) \times 100$) of the area S2 of the flat portion to the area S1 of the wave surface Sw is preferably in the range of 0% or more and 50% or less, more preferably 0% or more and 45% or less, and yet more preferably 0% or more and 30% or less. The optical adjustment function can be improved when the ratio $R_s$ is 50% or less.

Here, the ratio $R_s$ ($(S2/S1) \times 100$) of the area S2 of the flat portion to the area S1 of the wave surface Sw is the value determined as follows.

First, the surface of the transparent conductive element 1 is photographed in top-view with a scanning electron microscope (SEM). Next, a unit lattice Uc is arbitrarily selected from the SEM photograph taken and the arrangement pitch P1 and the track pitch Tp of the unit lattice Uc are measured (refer to FIG. 10B). Furthermore, the area S(structure) of the bottom of one of four structures 4 included in the unit lattice Uc is measured by image processing. Next, the measured arrangement pitch P1, track pitch Tp, and area S(structure) of the bottom are used to determine the ratio R from the following equation.

Ratio $R=[(S(\text{lattice})-S(\text{structure}))/S(\text{lattice})]\times 100$

Unit lattice area: $S(\text{lattice})=2\times((P1\times Tp)\times(\frac{1}{2}))=P1\times Tp$ Area of the bottom of the structure existing in the unit lattice: $S(\text{structure})=S$ The calculation process of the ratio R described above is conducted on unit lattices Uc at 10 positions arbitrarily selected from the SEM photograph taken. Then, the measurement values are simply averaged (arithmetic mean) to determine the average ratio of the ratio R and this is assumed to be the ratio $R_s$.

The ratio (($2r/P1)\times 100$) of the radius 2r to the arrangement pitch P1 is 64% or more, preferably 69% or more, and more preferably 73% or more. This is because, within such a range, the packing ratio of the structures 4 can be improved and the optical adjustment function can be improved. Here, the arrangement pitch P1 is the arrangement pitch of the structures 4 in the track direction and the radius 2r is the radius of the structure bottom in the track direction. Note that when the structure bottom is circular, the radius 2r is the diameter and when the structure bottom is elliptical, the radius 2r is the major axis.

According to the second embodiment, the same effects as the first embodiment can be obtained.

3. Third Embodiment

Figure 11:
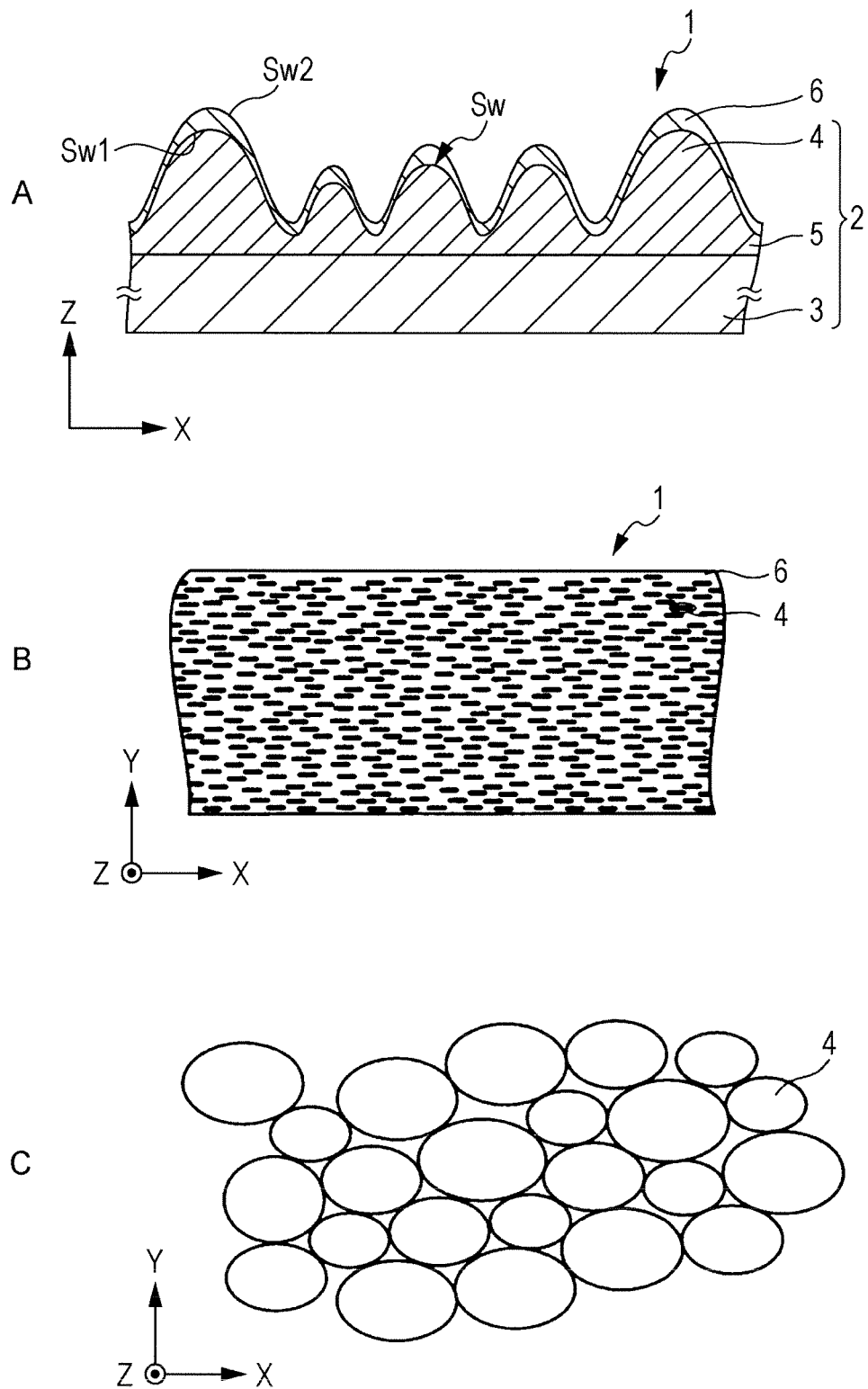
FIG. 11A is a cross-sectional view showing one example of a configuration of a transparent conductive element according to a third embodiment of the present invention.
FIG. 11B is a plan view showing one example of an optical layer surface of the transparent conductive element according to the third embodiment of the present invention.
FIG. 11C is a plan view showing in close-up a part of the optical layer surface shown in FIG. 11B.

FIG. 11A is a cross-sectional view showing one example of a configuration of a transparent conductive element according to a third embodiment of the present invention. FIG. 11B is a plan view showing one example of an optical layer surface of the transparent conductive element according to the third embodiment of the present invention. FIG. 11C is a plan view showing in close-up a part of the optical layer surface shown in FIG. 11B.

A transparent conductive element 1 according to the third embodiment differs from the first embodiment in that a plurality of structures 4 are arranged two-dimensionally at random (irregular). Furthermore, at least one of the shape, size, and height of the structures 21 may be changed further at random.

The third embodiment is identical to the first embodiment except for the matter described above.

For the master for fabricating this transparent conductive element 1, a method of anodizing a surface of an aluminum substrate can be used, for example, but the method is not limited to this.

Since the plurality of structures 4 are arranged two dimensionally at random in the third embodiment, occurrence of non-uniformity in appearance can be suppressed.

4. Fourth Embodiment

Figure 12:
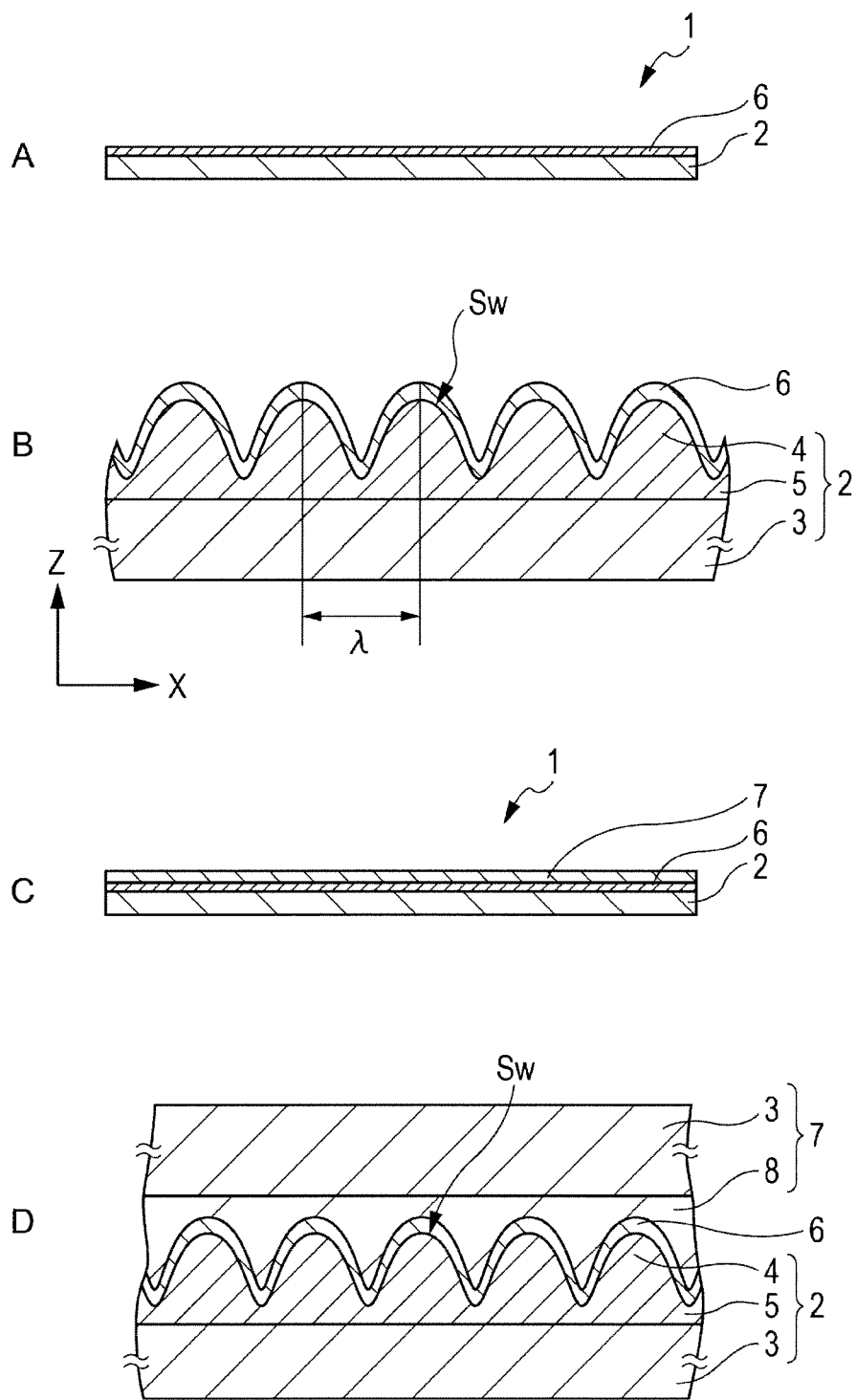
FIG. 12A is a cross-sectional view showing one example of a configuration of a transparent conductive element according to a fourth embodiment of the present invention.
FIG. 12B is an enlarged cross-sectional view showing in close-up a part of the transparent conductive element shown in FIG. 12A.
FIG. 12C is a cross-sectional view showing another example of a configuration of a transparent conductive element according to the fourth embodiment.
FIG. 12D is an enlarged cross-sectional view showing in close-up a part of the transparent conductive element shown in FIG. 12C.

FIG. 12A is a cross-sectional view showing one example of a configuration of a transparent conductive element according to a fourth embodiment of the present invention. FIG. 12B is an enlarged cross-sectional view showing in close-up a part of the transparent conductive element shown in FIG. 12A. FIG. 12C is a cross-sectional view showing another example of a configuration of a transparent conductive element according to the fourth embodiment. FIG. 12D is an enlarged cross-sectional view showing in close-up a part of the transparent conductive element shown in FIG. 12C.

As shown in FIGS. 12A and 12B, a transparent conductive element 1 according to the fourth embodiment differs from the first embodiment in that a transparent conductive layer 6 is continuously formed substantially over the entire wave surface Sw of an optical layer (first optical layer) 2.

Alternatively, as shown in FIGS. 12C and 12D, an optical layer (second optical layer) 7 formed on the transparent conductive layer 6 may be further provided as needed so that both main surfaces of the transparent conductive layer 6 are respectively covered with the optical layer 2 and the optical layer 7. Note that the orientation of the concavities and convexes of the structures 4 may be reversed.

The fourth embodiment is identical to the first embodiment except for the matter described above.

5. Fifth Embodiment

FIG. 13A is a cross-sectional view for explaining one example of a configuration of an information input device according to a fifth embodiment of the present invention. As shown in FIG. 13A, an information input device 101 is provided on a display surface of a display device 102. The information input device 101 is bonded onto the display surface of the display device 102 with a bonding layer 111, for example. The display device 102 to which the information input device 101 is applied is not particularly limited but examples thereof include various display devices such as liquid crystal displays, cathode ray tube (CRT) displays, plasma display panels (PDP), electroluminescence (EL) displays, and surface-conduction electron-emitter displays (SED).

The information input device 101 is what is known as a projection-type capacitive touch panel and includes a first transparent conductive element $1_1$, a second transparent conductive element $1_2$ formed on the first transparent conductive element $1_1$, and an optical layer 7 formed on the second transparent conductive element $1_2$. The first transparent conductive element $1_1$ and the second transparent conductive element $1_2$ are bonded to each other through a bonding layer 112 so that a transparent-conductive-layer-$6_1$-side surface of the first transparent conductive element $1_1$ faces a substrate-3-side surface of the second transparent conductive element $1_2$. The optical layer 7 is formed by bonding a substrate 3 to a transparent-conductive-layer-8-side surface of the second transparent conductive element $1_2$ through a bonding layer 8.

FIG. 13B is an enlarged cross-sectional view showing in close-up a region A1 and a region $A_2$ shown in FIG. 13A. FIG. 14A is an enlarged cross-sectional view showing in further close-up the region $A_1$ shown in FIG. 13A. FIG. 14B is an enlarged cross-sectional view showing in further close-up the region $A_2$ shown in FIG. 13A.

As shown in FIG. 13B, a transparent conductive layer $6_1$ of the first transparent conductive element $1_1$ and a transparent conductive layer $6_2$ of the second transparent conductive element $1_2$ are preferably provided so as not to overlap in the thickness direction of the information input device 101. In other words, preferably, the first region $R_1$ of the first transparent conductive element $1_1$ overlaps the second region $R_2$ of the second transparent conductive element $1_2$ in the thickness direction of the information input device 101, and the second region $R_2$ of the second transparent conductive element $1_1$ overlaps the first region $R_1$ of the second transparent conductive element $1_2$ in the thickness direction of the information input device 101. In this manner, the difference in transmittance caused by overlap of the first transparent conductive element $1_1$ and the second transparent conductive element $1_2$ can be reduced. Note that in FIGS. 13A and 13B, a case in which the first transparent conductive element $1_1$ and the second transparent conductive element $1_2$ are oriented such that the transparent conductive layer $6_1$ of the first transparent conductive element $1_1$ and the transparent conductive layer $6_2$ of the second transparent conductive element $1_2$ come at the input surface side is illustrated as an example; however, the orientation of the first transparent conductive element $1_1$ and the second transparent conductive element $1_2$ is not particularly limited and can be adequately set according to the design of the information input device 101.

As shown in FIG. 14A, in the region $A_1$, preferably, whereas the transparent conductive layer $6_1$ is not formed on the wave surface Sw of the first transparent conductive element $1_1$, the transparent conductive layer $6_2$ is formed on the wave surface Sw of the second transparent conductive element $1_2$. Furthermore, as shown in FIG. 14B, in the region $A_2$, preferably, whereas the transparent conductive layer $6_1$ is formed on the wave surface Sw of the first transparent conductive element $1_1$, the transparent conductive layer $6_2$ is not formed on the wave surface Sw of the second transparent conductive element $1_2$.

As the first transparent conductive element $1_1$ and the second transparent conductive element $1_2$, one type of the transparent conductive elements 1 of the first to third embodiment can be used. In other words, an optical layer $2_1$, a substrate $3_1$, structures $4_1$, a base layer $5_1$, and the transparent conductive layer $6_1$ of the first transparent conductive element $1_1$ are respectively identical to the optical layer 2, the substrate 3, the structures 4, the base layer 5, and the transparent conductive layer 6 of one type of the first to third embodiments. Moreover, an optical layer $2_2$, a substrate $3_2$, structures $4_2$, a base layer $5_2$, and the transparent conductive layer $6_2$ of the second transparent conductive element $1_2$ are respectively identical to the optical layer 2, the substrate 3, the structures 4, the base layer 5, and the transparent conductive layer 6 of one type of the first to third embodiments.

FIG. 15A is an exploded perspective view for explaining one example of a configuration of an information input device according to the fifth embodiment of the present invention. This information input device 101 is an ITO-grid projection-type capacitive touch panel. A transparent conductive layer $6_1$ of a first transparent conductive element $1_1$ is, for example, an X electrode (first electrode) having a particular pattern. A transparent conductive layer $6_2$ of a second transparent conductive element $1_2$ is, for example, a Y electrode (second electrode) having a particular pattern. The X electrode and the Y electrode are, for example, are in a relationship such that they intersect each other orthogonally.

FIG. 15B is an exploded perspective view for explaining one example of a configuration of a first transparent conductive element provided in an information input device according to the fifth embodiment of the present invention. Note that because the second transparent conductive element $1_2$ is identical to the first transparent conductive element $1_1$ except for the direction of forming the Y electrode constituted by the transparent conductive layer $6_2$, the illustration thereof is omitted in the exploded perspective view.

A plurality of X electrodes constituted by transparent conductive layers $6_1$ are arranged in a region $R_1$ of a wave surface Sw of an optical layer $2_1$. A plurality of Y electrodes constituted by transparent conductive layers $6_1$ are arranged in a region $R_2$ of a wave surface Sw of an optical layer $2_2$. The X electrodes extending in the X axis direction are constituted by unit shape bodies $C_1$ repeatedly linked in the X axis direction. The Y electrodes extending in the Y axis direction are constituted by unit shape bodies $C_2$ repeatedly linked in the Y axis direction. As the shape of the unit shape bodies $C_1$ and the unit shape bodies $C_2$, for example, a rhombic shape (diamond shape), a triangular shape, a rectangular shape, etc., can be named but the shape is not limited to these shapes.

In the state in which the first transparent conductive element $1_1$ and the second transparent conductive element $1_2$ overlap each other, the first region $R_1$ of the first transparent conductive element $1_1$ and the second region $R_2$ of the second transparent conductive element $1_2$ overlap each other and the second region $R_2$ of the first transparent conductive element $1_1$ and the first region $R_1$ of the second transparent conductive element $1_2$ overlap each other. Accordingly, when the information input device 101 is viewed from the input surface side, the unit shape bodies $C_1$ and the unit shape bodies $C_2$ do not overlap each other and appear to fill one main surface in a closely packed state.

6. Sixth Embodiment

FIG. 16A is a cross-sectional view for explaining one example of a configuration of an information input device according to a sixth embodiment of the present invention. FIG. 16B is an enlarged cross-sectional view showing in close-up a part of the information input device shown in FIG. 16A.

An information input device 101 is what is known as a surface-type capacitive touch panel and includes a transparent conductive element 1. As the transparent conductive element 1, the transparent conductive element 1 according to the fourth embodiment is used and an optical layer (second optical layer) 7 is provided on a transparent conductive layer 6.

The sixth embodiment is identical to the fifth embodiment except for the matter described above.

7. Seventh Embodiment

Figure 17:
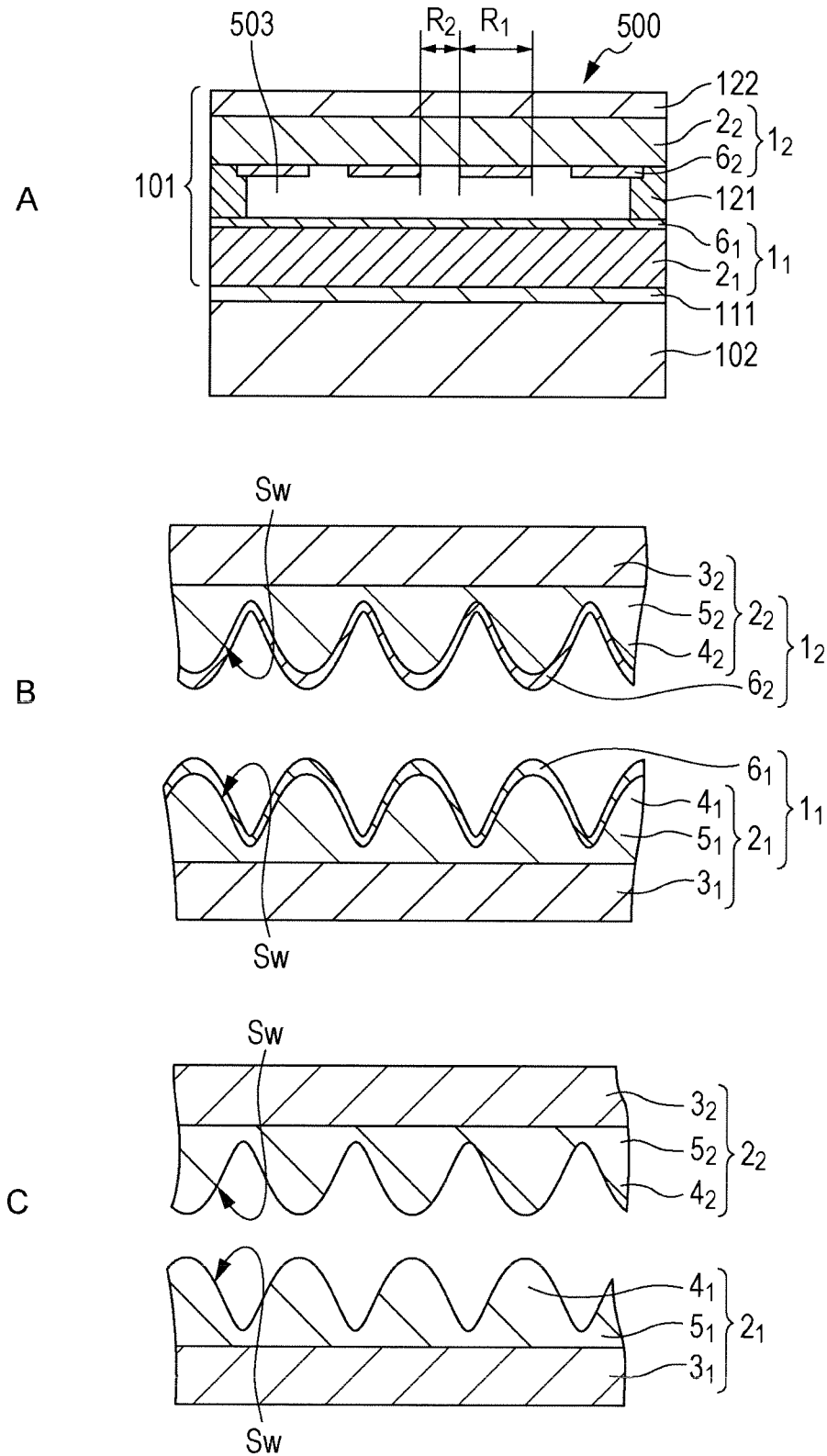
FIG. 17A is a cross-sectional view for explaining one example of a configuration of an information input device according to a seventh embodiment of the present invention.
FIG. 17B is a cross-sectional view showing in a close-up a region that opposes a wave surface on which a transparent conductive layer is formed.
FIG. 17C is a cross-sectional view showing in a close-up a region that opposes an exposed wave surface with no transparent conductive layer formed thereon.

FIG. 17A is a cross-sectional view for explaining one example of a configuration of an information input device according to a seventh embodiment of the present invention. FIG. 17B is a cross-sectional view showing in a close-up a region that opposes a wave surface on which a transparent conductive layer is formed. FIG. 17C is a cross-sectional view showing in a close-up a region that opposes an exposed wave surface with no transparent conductive layer formed thereon.

As shown in FIG. 17A, the information input device 101 is what is known as a matrix opposing film-type touch panel and includes a first transparent conductive element $1_1$, a second transparent conductive element $1_2$, and a bonding 121. The first transparent conductive element 1 and the second transparent conductive element $1_2$ are arranged to oppose each other with a particular distance therebetween so that their transparent conductive layer $6_1$ and transparent conductive layer $6_2$ oppose each other. The bonding layer 121 is disposed between peripheral portions of the first transparent conductive element $1_1$ and the second transparent conductive element $1_2$ so that the peripheral portions of the opposing surfaces of the first transparent conductive element $1_1$ and the second transparent conductive element $1_2$ are bonded to each other with the bonding layer 121. As the bonding layer 121, for example, an adhesive paste, an adhesive tape, or the like is used.

Of the two main surfaces of the information input device 101, the second-transparent-conductive-element-$1_2$-side main surface serves as a touch screen (information input surface) from which information is input. A hard coat layer 122 is preferably further provided on this touch screen. This is because friction resistance of the touch screen of a touch panel 50 can be improved.

As shown in FIGS. 17B and 17C, the wave surfaces Sw of the first transparent conductive element $1_1$ and the second transparent conductive element $1_2$ are arranged to oppose each other with a particular distance therebetween. In the information input device 101, which is a matrix opposing film-type touch panel, a transparent conductive layer $6_1$ and a transparent conductive layer $6_2$ each having a particular pattern are formed on the wave surfaces Sw of the first transparent conductive element $1_1$ and the second transparent conductive element $1_2$, respectively. As a result, in the information input device 101, there exists a region (FIG. 17B) in which the wave surface Sw on which the transparent conductive layer $6_1$ is formed opposes the wave surface Sw on which the transparent conductive layer $6_2$ is formed, a region (FIG. 17C) in which the exposed wave surface Sw with no transparent conductive layer $6_1$ formed thereon opposes the exposed wave surface Sw with no transparent conductive layer $6_2$ formed thereon, and a region (not shown in the drawings) in which a wave surface Sw on which the transparent conductive layer $6_1$ or the transparent conductive layer $6_2$ is formed opposes an exposed wave surface Sw on which no transparent conductive layer $6_1$ or transparent conductive layer $6_2$ is formed.

FIG. 18A is an exploded perspective view for explaining an example of a configuration of an information input device according to the seventh embodiment of the present invention. FIG. 18B is an exploded perspective view for explaining one example of a configuration of a transparent conductive element included in the information input device according to the seventh embodiment of the present invention. A transparent conductive layer $6_1$ of the first transparent conductive element $1_1$ is, for example, an X electrode (first electrode) having a stripe shape. A transparent conductive layer $6_1$ of a second transparent conductive element $1_2$ is, for example, a Y electrode (second electrode) having a stripe shape. The first transparent conductive element $1_1$ and the second transparent conductive element $1_2$ are arranged to oppose each other so that these X electrode and Y electrode oppose each other and intersect each other orthogonally.

The seventh embodiment is identical to the fifth embodiment except for the above-described matter.

8. Eighth Embodiment

Figure 19:
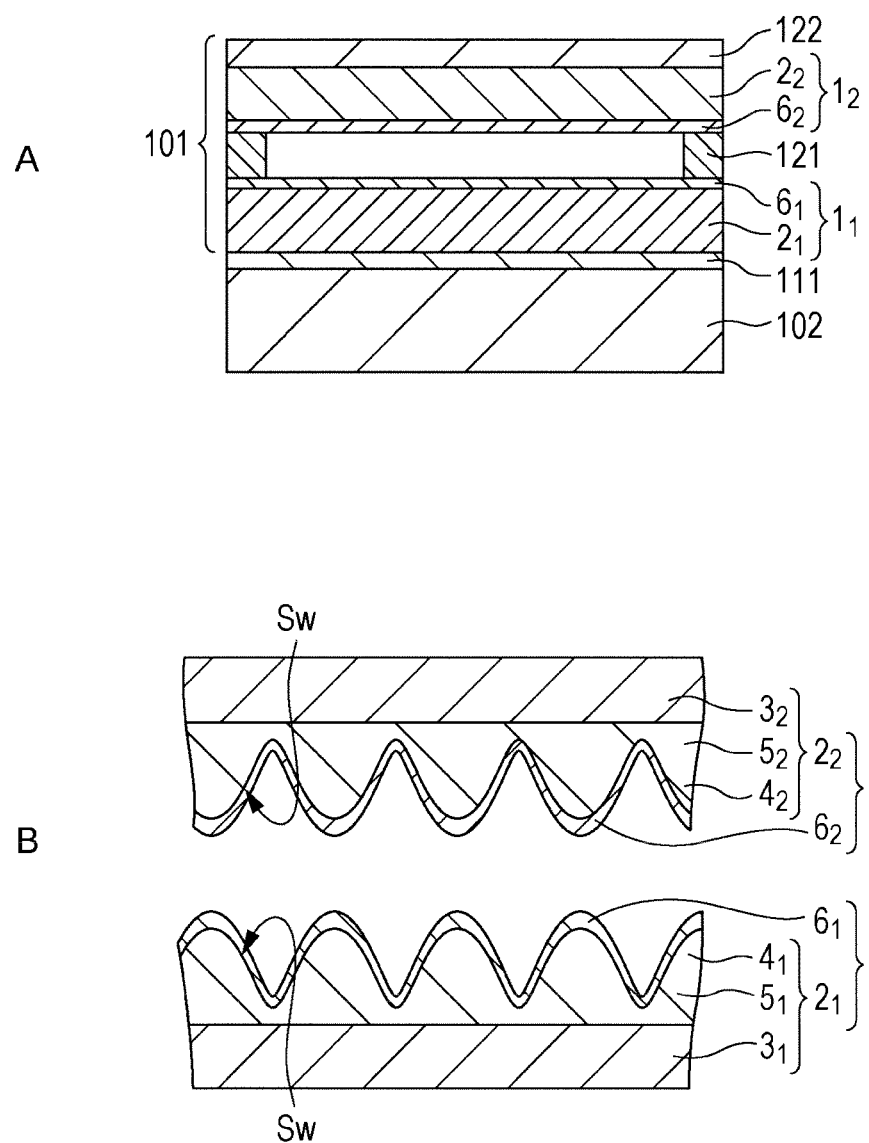
FIG. 19A is a cross-sectional view for explaining one example of a configuration of an information input device according to an eighth embodiment of the present invention.
FIG. 19B is an enlarged cross-sectional view showing in close-up a part of the information input device shown in FIG. 19A.

FIG. 19A is a cross-sectional view for explaining one example of a configuration of an information input device according to an eighth embodiment of the present invention. FIG. 19B is an enlarged cross-sectional view showing in close-up a part of the information input device shown in FIG. 19A.

As shown in FIG. 19A, an information input device 101 according to the eighth embodiment differs from the information input device 101 of the seventh embodiment in that the transparent conductive elements 1 according to the fourth embodiment is used as the first transparent conductive element $1_1$ and the second transparent conductive element $1_2$.

As shown in FIG. 19B, the wave surfaces Sw of the first transparent conductive element $1_1$ and the second transparent conductive element $1_2$ are arranged to oppose each other and a transparent conductive layer $6_1$ and a transparent conductive layer $6_2$ are respectively formed on the wave surfaces arranged to oppose each other.

The eighth embodiment is identical to the seventh embodiment except for the matter described above.

9. Ninth Embodiment

Figure 20:
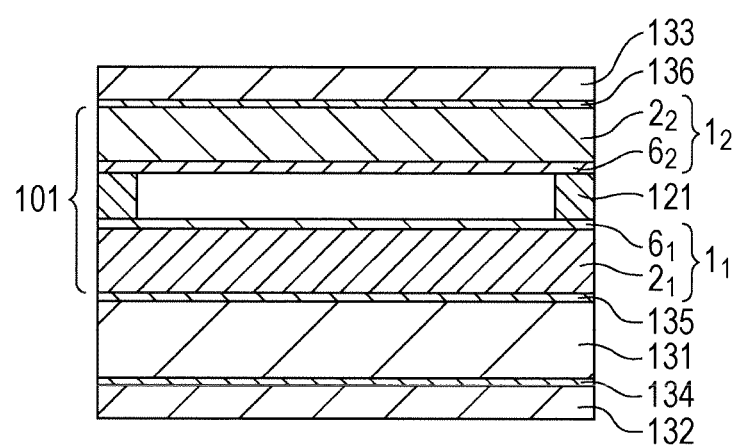
FIG. 20 is a cross-sectional view for explaining an example of a configuration of a liquid crystal display device according to a ninth embodiment of the present invention.

FIG. 20 is a cross-sectional view for explaining an example of a configuration of a liquid crystal display device according to a ninth embodiment of the present invention. As shown in FIG. 20, the liquid crystal display device according to the ninth embodiment includes a liquid crystal panel (liquid crystal layer) 131 having a first main surface and a second main surface, a first polarizer 132 formed on the first main surface, a second polarizer 133 formed on the second main surface, and an information input device 101 disposed between the liquid crystal panel 131 and the second polarizer 133. The information input device 101 is a liquid crystal display-integrated touch panel (a.k.a., inner touch panel). An optical layer $2_2$ may be omitted and a plurality of structures 4 may be directly formed on the surface of the second polarizer 133. When the second polarizer 133 has a protective layer, such as a triacetyl cellulose (TAC), in the surface, a plurality of structures 4 are preferably directly formed on the protective layer. When a plurality of structures 4 are formed on the second polarizer 133 and the transparent conductive layer $6_2$ is formed on these structures 4, the thickness of the liquid crystal display device can be further reduced.

(Liquid Crystal Panel)

As the liquid crystal panel 131, for example, that having a display mode such as a twisted nematic (TN) mode, a super twisted nematic (STN) mode, a vertically aligned (VA) mode, an in-plane switching (IPS) mode, an optically compensated birefringence (OCB) mode, a ferroelectric liquid crystal (FLC) mode, a polymer dispersed liquid crystal (PDLC) mode, a phase change guest host (PCGH) mode, or the like, can be used.

(Polarizer)

The first polarizer 132 and the second polarizer 133 are respectively bonded to the first main surface and the second main surface of the liquid crystal panel 131 through a bonding layer 134 and a bonding layer 136 so that the transmission axes thereof intersect each other orthogonally. The first polarizer 132 and the second polarizer 133 allow one of the orthogonally intersecting polarized components among the incident light to pass through while blocking the other by absorption. As the first polarizer 132 and the second polarizer 133, for example, a polyvinyl alcohol (PVA)-based film in which an iodine complex or a dichromatic dye is oriented in an uniaxial direction can be used. Protective layers such as triacetyl cellulose (TAC) films are preferably provided on both sides of the first polarizer 132 and the second polarizer 133.

(Touch Panel)

Any of the fifth to eighth embodiments can be used as the information input device 101.

In the ninth embodiment, since the second polarizer 133 is shared by a liquid crystal panel 135 and the information input device 101, the optical characteristics can be improved.

10. Tenth Embodiment

Figure 21:
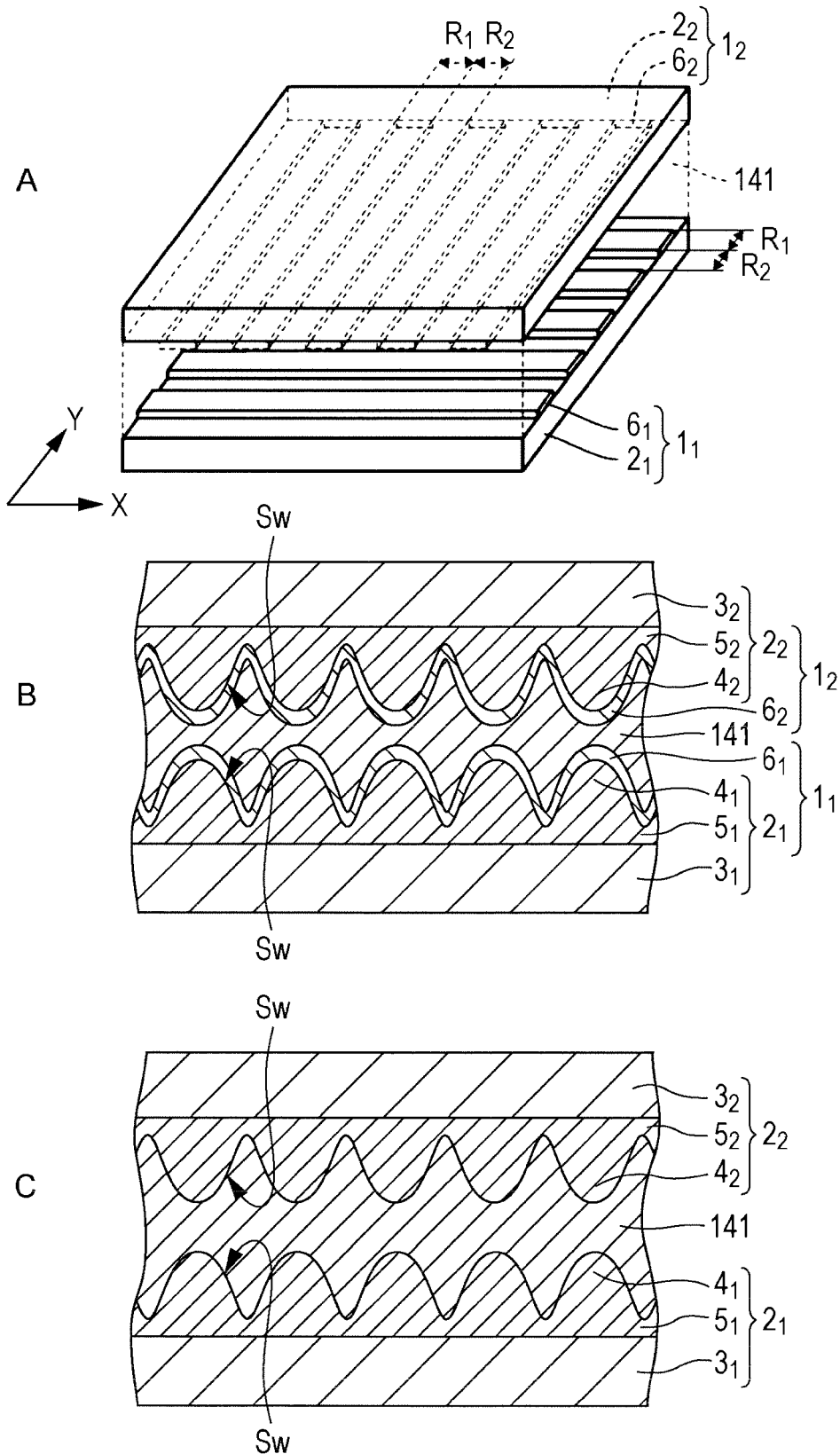
FIG. 21A is a perspective view for explaining one example of a configuration of an information display device according to a tenth embodiment of the present invention.
FIG. 21B is a cross-sectional view showing in close-up a region in which wave surfaces on which transparent conductive layers are formed oppose each other.
FIG. 21C is a cross-sectional view showing in close-up a region where exposed wave surfaces with no transparent conductive layers oppose each other.

FIG. 21A is a perspective view for explaining one example of a configuration of an information display device according to a tenth embodiment of the present invention. FIG. 21B is a cross-sectional view showing in close-up a region in which wave surfaces on which transparent conductive layers are formed oppose each other. FIG. 21C is a cross-sectional view showing in close-up a region where exposed wave surfaces with no transparent conductive layers oppose each other.

As shown in FIG. 21A, this information display device is a liquid crystal display device of a passive matrix drive type (also referred to as a simple matrix drive type) and includes a first transparent conductive element $1_1$, a second transparent conductive element $1_2$, and a liquid crystal layer 141. The first transparent conductive element $1_1$ and the second transparent conductive element $1_2$ are arranged to oppose each other with a particular distance therebetween so that their transparent conductive layer $6_1$ and the transparent conductive layer $6_2$ oppose each other. The liquid crystal layer 141 is provided between the first transparent conductive element $1_1$ and the second transparent conductive element $1_2$ that are arranged to be separate from each other by a particular distance. As the first transparent conductive element $1_1$ and the second transparent conductive element $1_2$, one type selected from among the transparent conductive elements 1 of the first to third embodiments can be used. In other words, an optical layer $2_1$, a substrate $3_1$, structures $4_1$, a base layer $5_1$, and the transparent conductive layer $6_1$ of the first transparent conductive element $1_1$ are respectively identical to the optical layer 2, the substrate 3, the structures 4, the base layer 5, and the transparent conductive layer 6 of one type of the first to third embodiments. Moreover, an optical layer $2_2$, a substrate $3_2$, structures $4_2$, a base layer $5_2$, and the transparent conductive layer $6_2$ of the second transparent conductive element $1_2$ are respectively identical to the optical layer 2, the substrate 3, the structures 4, the base layer 5, and the transparent conductive layer 6 of one type of the first to third embodiments. Here, an example in which the present invention is applied to a passive matrix drive-type liquid crystal display device is described; however, the information display device is not limited to this example and the present invention is applicable as long as the information display device has a particular electrode pattern such as the passive matrix drive type. For example, EL display devices of a passive matrix drive type can also be applied.

As shown in FIGS. 21B and 21C, the wave surfaces Sw of the first transparent conductive element $1_1$ and the second transparent conductive element $1_2$ are arranged to oppose each other with a particular distance therebetween. In a passive matrix drive-type liquid crystal display device, a transparent conductive layer $6_1$ and a transparent conductive layer $6_2$ having a particular pattern are respectively formed on wave surfaces Sw of the first transparent conductive element $1_1$ and the second transparent conductive element $1_2$. As a result, there exists a region (FIG. 21B) in which the wave surface Sw on which the transparent conductive layer $6_1$ is formed opposes the wave surface Sw on which the transparent conductive layer $6_2$ is formed, a region (FIG. 21C) in which the exposed wave surface Sw with no transparent conductive layer $6_1$ formed thereon opposes the exposed wave surface Sw with no transparent conductive layer $6_2$ formed thereon, and a region (not shown in the drawings) in which a wave surface Sw on which the transparent conductive layer $6_1$ or the transparent conductive layer $6_2$ is formed opposes an exposed wave surface Sw on which no transparent conductive layer $6_1$ or transparent conductive layer $6_2$ is formed.

The transparent conductive layer $6_1$ of the first transparent conductive element $1_1$ is, for example, an X electrode (first electrode) having a stripe shape. The transparent conductive layer $6_2$ of the second transparent conductive element $1_2$ is, for example, a Y electrode (second electrode) having a stripe shape. The first transparent conductive element $1_1$ and the second transparent conductive element $1_2$ are arranged to oppose each other so that these X electrode and Y electrode oppose each other and intersect each other orthogonally.

11. Eleventh Embodiment

Figure 22:
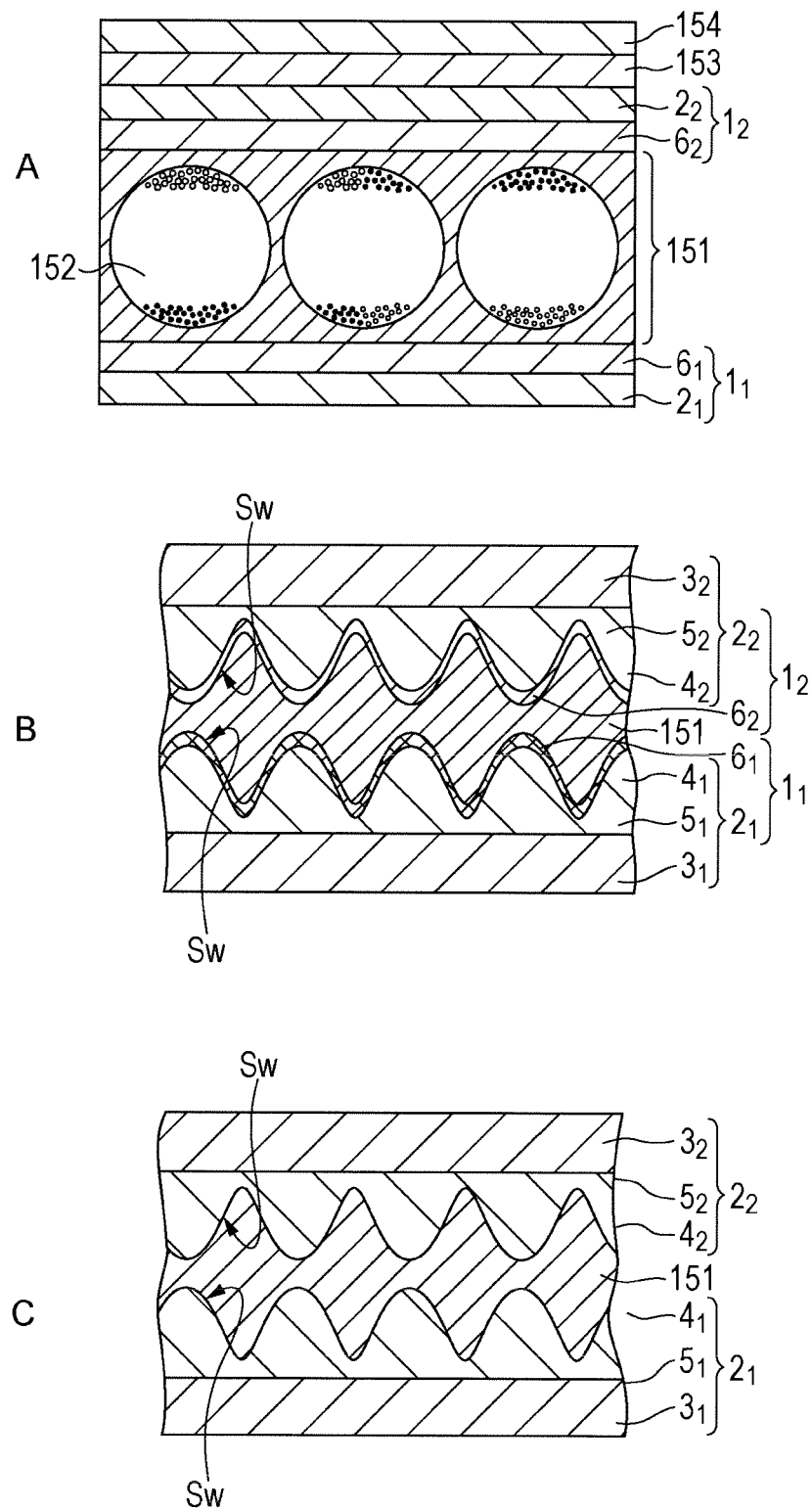
FIG. 22A is a cross-sectional view for explaining one example of a configuration of an information input device according to an eleventh embodiment of the present invention.
FIG. 22B is a cross-sectional view showing in close-up a region in which wave surfaces on which transparent conductive layers are formed oppose each other.
FIG. 22C is a cross-sectional view showing in close-up a region in which exposed wave surfaces with no transparent conductive layers formed thereon oppose each other.

FIG. 22A is a cross-sectional view for explaining one example of a configuration of an information input device according to an eleventh embodiment of the present invention. FIG. 22B is a cross-sectional view showing in close-up a region in which wave surfaces on which transparent conductive layers are formed oppose each other. FIG. 22C is a cross-sectional view showing in close-up a region in which exposed wave surfaces with no transparent conductive layers formed thereon oppose each other.

As shown in FIG. 22A, this information display device is what is known as an electronic paper of a microcapsule electrophoresis type and includes a first transparent conductive element $1_1$, a second transparent conductive element $1_2$, and a microcapsule layer (medium layer) 151. The first transparent conductive element $1_1$ and the second transparent conductive element $1_2$ are arranged to oppose each other with a particular distance therebetween so that their transparent conductive layer $6_1$ and transparent conductive layer $6_2$ oppose each other. The microcapsule layer 151 is provided between the first transparent conductive element $1_1$ and the second transparent conductive element $1_2$ arranged to be separate from each other by a particular distance.

Furthermore, if needed, the second transparent conductive element $1_2$ may be bonded to a support member 154 such as glass with a bonding layer 153 such as an adhesive. Here, an example in which the present invention is applied to an electronic paper of a microcapsule electrophoresis type is described; however, the electronic paper is not limited to this example and the present invention is applicable to any configuration in which a medium layer is provided between conductive elements arranged to oppose each other. Here, the medium includes, in addition to liquid and solid, gas such as air. Moreover, the medium may contain components such as capsules, pigments, and particles.

As the electronic paper to which the present invention can be applied, electronic paper of a twist ball method, a thermal rewritable method, a toner display method, an in-plane electrophoresis method, an electronic powder method, etc., can be named in addition to the microcapsule electrophoretic method. The microcapsule layer 151 contains a large number of microcapsules 152. A transparent liquid (dispersion medium) in which, for example, black particles and white particles are dispersed is encapsulated in the microcapsules.

The transparent conductive layer $6_1$ of the first transparent conductive element $1_1$ and the transparent conductive layer $6_2$ of the second transparent conductive element $1_2$ are formed into particular electrode patterns depending on the drive type of the information display device, which is an electronic paper. As the drive method, for example, a simple matrix drive method, an active matrix drive method, a segment drive method, etc., can be named.

As shown in FIGS. 22B and 22C, the wave surfaces Sw of the first transparent conductive element $1_1$ and the second transparent conductive element $1_2$ are arranged to oppose each other with a particular distance therebetween. In a passive matrix drive-type electronic paper, a transparent conductive layer $6_1$ and a transparent conductive layer $6_2$ having a particular pattern are respectively formed on wave surfaces Sw of the first transparent conductive element $1_1$ and the second transparent conductive element $1_2$. As a result, there exists a region (FIG. 22B) in which the wave surface Sw on which the transparent conductive layer $6_1$ is formed opposes the wave surface Sw on which the transparent conductive layer $6_2$ is formed, a region (FIG. 22C) in which the exposed wave surface Sw with no transparent conductive layer $6_1$ formed thereon opposes the exposed wave surface Sw with no transparent conductive layer $6_2$ formed thereon, and a region (not shown in the drawings) in which a wave surface Sw on which the transparent conductive layer $6_1$ or the transparent conductive layer $6_2$ is formed opposes an exposed wave surface Sw on which no transparent conductive layer $6_1$ or transparent conductive layer $6_2$ is formed.

The eleventh embodiment is identical to the tenth embodiment except for the above-described matter.

EXAMPLES

Hereinafter, the present invention is specifically described with samples; however, the present invention is not limited to these samples.
(Average Height Hm, Average Arrangement Pitch Pm, and Aspect Ratio (Hm/Pm))

Hereinbelow, the average height Hm, the average arrangement pitch Pm, and the aspect ratio (Hm/Pm) of the structures of a transparent conductive sheet were determined as follows.

First, a transparent conductive sheet was cut so as to include tops of the structures, and the cross-section was photographed with a transmission electron microscope (TEM). Next, the arrangement pitch P of the structures and the height H of the structures were determined from the TEM photograph taken. This measurement was repeated at 10 positions arbitrarily selected from the transparent conductive sheet, and the measurement values were simply averaged (arithmetic mean) to determine the average arrangement pitch Pm and the average height Hm. Next, these average arrangement pitch Pm and the average height Hm were used to determine the aspect ratio (Hm/Pm).

Note that the average height Hm, average arrangement pitch Pm, and aspect ratio (Hm/Pm) of the structures correspond to the average amplitude Am of vibration of the wave surface, the average wavelength λm of the wave surface, and the ratio (Am/λm), respectively.
(Thickness of ITO Film)

Hereinbelow, the thickness of the ITO film was determined as follows.

First, a transparent conductive sheet was cut so as to include tops of the structures, the cross-section was photographed with a transmission electron microscope (TEM), and the thickness of the ITO film at the top of the structures was measured from the TEM photograph taken.
(Average Angle of Structure Sloped Surfaces)

Hereinbelow, the average angle of the structure sloped surfaces was determined as follows.

First, a transparent conductive sheet was cut so as to include tops of the structures, and the cross-section was photographed with a transmission electron microscope (TEM). Next, an average value of angles of the sloped surface from the bottom toward the top (average value of the sloped surface angle of one structure) was determined from the TEM photograph taken. This process of determining the average value was repeated at 10 positions arbitrarily selected from the transparent conductive sheet, and the average values of the sloped surface angles of 10 structures were simply averaged (arithmetic mean) to determine the average angle of the structure sloped surface.

Samples 1-1 to 10-5 are described in the following order.
1. Flat portion area ratio (Samples 1-1 to 1-3)
2. Color tone (Samples 2-1 to 2-3)
3. Thickness ratio of transparent conductive layer (Samples 3-1 to 3-3)
4. Aspect ratio (Samples 4-1 to 4-4)
5. Electrical reliability (Samples 5-1 to 5-6)
6. Reflectance difference ΔR (Samples 6-1 to 6-4)
7. Shape of structures (Samples 7-1 to 7-3)
8. Pattern deformation (Samples 8-1 and 8-2)
9. Etching resistance (Samples 9-1 to 10-5)
<1. Flat Portion Area Ratio>

In Samples 1-1 to 1-3, an optical simulation by rigorous couple wave analysis (RCWA) was conducted to study the relationship between the flat portion area ratio and the reflectance.
(Sample 1-1)

A reflection spectrum of a transparent conductive element was determined by an optical simulation. A graph showing the results is shown in FIG. 23B.

The conditions of the optical simulation are presented below.
(Configuration of the Transparent Conductive Element)

The transparent conductive element was the following multilayer structure.

(Incident Side) Substrate/Structures/Transparent Conductive Layer/Optical Layer (Outgoing Side)

FIG. 23A is a plan view showing a plurality of structures arranged on a substrate surface. In FIG. 23A, circles represent structure bottoms, Uc represents a unit lattice, and $r_s$ represents a radius of the structure bottom. As shown in FIG. 23A, a plurality of structures are arranged on the substrate surface.
(Substrate)

Refractive index n: 1.52
(Structures)

Arrangement of structures: hexagonal lattice

Shape of structures: bell shape

Bottom of the structure: circular

Arrangement pitch (wavelength λ) P: 250 nm

Height of structure (amplitude A) H: 150 nm

Aspect ratio (H/P): 0.6

Area S(lattice) of unit lattice Uc: 2×2√3

Radius $r_s$ of the bottom of the structure: 0.9

Area S(structure) of the bottom of the structure: $2 \times \pi r_s^2 = 2 \times \pi \times 0.9^2$ Area ratio $R_s$ of flat portion: [(S(lattice)−S(structure))/S(lattice)]×100=26.54%
(Transparent Conductive Layer)

Refractive index n of transparent conductive layer: 2.0

Thickness t of transparent conductive layer: 60 to 75 nm

Thickness D1 of transparent conductive layer at the structure top: 75 nm

Thickness D3 of transparent conductive layer between structures: 60 nm

Thickness ratio D3/D1: 0.8
(Optical Layer)

Refractive index n: 1.52
(Incident Light)

Polarization: unpolarized

Incident angle: 5 degrees (with respect to the normal of the transparent conductive element)
(Sample 1-2)

A reflection spectrum of a transparent conductive element was determined by an optical simulation as in Sample 1-1 except that the following conditions were altered. The graph showing the results is shown in FIG. 23B.
(Structures)

Radius $r_s$ of the bottom of the structure: 0.8

Area S(structure) of the bottom of the structure: $2 \times \pi r_s^2 = 2 \times \pi \times 0.8^2$ Area ratio of flat portion: [(S(lattice)−S(structure))/S(lattice)]×100=41.96%

(Sample 1-3)

A reflection spectrum of a transparent conductive element was determined by a optical simulation as in Sample 1-1 except that the following conditions were altered. The graph showing the results is shown in FIG. 23B.
(Structures)

Radius $r_s$ of the bottom of the structure: 0.7
Area S(structure) of the bottom of the structure: $2 \times \pi r_s^2 = 2 \times \pi \times 0.7^2$
Area ratio of flat portion: $[(S(lattice)-S(structure))/S(lattice)] \times 100 = 55.56\%$ Following can be understood from FIG. 23B.

The luminous reflectance (reflectance at a 550 nm wavelength) can be adjusted to 2% or less when the area ratio of the flat portion in the surface of the transparent conductive element is 50% or less.

The visibility can be improved when the luminous reflectance is 2% or less.

Note that when the radius $r_s$ of the bottom of the structure, the area S(structure) of the bottom of the structure, and the area ratio $R_s$ of the flat portion are set as follows, the reflectance can be further decreased compared to Sample 1-1.

Radius $r_s$ of the bottom of the structure: 1.0
Area S(structure) of the bottom of the structure: $2 \times \pi r_s^2 = 2 \times \pi \times 1.0^2$
Area ratio $R_s$ of the flat portion: $[(S(lattice)-S(structure))/S(lattice)] \times 100 = 9.31\%$ <2. Color Tone>

In Samples 2-1 to 2-3, transparent conductive sheets were actually fabricated to study the color tone.
(Sample 2-1)

First, a glass roll mater having an outer diameter of 126 mm was prepared and a resist layer was formed on a surface of the glass roll mater as follows. That is, a photoresist was diluted to 1/10 with a thinner, and this diluted resist was applied to a thickness of about 70 nm onto a columnar surface of the glass roll master by a dipping method so as to form a resist layer. Next, the glass roll master as a recording medium was transported to a roll master exposure machine shown in FIG. 7 and the resist layer was exposed to form a latent image in the resist layer by patterning, the latent image being one continuous spiral and forming a hexagonal lattice pattern among three adjacent rows of tracks.

In particular, a laser beam having a power of 0.50 mW/m that exposes the glass roll master surface was applied to a region where a hexagonal lattice exposure pattern was to be formed to form a hexagonal lattice exposure pattern. Note that the thickness of the resist layer in the row direction of the track rows was about 60 nm and the thickness of the resist in the direction in which the tracks extend was about 50 nm.

Next, the resist layer on the glass roll mater was subjected to a developing process to dissolve the exposed portions of the resist layer to conduct development. In particular, the undeveloped glass roll master was placed on a turn table of a developer not shown in the drawing and a developing solution was dropped onto the surface of the glass roll master being rotated together with the turn table so as to develop the resist layer on the surface thereof. As a result, a resist glass master in which a resist layer has openings forming a hexagonal lattice pattern was obtained.

Next, plasma etching was conducted in a $CHF_3$ gas atmosphere by using a roll etching machine. As a result, etching progressed only in the hexagonal pattern portion exposed from the resist layer on the surface of the glass roll master, and the rest of the regions remained unetched since the resist layer worked as a mask, thereby forming concavities having an elliptical cone shape in the glass roll master. During this process, the etching amount (depth) was adjusted by the etching time. Lastly, the resist layer was completely removed by $O_2$ aching to thereby obtain a moth-eye glass roll master having a concave hexagonal lattice pattern. The depth of the concavities in the row direction was deeper than the depth of the concavities in the direction in which the tracks extend.

Next, a plurality of structures were formed on a PET sheet 125 μm in thickness by UV imprint using the moth-eye glass roll master. In particular, the moth-eye glass roll master was brought into contact with a PET (polyethylene terephthalate) sheet coated with an ultraviolet light-curable resin, and separated while curing under irradiation of ultraviolet light. As a result, an optical sheet with following structures arranged on one main surface was obtained.

Arrangement of structures: hexagonal lattice
Shape of structures: bell shape
Average arrangement pitch (wavelength λ) Pm of structures: 250 nm
Average height (amplitude A) Hm of structures: 125 nm
Aspect ratio (Hm/Pm) of structures: 0.5

Next, a transparent conductive sheet was fabricated by forming an ITO layer by a sputtering method on the PET sheet surface on which the plurality of structures were formed. The conditions for forming the ITO layer are described below.

Type of gas: mixed gas of Ar gas and $O_2$ gas
Mixing ratio (volume ratio) of mixed gas: $Ar:O_2=200:10$
Thickness of ITO layer: 75 nm Here, the thickness of the ITO layer is the thickness at the top of the structure.

Next, the transparent conductive sheet was bonded to a glass substrate having a refractive index of 1.5 through an adhesive sheet so that the ITO-layer-side surface came at the glass-substrate-surface side.

As described above, a desired transparent conductive sheet was fabricated.
(Sample 2-2)

An optical sheet was fabricated as in Sample 2-1 except that the following structures were arranged on one main surface of a PET sheet.

Arrangement of structures: hexagonal lattice
Shape of structures: bell shape
Average arrangement pitch Pm of structures: 250 nm
Average height Hm of structures: 150 nm
Aspect ratio (Hm/Pm): 0.6

Next, a transparent conductive sheet was fabricated by forming an ITO layer by a sputtering method on the PET sheet surface on which the plurality of structures were formed. The conditions for forming the ITO layer are described below.

Type of gas: mixed gas of Ar gas and $O_2$ gas
Mixing ratio (volume ratio) of mixed gas: $Ar:O_2=200:10$
Thickness of ITO layer: 100 nm Here, the thickness of the ITO layer is the thickness at the top of the structure.

Next, the transparent conductive sheet was bonded to a glass substrate having a refractive index of 1.5 through an adhesive sheet so that the ITO-layer-side surface came at the glass-substrate-surface side.

As described above, a desired transparent conductive sheet was fabricated.
(Sample 2-3)

An optical sheet was fabricated as in Sample 2-1 except that formation of the ITO layer was omitted.

Next, the optical sheet was bonded to a glass substrate having a refractive index of 1.5 through an adhesive sheet so that a surface on which a plurality of structures were formed came at the glass-substrate-surface side.

As described above, a desired transparent conductive sheet was fabricated.

(Transmission Hue)

Figure 24:
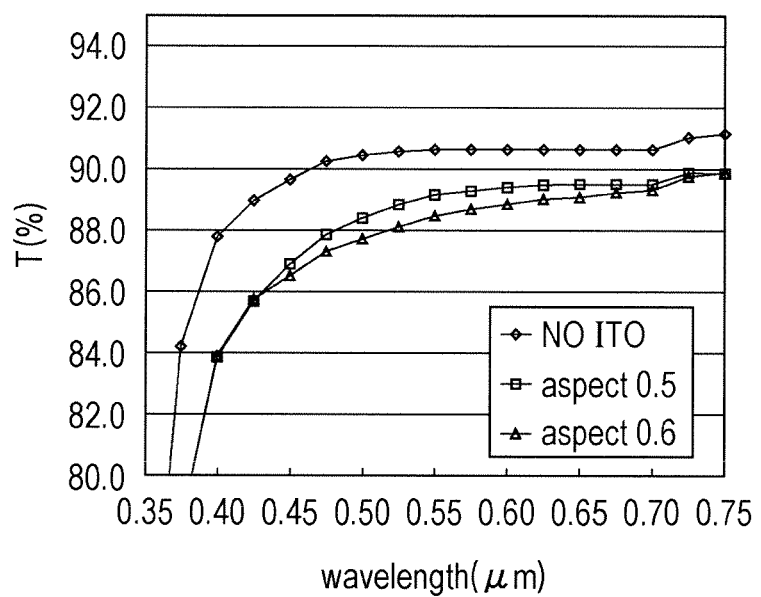
FIG. 24 is a graph showing the measurement results of transmission spectra of transparent conductive elements of Samples 2-1 to 2-3.

Transmission spectra in the wavelength region (350 nm to 800 nm) near the visible range were measured with a spectrophotometer by using the thus-fabricated transparent conductive sheets and optical sheets as the measurement samples, and the transmission hue a* and b* were calculated from the transmission spectra. The measurement results of the transmission spectra are shown in FIG. 24. The calculated results of the transmission hue a* and b* are shown in Table 1.

Table 1 shows the calculated results of the transmission hue of Samples 2-1 to 2-3.

TABLE 1

|  | Sample 2-1 | Sample 2-2 |
|---|---|---|
| Aspect | 0.5 | 0.6 |
| a* (transmission) | −0.35 | −0.12 |
| b* (transmission) | 1.48 | 1.29 |

Following can be understood from Table 1.

According to the transparent conductive sheets of Samples 2-1 and 2-2, both a* and b* were values smaller than 3, which shows that they are colorless and transparent and have good characteristics.

<3. Thickness Ratio of the Transparent Conductive Layer>

In Samples 3-1 to 3-3, an optical simulation by RCWA was conducted to study the relationship between the thickness ratio (D3/D1) of the transparent conductive layer and the reflectance.

(Sample 3-1)

Figure 25:
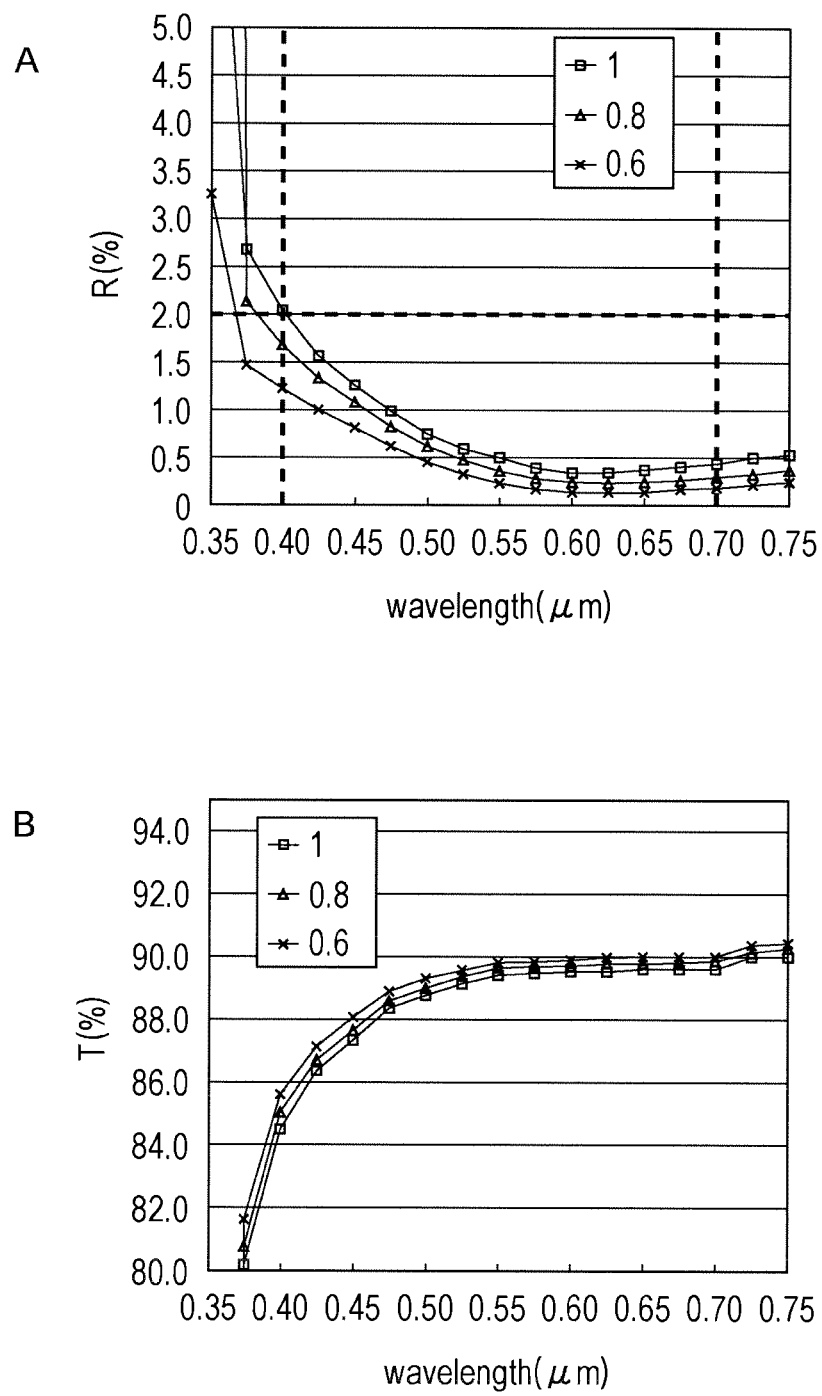
FIG. 25A is a graph showing reflection spectra of transparent conductive elements of Samples 3-1 to 3-3.
FIG. 25B is a graph showing transmission spectra of the transparent conductive elements of Samples 3-1 to 3-3.

A reflection spectrum of a transparent conductive element was determined by an optical simulation and the reflection hue a* and b* and reflection Y value were determined from the reflection spectrum. The results are shown in the graph of FIG. 25A and Table 2.

Similarly, a transmission spectrum of the transparent conductive element was determined by an optical simulation and the transmission hue a* and b* were determined from the transmission spectrum. The results are shown in the graph of FIG. 25B and Table 3.

The conditions for the optical simulation are described below.

(Configuration of the Transparent Conductive Element)

The transparent conductive element was the following multilayer structure.

(Incident Side) Substrate/Structures/Transparent Conductive Layer/Optical Layer (Outgoing Side)

(Substrate)
Refractive index n: 1.52

(Structures)
Arrangement of structures: hexagonal lattice
Shape of structures: bell shape
Bottom of the structure: circular
Arrangement pitch (wavelength λ) P: 250 nm
Height of structure (amplitude A) H: 150 nm
Aspect ratio (H/P): 0.6
Area S(lattice) of unit lattice Uc: 2×2-6
Area ratio $R_s$ of flat portion: [(S(lattice)−S(structure))/S(lattice)]×100=42%

(Transparent Conductive Layer)
Refractive index n of transparent conductive layer: 2.0
Thickness t of transparent conductive layer: 50 nm
Thickness D1 of transparent conductive layer at the structure top: 50 nm
Thickness D3 of transparent conductive layer between structures: 50 nm
Thickness ratio D3/D1: 1

(Optical Layer)
Refractive index n: 1.52

(Incident Light)
Polarization: unpolarized
Incident angle: 5 degrees (with respect to the normal of the transparent conductive element)

(Sample 3-2)

An optical simulation was conducted as in Sample 3-1 except that the following optical simulation conditions were altered, a reflection spectrum was determined, and the reflection hue a* and b* and the reflection Y value were determined from the reflection spectrum. The results are shown in the graph of FIG. 25A and Table 2.

Similarly, a transmission spectrum of the transparent conductive element was determined by an optical simulation and the transmission hue a* and b* were determined from the transmission spectrum. The results are shown in the graph of FIG. 25B and Table 3.

(Transparent Conductive Layer)
Thickness t of transparent conductive layer: 40 to 50 nm
Thickness D1 of transparent conductive layer at the structure top: 50 nm
Thickness D3 of transparent conductive layer between structures: 40 nm
Thickness ratio D3/D1: 0.8

(Sample 3-3)

An optical simulation was conducted as in Sample 3-1 except that the following optical simulation conditions were altered, a reflection spectrum was determined, and the reflection hue a* and b* and the reflection Y value were determined from the reflection spectrum. The results are shown in the graph of FIG. 25A and Table 2.

Similarly, a transmission spectrum of the transparent conductive element was determined by an optical simulation and the transmission hue a* and b* were determined from the transmission spectrum. The results are shown in the graph of FIG. 25B and Table 3.

(Transparent Conductive Layer)
Thickness t of transparent conductive layer: 30 nm to 50 nm
Thickness D1 of transparent conductive layer at the structure top: 50 nm
Thickness D3 of transparent conductive layer between structures: 30 nm
Thickness ratio D3/D1: 0.6

TABLE 2

|  | Sample 3-1 | Sample 3-2 | Sample 3-3 |
|---|---|---|---|
| Thickness ratio D3/D1 | 1 | 0.8 | 0.6 |
| a* (reflection) | 2.32 | 1.8 | 1.26 |
| b* (reflection) | −10.7 | −10 | −7.9 |
| Y | 0.46 | 0.36 | 0.24 |

TABLE 3

|  | Sample 3-1 | Sample 3-2 | Sample 3-3 |
|---|---|---|---|
| Thickness ratio D3/D1 | 1 | 0.8 | 0.6 |
| a* (transmission) | −0.36 | −0.34 | −0.31 |
| b* (transmission) | 1.31 | 1.23 | 1.11 |

Following can be understood from FIG. 25A.

The reflection characteristic can be improved by adjusting the thickness ratio D3/D1 to less than 1. In particular, the thickness ratio D3/D1 is preferably 0.8 or less and more preferably 0.6 or less.

<4. Aspect Ratio>

In Samples 4-1 to 4-4, an optical simulation by RCWA was conducted to study the relationship between the aspect ratio of the structures and the reflectance.

(Sample 4-1)

Figure 26:
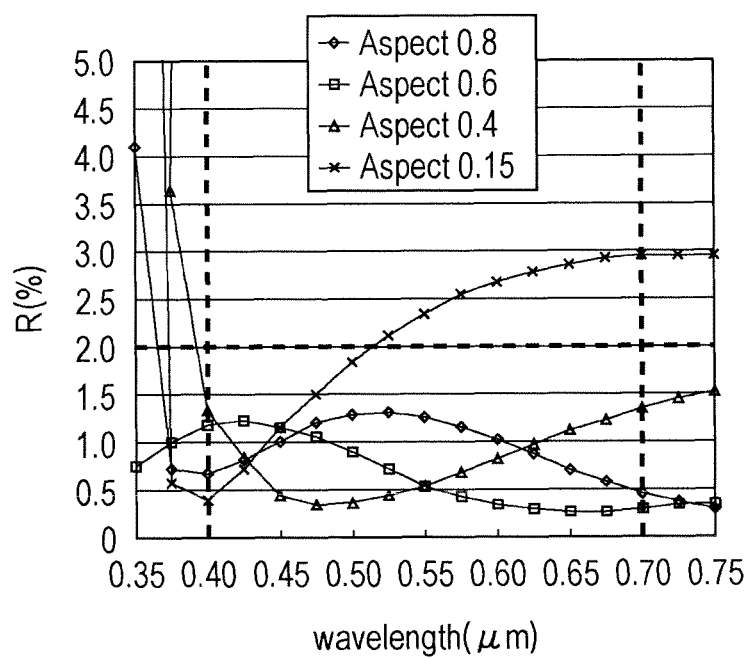
FIG. 26 is a graph showing reflection spectra of transparent conductive elements of Samples 4-1 to 4-4.

A reflection spectrum of a transparent conductive element was determined by an optical simulation and the reflection hue a* and b* and reflection Y value were determined from the reflection spectrum. The results are shown in FIG. 26 and Table 4.

The conditions for the optical simulation are described below.

(Configuration of the Transparent Conductive Element)

The transparent conductive element was the following multilayer structure.

(Incident Side) Substrate/Structures/Transparent Conductive Layer/Optical Layer (Outgoing Side)

(Substrate)
Refractive index n: 1.52

(Structures)
Arrangement of structures: hexagonal lattice
Shape of structures: bell shape
Bottom of the structure: circular
Arrangement pitch (wavelength λ) P: 250 nm
Height of structure (amplitude A) H: 200 nm
Aspect ratio (H/P): 0.8
Area S(lattice) of unit lattice Uc: 2×2√3
Area ratio $R_s$ of flat portion: [(S(lattice)−S(structure))/S(lattice)]×100=42%

(Transparent Conductive Layer)
Refractive index n of transparent conductive layer: 2.0
Thickness t of transparent conductive layer: 60 to 75 nm
Thickness D1 of transparent conductive layer at the structure top: 75 nm
Thickness D3 of transparent conductive layer between structures: 60 nm
Thickness ratio D3/D1: 0.8

(Optical Layer)
Refractive index n: 1.52

(Incident Light)
Polarization: unpolarized
Incident angle: 5 degrees (with respect to the normal of the transparent conductive element)

(Sample 4-2)

An optical simulation was conducted as in Sample 4-1 except that the following optical simulation conditions were altered, a reflection spectrum was determined, and the reflection hue a* and b* and reflection Y value were determined from the reflection spectrum. The results are shown in the graph of FIG. 26 and Table 4.

(Structures)
Arrangement pitch (wavelength λ) P: 250 nm
Height of structure (amplitude A) H: 150 nm
Aspect ratio (H/P): 0.6

(Sample 4-3)

An optical simulation was conducted as in Sample 4-1 except that the following optical simulation conditions were altered, a reflection spectrum was determined, and the reflection hue a* and b* and the reflection Y value were determined from the reflection spectrum. The results are shown in the graph of FIG. 26 and Table 4.

(Structures)
Arrangement pitch (wavelength λ) P: 250 nm
Height of structure (amplitude A) H: 100 nm
Aspect ratio (H/P): 0.4

(Sample 4-4)

An optical simulation was conducted as in Sample 4-1 except that the following optical simulation conditions were altered, a reflection spectrum was determined, and the reflection hue a* and b* and the reflection Y value were determined from the reflection spectrum. The results are shown in the graph of FIG. 26 and Table 4.

(Structures)
Arrangement pitch (wavelength λ) P: 400 nm
Height of structure (amplitude A) H: 60 nm
Aspect ratio (H/P): 0.15

TABLE 4

|  | Sample 4-1 | Sample 4-2 | Sample 4-3 | Sample 4-4 |
| --- | --- | --- | --- | --- |
| Aspect | 0.8 | 0.6 | 0.4 | 0.15 |
| a* (reflection) | −4.68 | −0.85 | 5.17 | −0.13 |
| b* (reflection) | 1.61 | −8.5 | 1.82 | 11.13 |
| Reflection Y value | 1.18 | 0.57 | 0.62 | 2.35 |

Following can be understood from FIG. 26.

Good optical adjustment function can be obtained when the aspect of the structures is within the range of 0.2 or more and 1.0 or less.

<5. Electrical Reliability>

In Samples 5-1 to 5-5, transparent conductive sheets were actually fabricated to study the relationship between the average angle of the structure sloped surfaces and the electrical reliability.

(Sample 5-1)

An optical sheet was fabricated as in Sample 2-1 except that the following structures were arranged on one main surface of the PET sheet.

Arrangement of structures: hexagonal closest-packed
Shape of structures: truncated circular cone shape
Average arrangement pitch Pm of structures: 220 nm
Average height Hm of structures: 240 nm
Aspect ratio (Hm/Pm) of structures: 1.091
Average angle θm of structure sloped surface: 65 degrees Next, a transparent conductive sheet was fabricated by forming an ITO layer by a sputtering method on the PET sheet surface on which the plurality of structures were formed.

The conditions for forming the ITO layer are described below.

Type of gas: mixed gas of Ar gas and $O_2$ gas
Mixing ratio (volume ratio) of mixed gas: Ar:$O_2$=200:13
Thickness of ITO layer: 36 nm to 40 nm Here, the thickness of the ITO layer is the thickness at the top of the structure.

(Sample 5-2)

A transparent conductive sheet was fabricated as in Sample 5-1 except that the following structures were arranged on one main surface of a PET sheet.

Arrangement of structures: hexagonal closest-packed
Shape of structures: truncated circular cone shape
Average arrangement pitch Pm of structures: 250 nm
Average height Hm of structures: 180 nm
Aspect ratio (Hm/Pm) of structures: 0.72
Average angle θm of structure sloped surface: 55 degrees (Sample 5-3)

A transparent conductive sheet was fabricated as in Sample 5-1 except that the following structures were arranged on one main surface of a PET sheet.

Arrangement of structures: hexagonal closest-packed
Shape of structures: truncated circular cone shape
Average arrangement pitch Pm of structures: 270 nm
Average height Hm of structures: 150 nm
Aspect ratio (Hm/Pm) of structures: 0.55
Average angle θm of structure sloped surface: 70 degrees
(Sample 5-4)
A transparent conductive sheet was fabricated as in Sample 5-1 except that the following structures were arranged on one main surface of a PET sheet.

(High-Temperature Test)
First, the transparent conductive sheet fabricated as described above was placed in an air atmosphere and aged at 150 degrees for 30 minutes. Next, the transparent conductive sheet was retained in a low-temperature environment at 80 degrees for 240 hours and the surface resistance of the transparent conductive sheet was measured by a four probe method (JIS K 7194). The results are shown in Table 5.
Table 5 shows the results of the heat shock test and high-temperature test (hereinafter referred to as reliability test) of Samples 5-1 to 5-6.

TABLE 5

|  | | Structures | | | | | Heat shock test | | | High-temperature test | | |
| --- | --- | --- | --- | --- | --- | --- | --- | --- | --- | --- | --- | --- |
|  | Configuration | Arrangement | Shape | Pitch Pm (nm) | Height (nm) | Aspect (Hm/Pm) | Average angle θm (degree) | Surface resistance before test (Ω/□) | Surface resistance after test (Ω/□) | Rate of change in surface resistance | Surface resistance before test (Ω/□) | Surface resistance after test (Ω/□) | Rate of change in surface resistance |
| Sample 5-1 | Moth-eye structures | Hexagonal | Bell shape | 220 | 240 | 1.09 | 65 | 688 | 1200 | 1.74 | 600 | 1300 | 2.17 |
| Sample 5-2 | Moth-eye structures | Hexagonal | Bell shape | 250 | 180 | 0.72 | 55 | 595 | 601 | 1.01 | 503 | 513 | 1.02 |
| Sample 5-3 | Moth-eye structures | Hexagonal | Truncated elliptical cone | 270 | 150 | 0.55 | 70 | 503 | 622 | 1.24 | 380 | 434 | 1.14 |
| Sample 5-4 | Moth-eye structures | Hexagonal | Bell shape | 250 | 135 | 0.54 | 50 | 391 | 388 | 0.99 | 334 | 339 | 1.01 |
| Sample 5-5 | ITO single layer | — | — | — | — | — | — | 468 | 535 | 1.14 | 491 | 542 | 1.10 |
| Sample 5-6 | Three-layer optical multilayer ITO | — | — | — | — | — | — | 321 | 379 | 1.18 | 340 | 378 | 1.11 |

Rate of change in surface resistance: Surface resistance after test/surface resistance before test Arrangement of structures: hexagonal closest-packed
Shape of structures: truncated circular cone shape
Average arrangement pitch Pm of structures: 250 nm
Average height Hm of structures: 135 nm
Aspect ratio (Hm/Pm) of structures: 0.54
Average angle θm of structure sloped surface: 50 degrees
(Sample 5-5)
A transparent conductive sheet was fabricated as in Sample 5-1 except that formation of the structures was omitted and an ITO layer having a thickness of 20 nm was formed on one flat main surface of a PET sheet.
(Sample 5-6)
A transparent conductive sheet was fabricated as in Sample 5-1 except that formation of the structures was omitted and a NbO layer having a thickness of 20 nm, a SiO$_2$ layer having a thickness of 90 nm, and an ITO layer having a thickness of 20 nm were sequentially formed on one flat main surface of a PET sheet.
(Heat Shock Test)
The transparent conductive sheet fabricated as described above was placed in an air atmosphere and aged at 150 degrees for 30 minutes. Next, 50 cycles of an environment test of retaining the sheet in a low-temperature environment of −30 degrees for 30 minutes and in a high-temperature environment of 70 degrees for 30 minutes were performed on the transparent conductive sheet. Next, the surface resistance of the transparent conductive sheet was determined by a four probe method (JIS K 7194). The results are shown in Table 5.

Following can be understood from Table 5.
In Samples 5-5 and 5-6 having single-layer ITO and multilayer ITO structures, the surface resistance increases by 10% or more by the reliability test.
In Sample 5-1 in which structures having a high aspect, 1.09 were formed on the surface, the slope angle is as large as 65 degrees and thus the surface resistance increases significantly by the reliability test.
In Sample 5-3 in which structures having a low aspect, 0.55 were formed, the surface slope angle is large, i.e., 70 degrees, since the shape of the structures is a truncated elliptical cone shape and the surface resistance increases by the reliability test.
In Samples 5-2 and 5-4 in which the aspect is as low as 1.0 or less and the surface sloped angle is moderate, i.e., 60 degrees or less, the resistance of the surface resistance by the reliability test was significantly low.
When the thickness of the ITO layer is several tens of nanometers, it is considered that partial disconnection may occur by the stress caused by a change in thermal expansion coefficient of the substrate; however, it is considered that when the structures are imparted to the substrate surface, the stress is moderated and the reliability is improved notably.
Thus, as for the shape of the structures, a cone shape having a convex curved surface at the top is preferred from the viewpoint of electrical reliability. Moreover, from the viewpoint of electrical reliability, the average slope angle of the structures is preferably 60 degrees of less.

Figure 27:
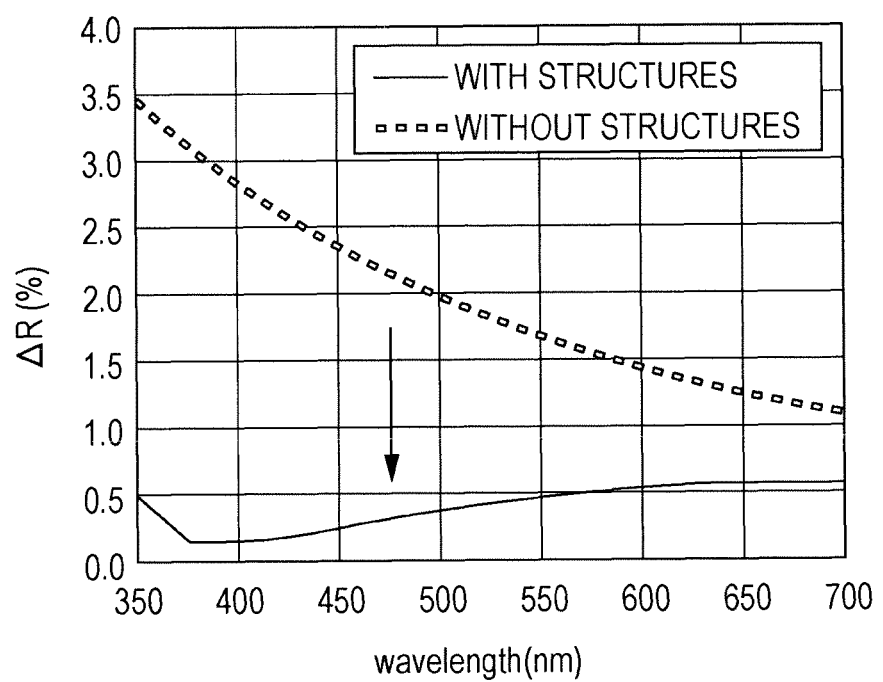
FIG. 27 is a graph showing difference ΔR in reflectance of transparent conductive elements of Samples 6-1 and 6-2 and Samples 6-3 and 6-4.

<6. Reflectance Difference ΔR>
(Sample 6-1)
A transparent conductive sheet was fabricated as in Sample 1-1 except that the following structures were arranged on one main surface of a PET sheet.
  Arrangement of structures: hexagonal lattice
  Shape of structures: bell shape
  Arrangement pitch Pm: 250 nm
  Height of structure Hm: 90 nm
  Aspect ratio (Hm/Pm) of structures: 0.36
  Average angle θm of structure sloped portion: 36 deg
Next, a transparent conductive sheet was fabricated by forming an ITO layer by a sputtering method on the PET sheet surface on which the plurality of structures were formed.
The conditions for forming the ITO layer are described below.
  Type of gas: mixed gas of Ar gas and $O_2$ gas
  Mixing ratio (volume ratio) of mixed gas: Ar:$O_2$=200:13
  Thickness of ITO layer: 30 nm
  Here, the thickness of the ITO layer is the thickness at the top of the structure.
Next, the transparent conductive sheet was bonded to a glass substrate having a refractive index of 1.5 through an adhesive sheet so that the ITO-layer-side surface came at the glass-substrate-surface side.
As described above, a desired transparent conductive sheet was fabricated.
(Sample 6-2)
First, an optical sheet was fabricated as in Sample 6-1 except that formation of the ITO layer was omitted.
Next, the optical sheet was bonded to a glass substrate having a refractive index of 1.5 through an adhesive sheet so that the a surface on which a plurality of structures were formed came at the glass-substrate-surface side.
As described above, a desired optical sheet was fabricated.
(Sample 6-3)
A transparent conductive sheet was fabricated as in Sample 6-1 except that formation of the structures was omitted and an ITO layer having a thickness of 30 nm was formed on one flat main surface of the PET sheet.
(Sample 6-4)
An optical sheet was fabricated as in Sample 6-3 except that formation of the ITO layer was omitted.
(Reflection Spectrum)
First, black tapes were bonded to surfaces of the transparent conductive sheet and optical sheet fabricated as described above, the surfaces being opposite to the surfaces bonded to the glass substrate, so as to fabricate measurement specimens. Next, the reflection spectra of the measurement specimens in the wavelength region (350 nm to 700 nm) near the visible range were measured with a spectrophotometer (produced by JASCO Corporation, trade name: V-550). Next, the difference ΔR in reflectance was calculated from the following formula. The calculation results of the difference ΔR in reflectance are shown in FIG. 27. The calculation results of the difference ΔR in luminous reflectance are shown in Table 6. Here, the luminous reflectance refers to a reflectance at a 550 nm wavelength.

ΔR=((Reflectance of Sample 6-2)−(Reflectance of Sample 6-1))

ΔR=((Reflectance of Sample 6-4)−(Reflectance of Sample 6-3))

(Reflection Hue)
The reflection hue a* and b* were calculated from the reflection spectra measured as described above. The results are shown in Table 6.

Table 6 shows the calculation results of difference ΔR in luminous reflectance and the reflection hue of Samples 6-1 to 6-4.

TABLE 6

| | Presence or absence of structures | Presence or absence of ITO layer | ΔR | a* (reflection) | b* (reflection) |
|---|---|---|---|---|---|
| Sample 6-1 | Present | Present | 0.5 | 0.1 | 3 |
| Sample 6-2 | Present | Absent | | 0.44 | −0.55 |
| Sample 6-3 | Absent | Present | 1.7 | 0.5 | −10.5 |
| Sample 6-4 | Absent | Absent | | 0.44 | −0.55 |

Following can be understood from FIG. 27 and Table 6.
The difference ΔR in luminous reflectance can be suppressed by forming a transparent conductive layer on structures in which slope angles are controlled. Moreover, the absolute values of a* and b* can be decreased.

Figure 28:
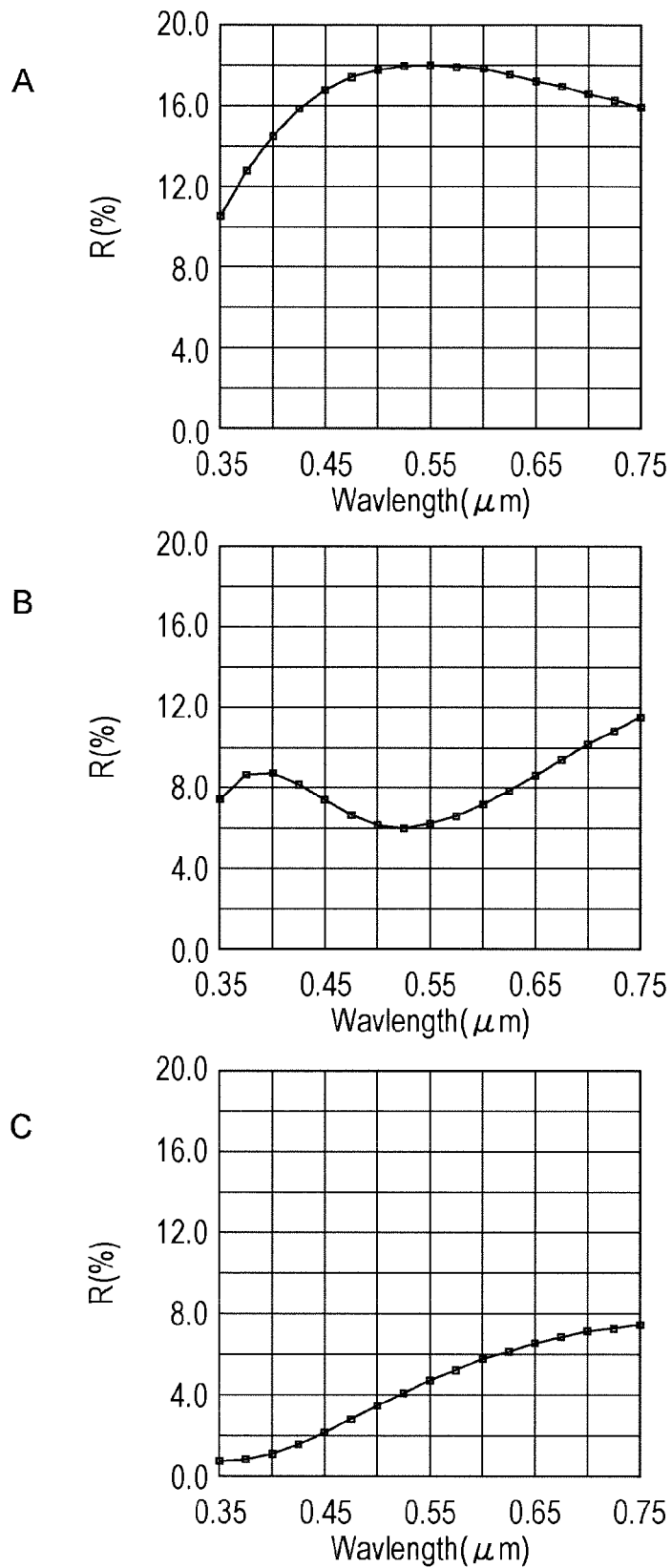
FIG. 28A is a graph showing a reflection spectrum of a transparent conductive element of Sample 7-1.
FIG. 28B is a graph showing a reflection spectrum of a transparent conductive element of Sample 7-2.
FIG. 28C is a graph showing a reflection spectrum of a transparent conductive element of Sample 7-3.

<7. Shape of Structures>
In Samples 7-1 to 7-3, an optical simulation by RCWA (Rigorous Coupled Wave Analysis) was conducted to study the relationship between the shape of the structures and the reflectance.
(Sample 7-1)
A reflection spectrum of a transparent conductive element was determined by an optical simulation and the reflection hue a* and b* were calculated from this reflection spectrum. The results are shown in FIG. 28A and Table 7.
The conditions for the optical simulation are described below.
(Configuration of the Transparent Conductive Element)
The transparent conductive element was the following multilayer structure.
  (Incident Side) Substrate/Transparent Conductive Layer/Optical Layer (Outgoing Side)
(Substrate)
  Refractive index n: 1.52
(Transparent Conductive Layer)
  Refractive index n of transparent conductive layer: 2.0
  Thickness t of transparent conductive layer: 70 nm
(Resin Layer at the Outgoing Surface Side)
  Refractive index n: 1.52
(Incident Light)
  Polarization: unpolarized
  Incident angle: 5 degrees (with respect to the normal of the transparent conductive element)
(Sample 7-2)
FIG. 29A is a cross-sectional view showing thicknesses D1, D2, and D3 of a transparent conductive layer of Sample 7-2. In FIG. 29A, $n_1$, $n_2$, and $n_3$ respectively indicate perpendicular directions of the structure top, the structure sloped surface, and the portion between the structures. The thickness D1, the thickness D2, and the thickness D3 respectively indicate the thickness of the transparent conductive layer in the perpendicular $n_1$ direction at the structure top, the thickness of the transparent conductive layer in the perpendicular $n_2$ direction at the structure sloped surface, and the thickness of the transparent conductive layer in the perpendicular $n_3$ direction between structures.
A reflection spectrum of the transparent conductive element was determined by an optical simulation and the reflection hue a* and b* were calculated from the reflection spectrum. The results are shown in FIG. 28B and Table 7.

The conditions for the optical simulation are described below.
(Configuration of the Transparent Conductive Element)
The transparent conductive element was the following multilayer structure.
(Incident Side) Substrate/Structures/Transparent Conductive Layer/Optical Layer (Outgoing Side)
(Substrate)
Refractive index n: 1.52
(Structures)
Arrangement of structures: rectangular lattice
Shape of structures: quadrangular pyramid (length of a side of the bottom: 100 nm, the length of a side of the upper surface: 40 nm)
Bottom of the structure: quadrilateral
Refractive index n of structure: 1.52
Arrangement pitch P: 120 nm
Height H of structure: 100 nm
Aspect ratio (H/P): 0.83
(Transparent Conductive Layer)
As shown in FIG. 29A, the transparent conductive layer was set so that the thickness D1 of the transparent conductive layer in the perpendicular direction $n_1$ at the structure top and the thickness D2 of the transparent conductive layer in the perpendicular direction $n_2$ at the structure sloped surface were 70 nm.
Refractive index n of the transparent conductive layer: 2.0
Thickness D1 of the transparent conductive layer at the structure top: 70 nm
Thickness D2 of the transparent conductive layer at the structure sloped surface: 70 nm
Thickness ratio D3/D1: 1 or more
(Resin Layer at the Outgoing Surface Side)
Refractive index n: 1.52
(Incident Light)
Polarization: unpolarized
Incident angle: 5 degrees (with respect to the normal of the transparent conductive element)
(Sample 7-3)
FIG. 29B is a cross-sectional view showing the thicknesses D1, D2, and D3 of a transparent conductive of Sample 7-3. In FIG. 29B, $n_0$ indicates a perpendicular direction to a transparent conductive element surface (or substrate surface). The thickness D1, the thickness D2, and the thickness D3 respectively indicate the thickness of the transparent conductive layer in the perpendicular direction $n_0$ at the structure top, the thickness of the transparent conductive layer in the perpendicular direction $n_0$ at the structure sloped surface, and the thickness of the transparent conductive layer in the perpendicular direction $n_0$ between structures.
A reflection spectrum was determined by an optical simulation as in Test Example 1 except that the following optical simulation conditions were altered, and the reflection hue a* and b* were determined from the reflection spectrum. The results are shown in FIG. 28C and Table 7.
(Transparent Conductive Layer)
As shown in FIG. 29B, the transparent conductive layer was set so that the thickness D1 of the transparent conductive layer in the perpendicular direction $n_0$ at the structure top, the thickness D2 of the transparent conductive layer in the perpendicular direction $n_0$ at the structure sloped surface, and the thickness D3 of the transparent conductive layer in the perpendicular direction $n_0$ between the structures were all 70 nm.
Refractive index n of the transparent conductive layer: 2.0
Thickness D1 of the transparent conductive layer at the structure top: 70 nm
Thickness D3 of the transparent conductive layer between structures: 70 nm
Thickness ratio D3/D1: 1
Table 7 shows the calculation results of the luminous reflectance and transmission hue of Samples 7-1 to 7-3.

TABLE 7

| | Film-forming surface | Thickness | Luminous reflectance | a* (reflection) | b* (reflection) |
|---|---|---|---|---|---|
| Sample 7-1 | Flat surface | 70 nm | 18.0% | −1.6 | 2.3 |
| Sample 7-2 | Surface with structures formed thereon | Thickness D1 at the top: 70 nm Thickness D2 at sloped surface: 70 nm | 6.6% | 6.0 | −2.8 |
| Sample 7-3 | Surface with structures formed thereon | Thickness D1 at the top: 70 nm | 4.8% | 1.8 | 16.0 |

Following can be understood from FIG. 28A to FIG. 28C and Table 7.

In Sample 7-1 in which a transparent conductive layer is formed on a flat surface, although the absolute values of a* and b* are small, the luminous reflectance is high.

In Sample 7-2 in which a transparent conductive layer having a particular thickness is formed on structures, although the luminous reflectance can be decreased to a certain extent, the absolute values of a* and b* are large.

In Sample 7-3 in which a transparent conductive layer having a particular thickness is formed on the structures in the perpendicular direction to the surface on which the structures are formed, although the luminous reflectance can be reduced, the absolute values of a* and b* are large.

<8. Electrode Pattern Deformation>

In Samples 8-1 and 8-2, a transparent conductive sheet was actually fabricated to study the relationship between the presence or absence of the structures and the electrode pattern deformation.

(Sample 8-1)

An optical sheet was fabricated as in Sample 1-1 except that the following structures were arranged on one main surface of a PET sheet.
Arrangement of structures: hexagonal closest-packed
Shape of structures: truncated circular cone shape
Arrangement pitch P of structures: 250 nm
Height H of structures: 150 nm
Aspect ratio: 0.6
Average angle of sloped portions: 50 deg Next, an ITO layer was formed by a sputtering method on a PET sheet surface on which a plurality of structures were formed.

The conditions for forming the ITO layer are described below.
Type of gas: mixed gas of Ar gas and $O_2$ gas
Mixing ratio (volume ratio) of mixed gas: Ar:$O_2$=200:10
Thickness of ITO layer: 30 nm Here, the thickness of the ITO layer is the thickness at the top of the structure.

Next, the ITO layer was patterned to form a plurality of electrodes having a form of connected diamond shapes and to thereby fabricate a transparent conductive sheet. Next, two transparent conductive sheets fabricated as such were bonded to each other with surfaces on which a plurality of electrodes are formed facing upward by using an ultraviolet light curable resin so that the electrodes having a diamond shape did not overlap each other. Next, the transparent conductive sheet at the upper side was bonded to a glass substrate having a refractive index of 1.5 through an adhesive sheet so that the ITO-layer-side surface came at the glass-substrate-surface side.

As described above, a desired input element was fabricated.

(Sample 8-2)

An input element was fabricated as in Sample 8-1 except that formation of the structures was omitted and an ITO layer was formed on a flat main surface of a PET sheet.

(Pattern Deformation Evaluation)

A fluorescent lamp was cast upon a surface of an input element fabricated as described above and whether deformation that corresponds to the electrode pattern occurs in the input element surface was observed. As a result, whereas no deformation was observed in Sample 8-1, deformation was observed in Sample 8-2.

<9. Etching Resistance>

(Sample 9-1)

(Transfer Step)

An optical sheet was fabricated as in Sample 2-1 except that the following structures were arranged on one main surface of a PET sheet.
 Arrangement of structures: hexagonal closest-packed
 Shape of structures: bell shape
 Arrangement pitch P: 250 nm
 Height H of structures: 180 nm
 Aspect ratio: 0.55
 Average angle of sloped portion: 55 degrees (Film Forming Step)

Next, an ITO layer was formed by a sputtering method on a PET sheet surface on which a plurality of structures were formed.

The conditions for forming the ITO layer are described below.
 Type of gas: mixed gas of Ar gas and $O_2$ gas
 Mixing ratio (volume ratio) of mixed gas: $Ar:O_2=200:10$
 Thickness of ITO layer: 30 nm
 Here, the thickness of the ITO layer is the thickness at the top of the structure.

(Annealing Step)

Next, the PET sheet with the ITO layer formed thereon was annealed in air at 150° C. for 120 minutes. As a result, polycrystallization of the ITO layer was accelerated. Next, in order to confirm the state of the acceleration, the ITO layer was measured by X-ray diffraction (XRD), and peaks attributable to $In_2O_3$ were confirmed.

As described above, a desired transparent conductive sheet was fabricated.

(Sample 9-2)

(Transfer Step, Film Forming Step, and Annealing Step)

First, a transfer step, a film forming step, and an annealing step were sequentially performed as in Sample 9-1 to fabricate an annealed PET film having an ITO layer.

(Etching Step)

Next, the annealed PET film was dipped in a HCl 10% diluted solution for 20 seconds to etch the ITO layer.

(Washing Step)

Next, the etched PET sheet was washed with pure water.

As described above, a desired transparent conductive sheet was fabricated.

(Sample 9-3)

A transparent conductive sheet was fabricated as in Sample 9-2 except that the dipping time was altered to 40 seconds.

(Sample 9-4)

A transparent conductive sheet was fabricated as in Sample 9-2 except that the dipping time was altered to 60 seconds.

(Sample 9-5)

A transparent conductive sheet was fabricated as in Sample 9-2 except that the dipping time was altered to 100 seconds.

(Sample 10-1)

A transparent conductive sheet was fabricated as in Sample 9-1 except that the following structures were arranged on one main surface of a PET sheet.
 Arrangement of structures: hexagonal closest-packed
 Shape of structures: bell shape
 Arrangement pitch P: 200 nm
 Height H of structures: 180 nm
 Aspect ratio: 0.62
 Average angle of sloped surfaces: 61 degrees (Sample 10-2)

(Transfer Step, Film Forming Step, and Annealing Step)

First, a transfer step, a film forming step, and an annealing step were sequentially performed as in Sample 10-1 to fabricate an annealed PET film having an ITO layer.

(Etching Step)

Next, the annealed PET film subjected was dipped in a HCl 10% diluted solution for 20 seconds to etch the ITO layer.

(Washing Step)

Next, the etched PET sheet was washed with pure water.

As described above, a desired transparent conductive sheet was fabricated.

(Sample 10-3)

A transparent conductive sheet was fabricated as in Sample 10-2 except that the dipping time was altered to 40 seconds.

(Sample 10-4)

A transparent conductive sheet was fabricated as in Sample 10-2 except that the dipping time was altered to 60 seconds.

(Sample 10-5)

A transparent conductive sheet was fabricated as in Sample 10-2 except that the dipping time was altered to 100 seconds.

(Surface Resistance)

The surface resistance values of the transparent conductive sheet surfaces of Samples 9-1 to 10-5 obtained as described above were measured by a four probe method. The results are shown in Table 8 and FIG. 30.

(Reciprocal of Initial Change Rate)

The reciprocals (change in hypothetical thickness) of the initial change rates of the transparent conductive sheet surfaces of Samples 9-1 to 10-5 obtained as described above were determined from the following equation. The results are shown in Table 9.

(Reciprocal of change rate relative to initial surface resistance)=(surface resistance of sample before etching)/(surface resistance of sample after etching)

Table 8 shows the evaluation results of the surface resistance of the transparent conductive sheets of Samples 9-1 to 10-5.

TABLE 8

| | Structures | | | | Dipping time (sec) | | | | |
|---|---|---|---|---|---|---|---|---|---|
| | Pitch (nm) | Height (nm) | Average angle of sloped surfaces (degrees) | Aspect | 0 | 20 | 40 | 60 | 100 |
| Samples 9-1 to 9-5 | 250 | 180 | 55 | 0.55 | 720 | 298 | 298 | 295 | 300 |
| Samples 10-1 to 10-5 | 200 | 180 | 61 | 0.62 | 405 | 543 | 560 | 550 | 588 |

Unit: (Ω/□)

Table 9 shows the evaluation results of the reciprocal of the initial change rate of the transparent conductive sheets of Samples 9-1 to 10-5.

TABLE 9

| | Structures | | | | Dipping time (sec) | | | | |
|---|---|---|---|---|---|---|---|---|---|
| | Pitch (nm) | Height (nm) | Average angle of sloped surface (degrees) | Aspect | 0 | 20 | 40 | 60 | 100 |
| Samples 9-1 to 9-5 | 250 | 180 | 55 | 0.55 | 1.000 | 0.906 | 0.906 | 0.915 | 0.900 |
| Samples 10-1 to 10-5 | 200 | 180 | 61 | 0.62 | 1.000 | 0.746 | 0.723 | 0.736 | 0.689 |

Figure 30:
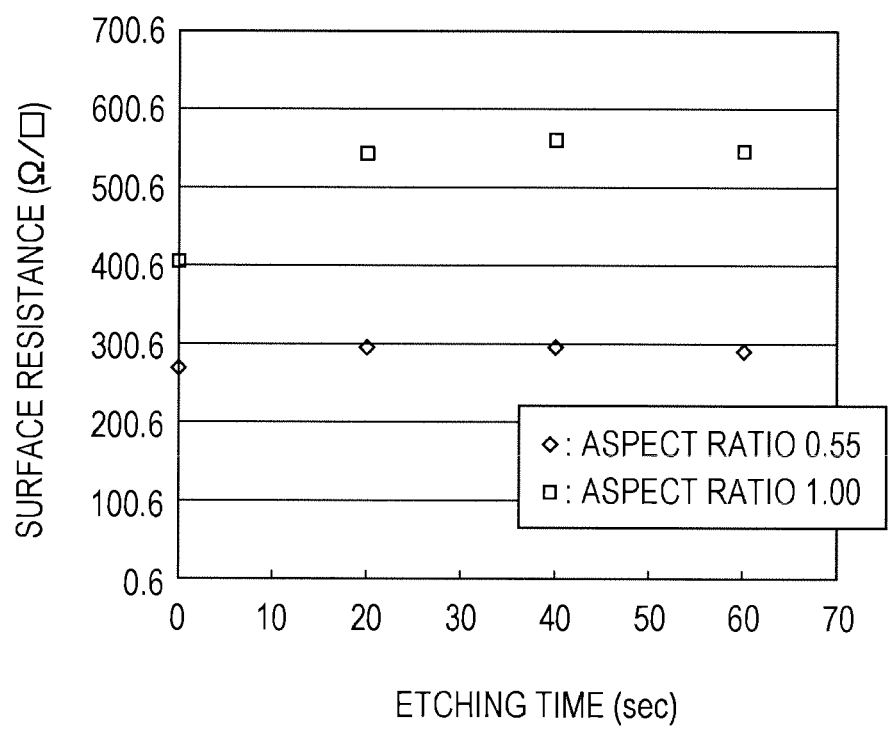
FIG. 30 is a graph showing measurement results of surface resistance values of transparent conductive sheet of Samples 9-1 to 10-5.

Following can be understood from Table 8, Table 9, and FIG. 30.

When the average angle of the sloped surfaces exceeds 60 degrees, the etching resistance of the ITO layer is decreased and the surface resistance tends to increase with the elapse of the etching time.

In the description heretofore, embodiments of the present invention have been specifically described but the present invention is not limited to the above-described embodiments and various modifications are possible on the basis of the technical idea of the present invention.

For example, the configurations, methods, steps, shapes, materials, and numerical values described in the above-described embodiments are merely exemplary and configurations, methods, steps, shapes, materials, and numerical values different from these may be used according to need.

Furthermore, the configurations, methods, steps, shapes, materials, numerical values, etc., of the embodiments described above may be combined with one another without departing from the essence of the present invention.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

EXPLANATION OF REFERENCE NUMERALS 1 transparent conductive element
$1_1$ first transparent conductive element
$1_2$ second transparent conductive element
2, $2_1$, $2_2$ optical layer
3, $3_1$, $3_2$ substrate
4, 12 structure
5, $5_1$, $5_2$ base layer
6, $6_1$, $6_2$ transparent conductive layer
7 optical layer
8 bonding layer
11 roll master
101 information input device
Sw wave surface

The invention claimed is:

1. A transparent conductive element comprising:
an optical layer provided with a wave surface that has an average wavelength smaller than or equal to a wavelength of visible light; and
a transparent conductive layer formed on the wave surface so as to follow a shape of the wave surface,
wherein when the average wavelength of the wave surface is λm and an average amplitude of vibration of the wave surface is Am, a ratio (Am/λm) is 0.2 or more and 1.0 or less,
an average angle of sloped surfaces of the wave surface is in the range of 30° or more and 60° or less, and
when a thickness of the transparent conductive layer at a highest position of the wave surface is D1 and a thickness of the transparent conductive layer at a lowest position of the wave surface is D3, a ratio D3/D1 is in the range of 0.8 or less.

2. The transparent conductive element according to claim 1, wherein an area of a flat portion of the wave surface is 50% or less.

3. The transparent conductive element according to claim 1, wherein the thickness of the transparent conductive layer at the highest position of the wave surface is 100 nm or less.

4. The transparent conductive element according to claim 1, wherein the average wavelength λm of the wave surface is 140 nm or more and 300 nm or less, and the average amplitude Am of vibration of the wave surface is 28 nm or more and 300 nm or less.

5. The transparent conductive element according to claim 1, wherein the transparent conductive layer is an electrode having a particular pattern.

6. The transparent conductive element according to claim 5, wherein a reflectance difference ΔR between a portion where the electrode is formed and a portion where the electrode is not formed among the wave surface of the optical layer is 5% or less.

7. The transparent conductive element according to claim 1, wherein
   the optical layer includes
   a substrate having a surface, and
   a plurality of structures arranged on the surface of the substrate at a fine pitch smaller than or equal to a wavelength of visible light,
   wherein the wave surface is formed by the arrangement of the plurality of structures.

8. The transparent conductive element according to claim 7, wherein the structures are cones having convex curved surfaces at tops of the cones.

9. An input device comprising the transparent conductive element according to claim 1.

10. A display device comprising the transparent conductive element according to claim 1.

11. A master for fabricating the transparent conductive element according to claim 1.

* * * * *